United States Patent
Rowan et al.

(10) Patent No.: US 10,791,681 B2
(45) Date of Patent: Oct. 6, 2020

(54) IDENTIFYING MANAGEMENT ZONES IN AGRICULTURAL FIELDS AND GENERATING PLANTING PLANS FOR THE ZONES

(71) Applicant: The Climate Corporation, San Francisco, CA (US)

(72) Inventors: Emily Rowan, San Francisco, CA (US); Tracey Ewart, Corte Madera, CA (US); Stephen Crampton, Bainbridge Island, CA (US); Alex Wimbush, Corte Madera, CA (US)

(73) Assignee: THE CLIMATE CORPORATION, San Francisco, CA (US)

( * ) Notice: Subject to any disclaimer, the term of this patent is extended or adjusted under 35 U.S.C. 154(b) by 0 days.

(21) Appl. No.: 16/224,562

(22) Filed: Dec. 18, 2018

(65) Prior Publication Data

US 2019/0124855 A1    May 2, 2019

Related U.S. Application Data

(63) Continuation of application No. 16/044,063, filed on Jul. 24, 2018, which is a continuation of application (Continued)

(51) Int. Cl.
*A01G 22/00*      (2018.01)
*G06Q 10/06*      (2012.01)
(Continued)

(52) U.S. Cl.
CPC .......... *A01G 22/00* (2018.02); *A01B 79/005* (2013.01); *A01C 21/005* (2013.01); *G06F 30/20* (2020.01);

(Continued)

(58) Field of Classification Search
CPC ...... A01G 22/00; G06Q 10/06; A01C 21/005; G06F 17/5009
(Continued)

(56) References Cited

U.S. PATENT DOCUMENTS 5,751,576 A    5/1998   Monson
5,771,169 A    6/1998   Wendte
(Continued)

FOREIGN PATENT DOCUMENTS

| CA | 2 663 917 C | 12/2014 |
| WO | WO 00/23937 A1 | 4/2000 |
| WO | WO 2014/036281 A2 | 3/2014 |

OTHER PUBLICATIONS

You Tube.com, "How Random Forest algorithm works" https://www.youtube.com/watch?v=loNcrMjYh64, 5 pages, dated Jun. 22, 2016.

(Continued)

*Primary Examiner* — Tan Q Nguyen
(74) *Attorney, Agent, or Firm* — Hickman Palermo Becker Bingham LLP; Christine E. Orich

(57) ABSTRACT

In an embodiment, computer processes are programmed to determine planting plans based on planting characteristics data received for an agricultural field and a plurality of management zone delineation options defined for the agricultural field. Each of the planting plans specifies different planting recommendations for the agricultural field. A first graphical representation of the planting plans, and an interactive object is generated and displayed on a computing device. The interactive object is configured to receive input specifying a relative importance ratio between the planting plans for determining a new planting plan for the agricultural field. A particular relative importance ratio is received via the interactive object, and is used to determine the new planting plan, which specifies new planting recommenda- (Continued)

tions for the agricultural field. Information about the new planting plan is displayed on the computer device.

20 Claims, 21 Drawing Sheets

Related U.S. Application Data

No. 15/427,477, filed on Feb. 8, 2017, now Pat. No. 10,028,451, which is a continuation-in-part of application No. 15/352,898, filed on Nov. 16, 2016, now Pat. No. 10,398,096.

(51) Int. Cl.
| | | |
|---|---|---|
| *A01B 79/00* | (2006.01) | |
| *G06Q 50/02* | (2012.01) | |
| *G06F 30/20* | (2020.01) | |
| *A01C 21/00* | (2006.01) | |
| *A01G 25/16* | (2006.01) | |

(52) U.S. Cl.
CPC ........... *G06Q 10/063* (2013.01); *G06Q 50/02* (2013.01); *A01G 25/16* (2013.01)

(58) Field of Classification Search
USPC .......................................................... 701/50
See application file for complete search history.

(56) References Cited

U.S. PATENT DOCUMENTS

| | | | |
|---|---|---|---|
| 6,058,351 A | 5/2000 | Mccauley | |
| 9,058,560 B2* | 6/2015 | Johnson | G06N 3/02 |
| 9,281,219 B2 | 3/2016 | Stimpson | |
| 9,652,840 B1* | 5/2017 | Shriven | G01N 33/0098 |
| 9,898,016 B2* | 2/2018 | Motavalli | G06Q 10/0631 |
| 2003/0208319 A1 | 11/2003 | Ell | |
| 2005/0197757 A1 | 9/2005 | Flann | |
| 2009/0056605 A1* | 3/2009 | Wilson | A01C 7/08 111/59 |
| 2013/0075279 A1 | 3/2013 | Buck | |
| 2013/0116883 A1 | 5/2013 | Kormann | |
| 2013/0126430 A1 | 5/2013 | Kenley | |
| 2013/0174040 A1* | 7/2013 | Johnson | G06Q 10/06 715/733 |
| 2013/0311050 A1* | 11/2013 | Cash | A01B 79/005 701/50 |
| 2014/0035752 A1 | 2/2014 | Johnson | |
| 2014/0067745 A1 | 3/2014 | Avey et al. | |
| 2014/0297242 A1 | 10/2014 | Sauder | |
| 2015/0025752 A1 | 1/2015 | Tolstedt | |
| 2015/0177736 A1 | 6/2015 | Anderson | |
| 2015/0305226 A1 | 10/2015 | Zemenchik | |
| 2015/0319913 A1* | 11/2015 | Foster | A01B 69/00 701/26 |
| 2016/0057922 A1 | 3/2016 | Freiberg | |
| 2016/0132935 A1* | 5/2016 | Shen | G06Q 30/0269 705/14.66 |
| 2016/0153931 A1 | 6/2016 | Stimpson et al. | |
| 2016/0232621 A1 | 8/2016 | Ethington et al. | |
| 2016/0239709 A1 | 8/2016 | Shriver | |
| 2016/0290918 A1 | 10/2016 | Xu et al. | |
| 2016/0302351 A1 | 10/2016 | Schildroth et al. | |
| 2017/0196171 A1 | 7/2017 | Xu | |
| 2018/0014452 A1 | 1/2018 | Starr | |
| 2018/0132422 A1 | 5/2018 | Hassanzadeh | |
| 2018/0132423 A1 | 5/2018 | Rowan | |
| 2019/0014727 A1 | 1/2019 | Rowan | |
| 2019/0075712 A1* | 3/2019 | Reineccius | A01C 1/06 |

OTHER PUBLICATIONS

Tibshirani, Robert, "Regression Shrinkage and Selection Via the Lasso", Journal of the Royal Statistical Society. Series B (Methodological), vol. 58, Issue 1 (1996), 267-288.

Random forest—Wikipedia, the free encyclopedia, https://en.wikipedia.org/wiki/Random_forest, last viewed on Jun. 22, 2016, 7 pages.

Lasso (statistics)—Wikipedia, the free encyclopedia, https://en.wikipedia.org/wiki/Lasso_(statistics), lasted viewed on Jun. 20, 2016, 9 pages.

International Searching Authority, "Search Report" in application No. PCT/US2017/061846, dated Jan. 18, 2018, 19 pages.

Gupta, Ankur, "Project Soil Properties Interpolation: Results and Recommendations", dated Jan. 12, 2015, 46 pages.

Current Claims in application No. PCT/US2017/061846, dated Jan. 2018, 6 pages.

Chapter 2, Input Map Layers Used to Create Flux Ecoregions, 2.1, Compound Topographic Index (CTI), 23 pages.

"A Simple Explanation of the Lasso and Least Angle Regression" http://statweb.stanford.edu/~tibs/lasso/simple.html, last viewed in Jun. 22, 2016, 2 pages.

Rowan, U.S. Appl. No. 15/427,477, filed Feb. 8, 2018, Notice of Allowance dated Mar. 29, 2018.

Hassanzadeh, U.S. Appl. No. 15/352,898, filed Nov. 16, 2016, Interview Summary dated Apr. 16, 2019.

Hassanzadeh, U.S. Appl. No. 13/352,898, filed Nov. 16, 2016, Notice of Allowance dated May 22, 2019.

Rowan, U.S. Appl. No. 16/044,063, filed Jul. 24, 2018, Office Action dated Oct. 3, 2019.

Hassanzadeh, U.S. Appl. No. 15/352,898, filed Nov. 16, 2016, Office Action dated Feb. 7, 2019.

Henderson, Gary, "Verification of Long-Term Pavement Performance Virtual Weather Stations Phase I Report-Accuracy and Reliability of Virtual Weather Stations", dated May 2006, 93 pages.

Brazilian Patent Office, "Office Action" in Application No. 1120170047500, dated May 19, 2020, 2 pages.

Brazilian Claims in Application No. 1120170047500, dated May 2020, 4 pages.

Australian Patent Office, "Office Action" in application No. 2015315001, dated May 29, 2020, 5 pages.

Australian Claims in application No. 2015315001, dated May 2020, 7 pages.

European Patent Office, "Search Report" in application No. 17871031.5-1222 dated Apr. 8, 2020, 9 pages.

European Claims in application No. 17871031.5-1222, dated Apr. 2020, 5 pages.

* cited by examiner (a)

(b)

IDENTIFYING MANAGEMENT ZONES IN AGRICULTURAL FIELDS AND GENERATING PLANTING PLANS FOR THE ZONES

BENEFIT CLAIM

This application claims the benefit under 35 U.S.C. § 120 as a Continuation of application Ser. No. 16/044,063, filed Jul. 24, 2018; which is a Continuation of application Ser. No. 15/427,477, filed Feb. 8, 2017, now U.S. Pat. No. 10,028, 451, issued Jul. 24, 2018; which is a Continuation in part of application Ser. No. 15/352,898, filed Nov. 16, 2016, the entire contents of which is hereby incorporated by reference for all purposes as if fully set forth herein. The applicants hereby rescind any disclaimer of claim scope in the parent applications or the prosecution history thereof and advise the USPTO that the claims in this application may be broader than any claim in the parent applications.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright or rights whatsoever. © 2016 The Climate Corporation.

FIELD OF THE DISCLOSURE

The technical field of the present disclosure includes computer systems programmed with operations that are useful in agricultural management. The disclosure is also in the technical field of computer systems that are programmed or configured to generate management zone delineation options for agricultural fields using digital map data and pipelined data processing, to generate graphical representations of the management zone delineation options, and to generate computer-implemented recommendations for use in agriculture.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Management zones refer to contiguous regions within an agricultural field that have similar limiting factors that influence harvested yields of crops. The field regions that belong to the same management zone can usually be managed uniformly with respect to seeding, irrigating, applying fertilizers, and harvesting.

One advantage of identifying management zones within an agricultural field is that information about the zones may help crop growers to customize their agricultural practices to increase the field's productivity and yield. Customization of the practices may include for example, selecting particular seed hybrids, seed populations and nitrogen applications for the individual zones.

SUMMARY

The appended claims may serve as a summary of the disclosure.

DETAILED DESCRIPTION

Figure 1:
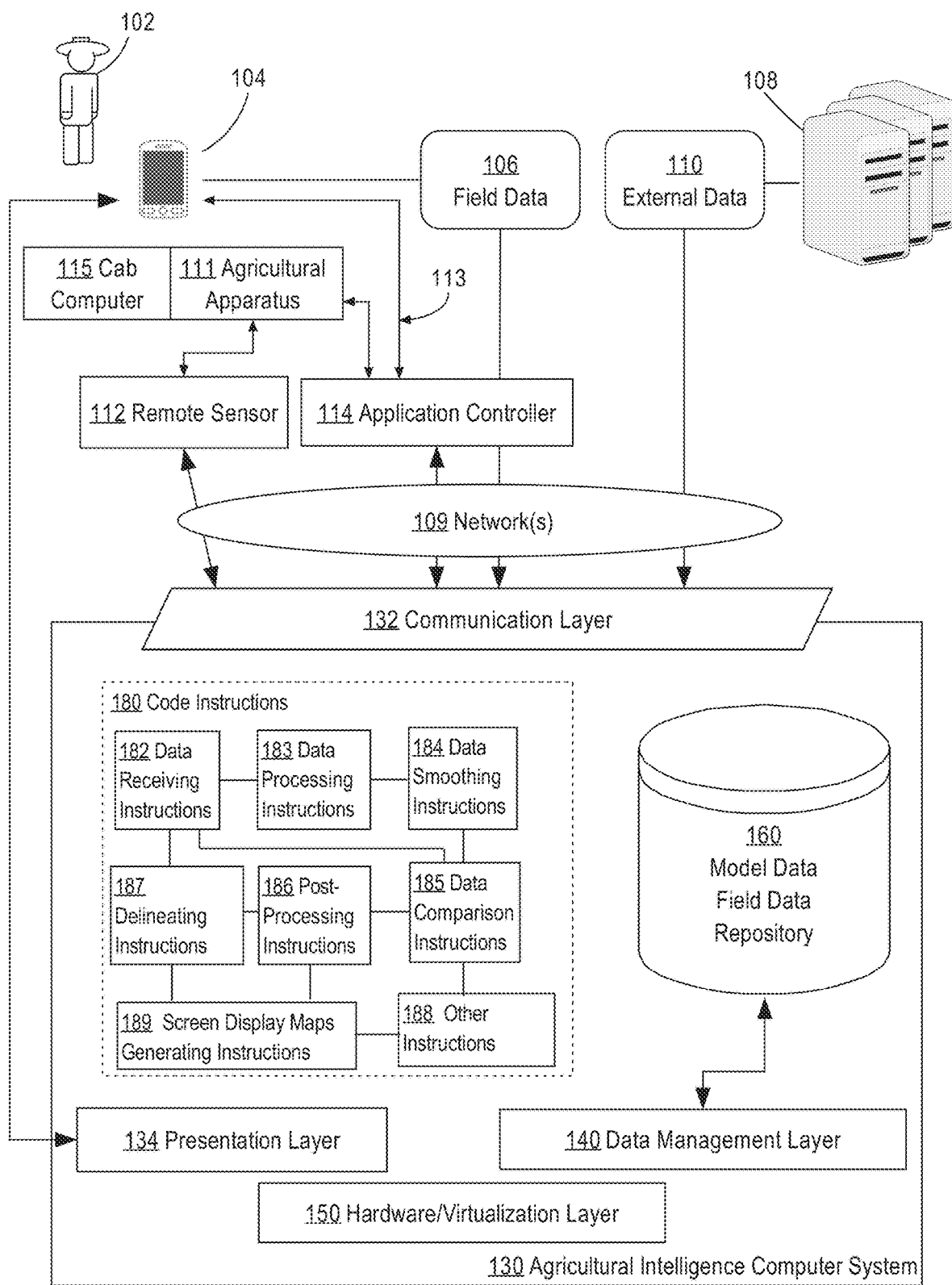
FIG. 1 illustrates an example computer system that is configured to perform the functions described herein, shown in a field environment with other apparatus with which the system may interoperate.

In the following description, for the purposes of explanation, numerous specific details are set forth in order to provide a thorough understanding of the present disclosure. It will be apparent, however, that embodiments may be practiced without these specific details. In other instances, well-known structures and devices are shown in block diagram form in order to avoid unnecessarily obscuring the present disclosure. Embodiments are disclosed in sections according to the following outline:

1. GENERAL OVERVIEW
2. EXAMPLE AGRICULTURAL INTELLIGENCE COMPUTER SYSTEM
   2.1. STRUCTURAL OVERVIEW
   2.2. APPLICATION PROGRAM OVERVIEW
   2.3. DATA INGEST TO THE COMPUTER SYSTEM
   2.4. PROCESS OVERVIEW—AGRONOMIC MODEL TRAINING
   2.5. IMPLEMENTATION EXAMPLE—HARDWARE OVERVIEW
3. IDENTIFYING MANAGEMENT ZONES BASED ON YIELD MAPS, SOIL MAPS, TOPOGRAPHY MAPS AND SATELLITE DATA
   3.1. MANAGEMENT ZONES
   3.2. TRANSIENT FEATURE DATA—YIELD DATA
   3.3. PERMANENT FEATURE DATA
      3.3.1. SOIL CHARACTERISTICS
      3.3.2. TOPOLOGY CHARACTERISTICS
      3.3.3. SOIL SURVEY MAPS
      3.3.4. SATELLITE MAPS
      3.3.5. BARESOIL MAPS AS EXAMPLES OF SATELLITE MAPS
   3.4. MANAGEMENT ZONES CREATING PIPELINE
      3.4.1. PREPROCESSING
      3.4.2. SPATIAL SMOOTHING
      3.4.3. NORMALIZATION
      3.4.4. CLUSTERING
   3.4.4.1. IDENTIFYING MANAGEMENT ZONES
   3.4.4.2. K-MEANS APPROACH
   3.4.4.3. REGION MERGING APPROACH
      3.4.5. POST-PROCESSING
   3.5. PERFORMANCE CONSIDERATIONS
4. USEFULNESS OF MANAGEMENT ZONE DELINEATION
5. EXAMPLE APPLICATION FOR DELINEATING MANAGEMENT ZONES AND GENERATING RECOMMENDATIONS
   5.1. EXAMPLE USES AND APPLICATIONS
   5.2. EXAMPLE WORKFLOW
   5.3. EXAMPLE OF AUTO SCRIPTING
   5.4. EXAMPLE OF MANUAL SCRIPTING
6. INTERPOLATING BETWEEN RECOMMENDATIONS
   6.1. INTERPOLATING BETWEEN TWO SETS OF RECOMMENDATIONS
      6.1.1. INTERACTIVE SLIDER
      6.1.2. WEIGHTED INTERPOLATION
      6.1.3. FIRST EXAMPLE IMPLEMENTATION
      6.1.4. EXAMPLE WORKFLOW
      6.1.5. SECOND EXAMPLE IMPLEMENTATION
   6.2 INTERPOLATING BETWEEN THREE OR MORE SETS OF RECOMMENDATIONS
7. EXTENSIONS AND ALTERNATIVES

1. General Overview

In an embodiment, a process is provided for determining management zone delineation options for an agricultural field and for determining planting plans for the delineation options. The process includes receiving yield data and field characteristics data. The yield data represents yields of crops that have been harvested from the field. The field characteristics data represents characteristics of the field itself. Both types of data may be preprocessed by removing outliers, duplicative data, and the like. The yield characteristics data is referred to as transient characteristics of the field, while the field characteristics data is referred to as permanent, or persistent, characteristics of the field.

Field characteristics data for an agricultural field may include soil property data and topographical properties data. The field characteristics data may be obtained from soil survey maps, baresoil maps, and/or satellite images.

Based on data received for a field, a plurality of management zone delineation options is determined. Each option, of the plurality of management zone delineation options, may include a layout of the zones for the field and additional information about the zones. For example, a management zone delineation option may include information indicating how the field may be divided into zones and information indicating characteristics of individual zones.

A process of determining a plurality of management zone delineation options may include determining a plurality of count values for a management class count, and generating the management zone delineation options for each count value. Generating a management zone delineation option may include for example, clustering the yield data and the associated field characteristics data based on a count value, grouping the obtained clusters into zones, and including the zones in the management zone delineation option.

Information about a management zone delineation option may be post-processed. A post-processing of a delineation option may include merging small management zones in the option with their respective neighboring large zones to generate a merged zone delineation option.

In an embodiment, a process is configured to generate planting plans and recommendations for a plurality of management zone delineation options. For example, upon receiving certain criteria and/or certain input from a user, one or more planting plans for the management zone delineation options may be generated.

Information about management zone delineation options and planting plans associated with the options may be used to control agricultural equipment, including a seeding apparatus, an irrigation apparatus, an apparatus for applying fertilizers, and/or a harvesting combine. The equipment may be directed to follow the recommended planting plans in terms of seeding, irrigating, applying fertilizers, and/or harvesting.

Layouts of management zones and information about planting plans may be displayed on computer display devices. For example, a computer system may be configured to generate a graphical user interface (GUI) and display the GUI on a computer display device. Furthermore, the computer system may cause displaying, in the GUI, graphical representations of management zone delineation options and planting plans for the options.

In an embodiment, a process is configured to receive a user input to customize management zone delineation options and/or to customize planting plans. For example, the process may be configured to receive requests to merge the zones, split the zones, modify the zones' layouts, modify seed hybrids selections, modify target yields, and/or modify planting plan details. The process may be configured to process the received requests, and generate new management zone delineation options and/or new planting options for the zones. For example, the process may determine interrelations between target yields and planting plans, modify the planting plans, and display the modified planting plans in a graphical form on the user's display device.

Using the techniques described herein, a computer can determine a plurality of management zones based on digital data representing historical yields and characteristics of the field itself. The techniques enable computers to determine the management zones that can be managed uniformly and thus more efficiently and productively.

Presented techniques can enable an agricultural intelligence computing system to save computational resources, such as data storage, computing power, and computer memory, by implementing a programmable pipeline configured to automatically determine management zones based on digital data obtained for a field. The programmable pipeline can automatically generate recommendations and alerts for farmers, insurance companies, and researchers, thereby allowing for a more effective management of seeding schedules, fertilization schedules, and harvest schedules.

Presented techniques can be useful in certain agricultural practices, such as selecting a seeding rate. Information about management zone delineation options may be used to generate recommendations for crop growers to suggest for example, seed hybrids, seeding populations, and seeding schedules for individual zones.

2. Example Agricultural Intelligence Computer System 2.1. Structural Overview

FIG. 1 illustrates an example computer system that is configured to perform the functions described herein, shown in a field environment with other apparatus with which the system may interoperate. In one embodiment, a user 102 owns, operates or possesses a field manager computing device 104 in a field location or associated with a field location such as a field intended for agricultural activities or a management location for one or more agricultural fields. The field manager computer device 104 is programmed or configured to provide field data 106 to an agricultural intelligence computer system 130 via one or more networks 109.

Examples of field data 106 include (a) identification data (for example, acreage, field name, field identifiers, geographic identifiers, boundary identifiers, crop identifiers, and any other suitable data that may be used to identify farm land, such as a common land unit (CLU), lot and block number, a parcel number, geographic coordinates and boundaries, Farm Serial Number (FSN), farm number, tract number, field number, section, township, and/or range), (b) harvest data (for example, crop type, crop variety, crop rotation, whether the crop is grown organically, harvest date, Actual Production History (APH), expected yield, yield, crop price, crop revenue, grain moisture, tillage practice, and previous growing season information), (c) soil data (for example, type, composition, pH, organic matter (OM), cation exchange capacity (CEC)), (d) planting data (for example, planting date, seed(s) type, relative maturity (RM) of planted seed(s), seed population), (e) fertilizer data (for example, nutrient type (Nitrogen, Phosphorous, Potassium), application type, application date, amount, source, method), (f) pesticide data (for example, pesticide, herbicide, fungicide, other substance or mixture of substances intended for use as a plant regulator, defoliant, or desiccant, application date, amount, source, method), (g) irrigation data (for example, application date, amount, source, method), (h) weather data (for example, precipitation, rainfall rate, predicted rainfall, water runoff rate region, temperature, wind, forecast, pressure, visibility, clouds, heat index, dew point, humidity, snow depth, air quality, sunrise, sunset), (i) imagery data (for example, imagery and light spectrum information from an agricultural apparatus sensor, camera, computer, smartphone, tablet, unmanned aerial vehicle, planes or satellite), (j) scouting observations (photos, videos, free form notes, voice recordings, voice transcriptions, weather conditions (temperature, precipitation (current and over time), soil moisture, crop growth stage, wind velocity, relative humidity, dew point, black layer)), and (k) soil, seed, crop phenology, pest and disease reporting, and predictions sources and databases.

A data server computer 108 is communicatively coupled to agricultural intelligence computer system 130 and is programmed or configured to send external data 110 to agricultural intelligence computer system 130 via the network(s) 109. The external data server computer 108 may be owned or operated by the same legal person or entity as the agricultural intelligence computer system 130, or by a different person or entity such as a government agency, non-governmental organization (NGO), and/or a private data service provider. Examples of external data include weather data, imagery data, soil data, or statistical data relating to crop yields, among others. External data 110 may consist of the same type of information as field data 106. In some embodiments, the external data 110 is provided by an external data server 108 owned by the same entity that owns and/or operates the agricultural intelligence computer system 130. For example, the agricultural intelligence computer system 130 may include a data server focused exclusively on a type of data that might otherwise be obtained from third party sources, such as weather data. In some embodiments, an external data server 108 may actually be incorporated within the system 130.

An agricultural apparatus 111 may have one or more remote sensors 112 fixed thereon, which sensors are communicatively coupled either directly or indirectly via agricultural apparatus 111 to the agricultural intelligence computer system 130 and are programmed or configured to send sensor data to agricultural intelligence computer system 130. Examples of agricultural apparatus 111 include tractors, combines, harvesters, planters, trucks, fertilizer equipment, unmanned aerial vehicles, and any other item of physical machinery or hardware, typically mobile machinery, and which may be used in tasks associated with agriculture. In some embodiments, a single unit of apparatus 111 may comprise a plurality of sensors 112 that are coupled locally in a network on the apparatus; controller area network (CAN) is example of such a network that can be installed in combines or harvesters. Application controller 114 is communicatively coupled to agricultural intelligence computer system 130 via the network(s) 109 and is programmed or configured to receive one or more scripts to control an operating parameter of an agricultural vehicle or implement from the agricultural intelligence computer system 130. For instance, a controller area network (CAN) bus interface may be used to enable communications from the agricultural intelligence computer system 130 to the agricultural apparatus 111, such as how the CLIMATE FIELDVIEW DRIVE, available from The Climate Corporation, San Francisco, Calif., is used. Sensor data may consist of the same type of information as field data 106. In some embodiments, remote sensors 112 may not be fixed to an agricultural apparatus 111 but may be remotely located in the field and may communicate with network 109.

The apparatus 111 may comprise a cab computer 115 that is programmed with a cab application, which may comprise a version or variant of the mobile application for device 104 that is further described in other sections herein. In an embodiment, cab computer 115 comprises a compact computer, often a tablet-sized computer or smartphone, with a graphical screen display, such as a color display, that is mounted within an operator's cab of the apparatus 111. Cab computer 115 may implement some or all of the operations and functions that are described further herein for the mobile computer device 104.

The network(s) 109 broadly represent any combination of one or more data communication networks including local area networks, wide area networks, internetworks or internets, using any of wireline or wireless links, including terrestrial or satellite links. The network(s) may be implemented by any medium or mechanism that provides for the exchange of data between the various elements of FIG. 1. The various elements of FIG. 1 may also have direct (wired or wireless) communications links. The sensors 112, controller 114, external data server computer 108, and other elements of the system each comprise an interface compatible with the network(s) 109 and are programmed or configured to use standardized protocols for communication across the networks such as TCP/IP, Bluetooth, CAN protocol and higher-layer protocols such as HTTP, TLS, and the like.

Agricultural intelligence computer system 130 is programmed or configured to receive field data 106 from field manager computing device 104, external data 110 from external data server computer 108, and sensor data from remote sensor 112. Agricultural intelligence computer system 130 may be further configured to host, use or execute one or more computer programs, other software elements, digitally programmed logic such as FPGAs or ASICs, or any combination thereof to perform translation and storage of data values, construction of digital models of one or more crops on one or more fields, generation of recommendations and notifications, and generation and sending of scripts to application controller 114, in the manner described further in other sections of this disclosure.

In an embodiment, agricultural intelligence computer system 130 is programmed with or comprises a communication layer 132, presentation layer 134, data management layer 140, hardware/virtualization layer 150, and model and field data repository 160. "Layer," in this context, refers to any combination of electronic digital interface circuits, microcontrollers, firmware such as drivers, and/or computer programs or other software elements.

Communication layer 132 may be programmed or configured to perform input/output interfacing functions including sending requests to field manager computing device 104, external data server computer 108, and remote sensor 112 for field data, external data, and sensor data respectively. Communication layer 132 may be programmed or configured to send the received data to model and field data repository 160 to be stored as field data 106.

In an embodiment, agricultural intelligence computer system 130 is programmed with or comprises code instructions 180. For example, code instructions 180 may include data receiving instructions 182 which are programmed for receiving, over network(s) 109, electronic digital data comprising yield data. Code instructions 180 may also include data processing instructions 183 which are programmed for preprocessing of the received yield data; data smoothing instructions 184 which are programmed for smoothing the preprocessed yield data; data delineating instructions 187 which are programmed for delineating management zones; post-processing instructions 186 which are programmed for post-processing of the delineated management zones; data comparison instructions 185 which are programmed for comparing the post-processed management zones; screen display maps generating instructions 189 and other detection instructions 188.

Presentation layer 134 may be programmed or configured to generate a GUI to be displayed on field manager computing device 104, cab computer 115 or other computers that are coupled to the system 130 through the network 109. The GUI may comprise controls for inputting data to be sent to agricultural intelligence computer system 130, generating requests for models and/or recommendations, and/or displaying recommendations, notifications, models, and other field data.

Data management layer 140 may be programmed or configured to manage read operations and write operations involving the repository 160 and other functional elements of the system, including queries and result sets communicated between the functional elements of the system and the repository. Examples of data management layer 140 include JDBC, SQL server interface code, and/or HADOOP interface code, among others. Repository 160 may comprise a database. As used herein, the term "database" may refer to either a body of data, a relational database management system (RDBMS), or to both. As used herein, a database may comprise any collection of data including hierarchical databases, relational databases, flat file databases, object-relational databases, object oriented databases, and any other structured collection of records or data that is stored in a computer system. Examples of RDBMS's include, but are not limited to including, ORACLE®, MYSQL, IBM® DB2, MICROSOFT® SQL SERVER, SYBASE®, and POSTGRESQL databases. However, any database may be used that enables the systems and methods described herein.

When field data 106 is not provided directly to the agricultural intelligence computer system via one or more agricultural machines or agricultural machine devices that interacts with the agricultural intelligence computer system, the user may be prompted via one or more user interfaces on the user device (served by the agricultural intelligence computer system) to input such information. In an example embodiment, the user may specify identification data by accessing a map on the user device (served by the agricultural intelligence computer system) and selecting specific CLUs that have been graphically shown on the map. In an alternative embodiment, the user 102 may specify identification data by accessing a map on the user device (served by the agricultural intelligence computer system 130) and drawing boundaries of the field over the map. Such CLU selection or map drawings represent geographic identifiers. In alternative embodiments, the user may specify identification data by accessing field identification data (provided as shape files or in a similar format) from the U. S. Department of Agriculture Farm Service Agency or other source via the user device and providing such field identification data to the agricultural intelligence computer system.

In an example embodiment, the agricultural intelligence computer system 130 is programmed to generate and cause displaying a graphical user interface comprising a data manager for data input. After one or more fields have been identified using the methods described above, the data manager may provide one or more graphical user interface widgets which when selected can identify changes to the field, soil, crops, tillage, or nutrient practices. The data manager may include a timeline view, a spreadsheet view, and/or one or more editable programs.

Figure 5:
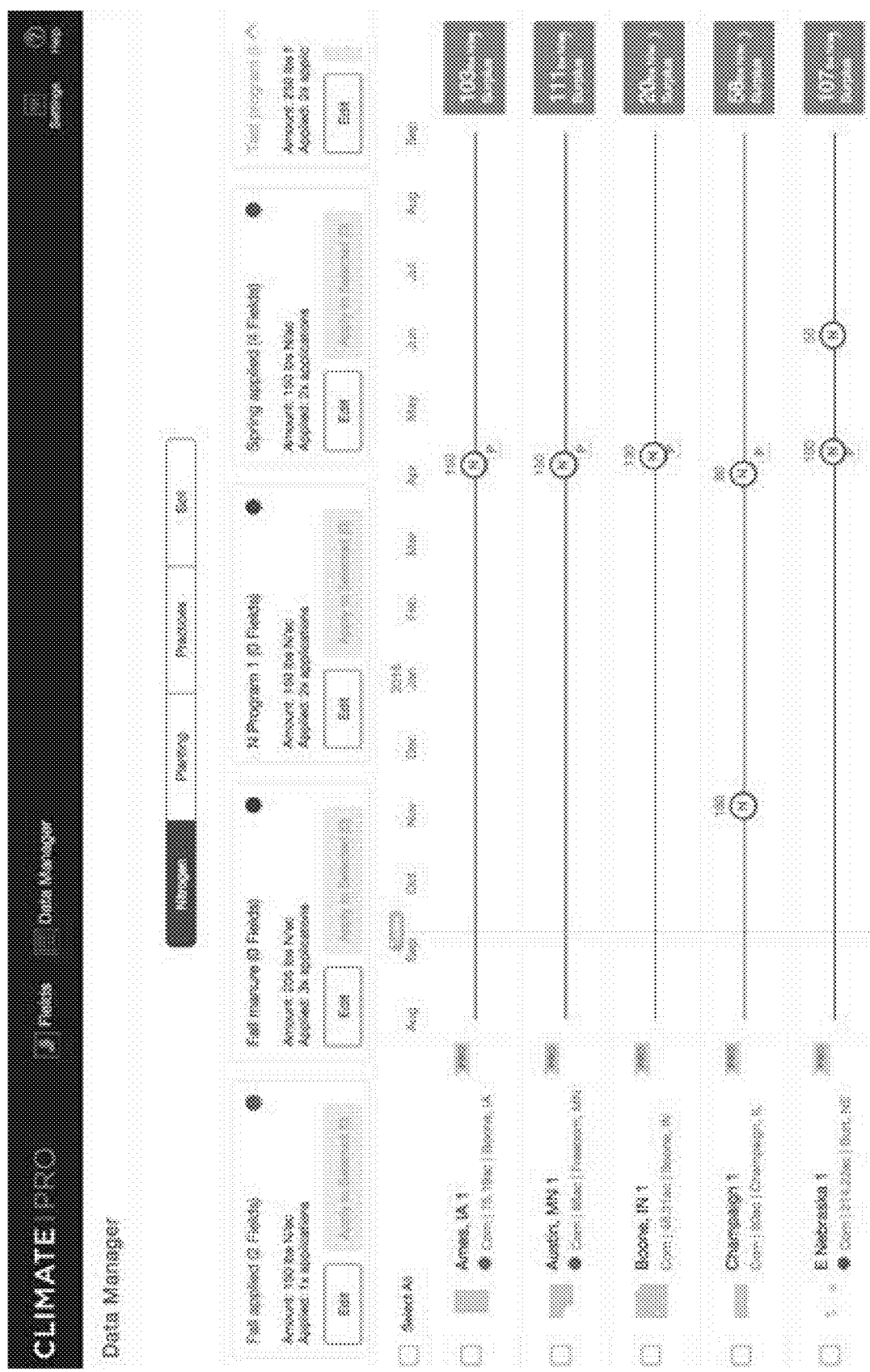
FIG. 5 depicts an example embodiment of a timeline view for data entry.

FIG. 5 depicts an example embodiment of a timeline view for data entry. Using the display depicted in FIG. 5, a user computer can input a selection of a particular field and a particular date for the addition of event. Events depicted at the top of the timeline may include Nitrogen, Planting, Practices, and Soil. To add a nitrogen application event, a user computer may provide input to select the nitrogen tab. The user computer may then select a location on the timeline for a particular field in order to indicate an application of nitrogen on the selected field. In response to receiving a selection of a location on the timeline for a particular field, the data manager may display a data entry overlay, allowing the user computer to input data pertaining to nitrogen applications, planting procedures, soil application, tillage procedures, irrigation practices, or other information relating to the particular field. For example, if a user computer selects a portion of the timeline and indicates an application of nitrogen, then the data entry overlay may include fields for inputting an amount of nitrogen applied, a date of application, a type of fertilizer used, and any other information related to the application of nitrogen.

In an embodiment, the data manager provides an interface for creating one or more programs. "Program," in this context, refers to a set of data pertaining to nitrogen applications, planting procedures, soil application, tillage procedures, irrigation practices, or other information that may be related to one or more fields, and that can be stored in digital data storage for reuse as a set in other operations. After a program has been created, it may be conceptually applied to one or more fields and references to the program may be stored in digital storage in association with data identifying the fields. Thus, instead of manually entering identical data relating to the same nitrogen applications for multiple different fields, a user computer may create a program that indicates a particular application of nitrogen and then apply the program to multiple different fields. For example, in the timeline view of FIG. 5, the top two timelines have the "Fall applied" program selected, which includes an application of 150 lbs N/ac in early April. The data manager may provide an interface for editing a program. In an embodiment, when a particular program is edited, each field that has selected the particular program is edited. For example, in FIG. 5, if the "Fall applied" program is edited to reduce the application of nitrogen to 130 lbs N/ac, the top two fields may be updated with a reduced application of nitrogen based on the edited program.

In an embodiment, in response to receiving edits to a field that has a program selected, the data manager removes the correspondence of the field to the selected program. For example, if a nitrogen application is added to the top field in FIG. 5, the interface may update to indicate that the "Fall applied" program is no longer being applied to the top field. While the nitrogen application in early April may remain, updates to the "Fall applied" program would not alter the April application of nitrogen.

Figure 6:
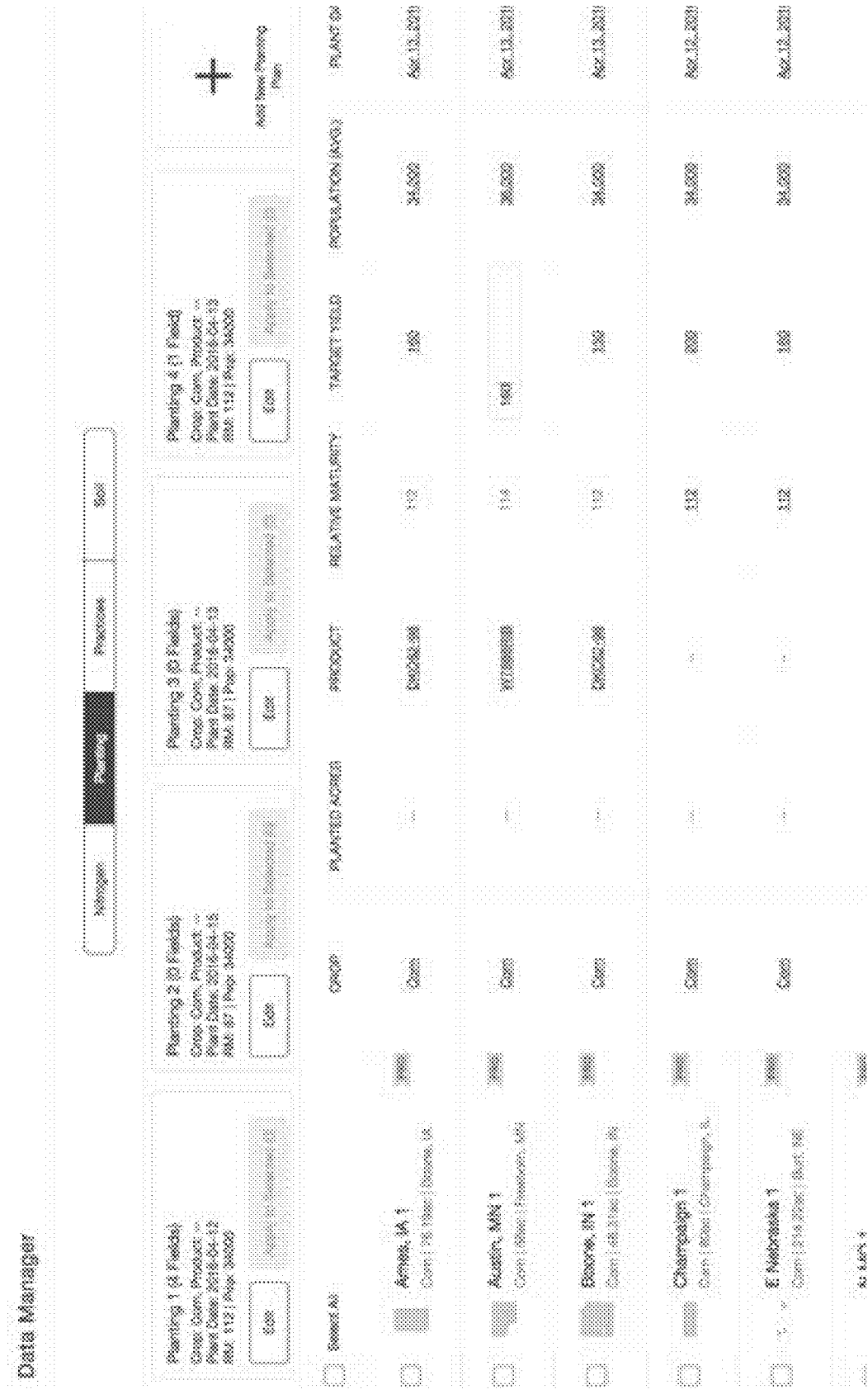
FIG. 6 depicts an example embodiment of a spreadsheet view for data entry.

FIG. 6 depicts an example embodiment of a spreadsheet view for data entry. Using the display depicted in FIG. 6, a user can create and edit information for one or more fields. The data manager may include spreadsheets for inputting information with respect to Nitrogen, Planting, Practices, and Soil as depicted in FIG. 6. To edit a particular entry, a user computer may select the particular entry in the spreadsheet and update the values. For example, FIG. 6 depicts an in-progress update to a target yield value for the second field. Additionally, a user computer may select one or more fields in order to apply one or more programs. In response to receiving a selection of a program for a particular field, the data manager may automatically complete the entries for the particular field based on the selected program. As with the timeline view, the data manager may update the entries for each field associated with a particular program in response to receiving an update to the program. Additionally, the data manager may remove the correspondence of the selected program to the field in response to receiving an edit to one of the entries for the field.

In an embodiment, model and field data is stored in model and field data repository 160. Model data comprises data models created for one or more fields. For example, a crop model may include a digitally constructed model of the development of a crop on the one or more fields. "Model," in this context, refers to an electronic digitally stored set of executable instructions and data values, associated with one another, which are capable of receiving and responding to a programmatic or other digital call, invocation, or request for resolution based upon specified input values, to yield one or more stored output values that can serve as the basis of computer-implemented recommendations, output data displays, or machine control, among other things. Persons of skill in the field find it convenient to express models using mathematical equations, but that form of expression does not confine the models disclosed herein to abstract concepts; instead, each model herein has a practical application in a computer in the form of stored executable instructions and data that implement the model using the computer. The model data may include a model of past events on the one or more fields, a model of the current status of the one or more fields, and/or a model of predicted events on the one or more fields. Model and field data may be stored in data structures in memory, rows in a database table, in flat files or spreadsheets, or other forms of stored digital data.

Figure 4:
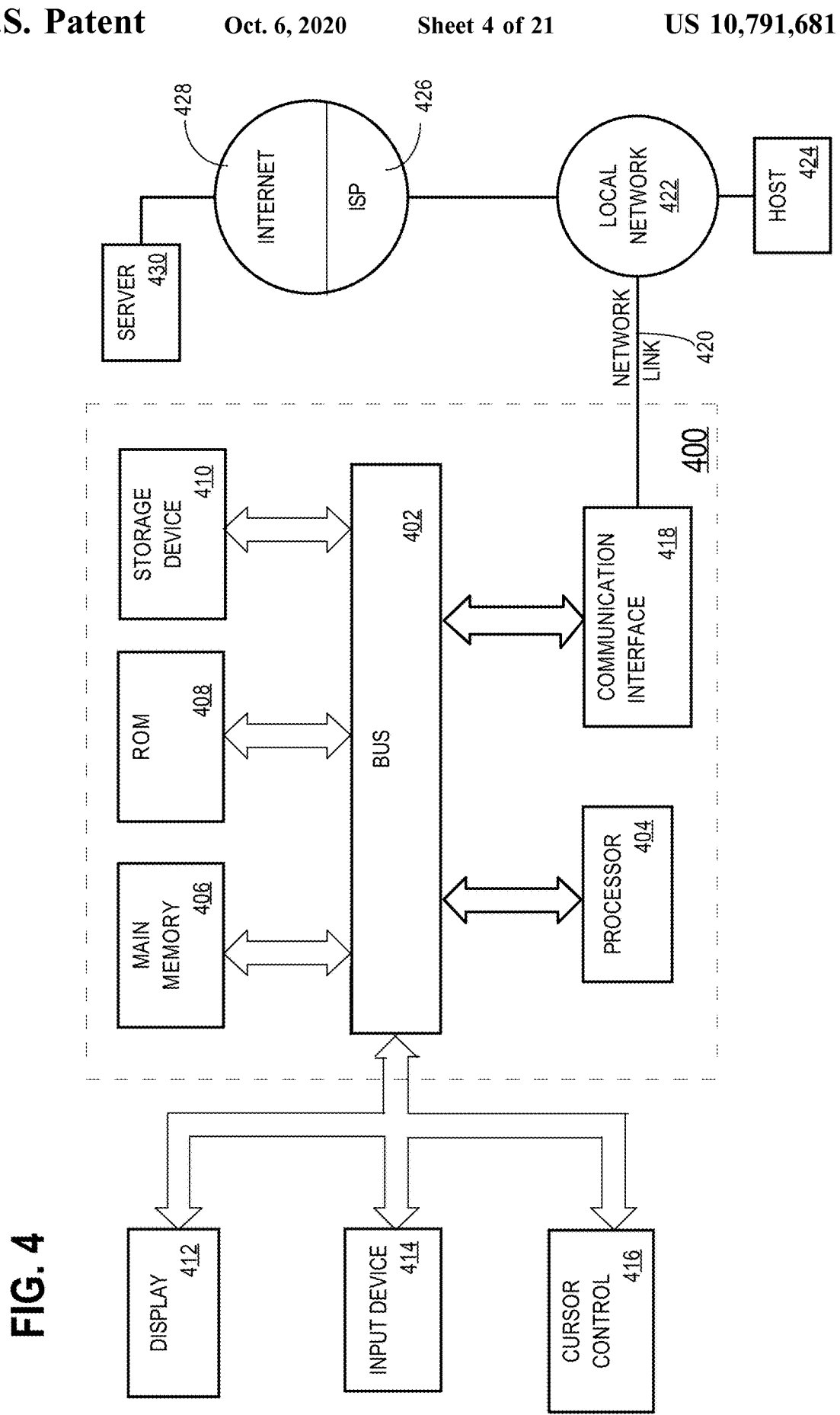
FIG. 4 is a block diagram that illustrates a computer system 400 upon which an embodiment of the invention may be implemented.

Hardware/virtualization layer 150 comprises one or more central processing units (CPUs), memory controllers, and other devices, components, or elements of a computer system such as volatile or non-volatile memory, non-volatile storage such as disk, and I/O devices or interfaces as illustrated and described, for example, in connection with FIG. 4. The layer 150 also may comprise programmed instructions that are configured to support virtualization, containerization, or other technologies.

For purposes of illustrating a clear example, FIG. 1 shows a limited number of instances of certain functional elements. However, in other embodiments, there may be any number of such elements. For example, embodiments may use thousands or millions of different mobile computing devices 104 associated with different users. Further, the system 130 and/or external data server computer 108 may be implemented using two or more processors, cores, clusters, or instances of physical machines or virtual machines, configured in a discrete location or co-located with other elements in a datacenter, shared computing facility or cloud computing facility.

2.2. Application Program Overview

In an embodiment, the implementation of the functions described herein using one or more computer programs or other software elements that are loaded into and executed using one or more general-purpose computers will cause the general-purpose computers to be configured as a particular machine or as a computer that is specially adapted to perform the functions described herein. Further, each of the flow diagrams that are described further herein may serve, alone or in combination with the descriptions of processes and functions in prose herein, as algorithms, plans or directions that may be used to program a computer or logic to implement the functions that are described. In other words, all the prose text herein, and all the drawing figures, together are intended to provide disclosure of algorithms, plans or directions that are sufficient to permit a skilled person to program a computer to perform the functions that are described herein, in combination with the skill and knowledge of such a person given the level of skill that is appropriate for inventions and disclosures of this type.

In an embodiment, user 102 interacts with agricultural intelligence computer system 130 using field manager computing device 104 configured with an operating system and one or more application programs or apps; the field manager computing device 104 also may interoperate with the agricultural intelligence computer system independently and automatically under program control or logical control and direct user interaction is not always required. Field manager computing device 104 broadly represents one or more of a smart phone, PDA, tablet computing device, laptop computer, desktop computer, workstation, or any other computing device capable of transmitting and receiving information and performing the functions described herein. Field manager computing device 104 may communicate via a network using a mobile application stored on field manager computing device 104, and in some embodiments, the device may be coupled using a cable 113 or connector to the sensor 112 and/or controller 114. A particular user 102 may own, operate or possess and use, in connection with system 130, more than one field manager computing device 104 at a time.

The mobile application may provide client-side functionality, via the network to one or more mobile computing devices. In an example embodiment, field manager computing device 104 may access the mobile application via a web browser or a local client application or app. Field manager computing device 104 may transmit data to, and receive data from, one or more front-end servers, using web-based protocols or formats such as HTTP, XML, and/or JSON, or app-specific protocols. In an example embodiment, the data may take the form of requests and user information input, such as field data, into the mobile computing device. In some embodiments, the mobile application interacts with location tracking hardware and software on field manager computing device 104 which determines the location of field manager computing device 104 using standard tracking techniques such as multilateration of radio signals, the global positioning system (GPS), WiFi positioning systems, or other methods of mobile positioning. In some cases, location data or other data associated with the device 104, user 102, and/or user account(s) may be obtained by queries to an operating system of the device or by requesting an app on the device to obtain data from the operating system.

In an embodiment, field manager computing device 104 sends field data 106 to agricultural intelligence computer system 130 comprising or including, but not limited to, data values representing one or more of: a geographical location of the one or more fields, tillage information for the one or more fields, crops planted in the one or more fields, and soil data extracted from the one or more fields. Field manager computing device 104 may send field data 106 in response to user input from user 102 specifying the data values for the one or more fields. Additionally, field manager computing device 104 may automatically send field data 106 when one or more of the data values becomes available to field manager computing device 104. For example, field manager computing device 104 may be communicatively coupled to remote sensor 112 and/or application controller 114. In response to receiving data indicating that application controller 114 released water onto the one or more fields, field manager computing device 104 may send field data 106 to agricultural intelligence computer system 130 indicating that water was released on the one or more fields. Field data 106 identified in this disclosure may be input and communicated using electronic digital data that is communicated between computing devices using parameterized URLs over HTTP, or another suitable communication or messaging protocol.

A commercial example of the mobile application is CLIMATE FIELDVIEW, commercially available from The Climate Corporation, San Francisco, Calif. The CLIMATE FIELDVIEW application, or other applications, may be modified, extended, or adapted to include features, functions, and programming that have not been disclosed earlier than the filing date of this disclosure. In one embodiment, the mobile application comprises an integrated software platform that allows a grower to make fact-based decisions for their operation because it combines historical data about the grower's fields with any other data that the grower wishes to compare. The combinations and comparisons may be performed in real time and are based upon scientific models that provide potential scenarios to permit the grower to make better, more informed decisions.

Figure 2:
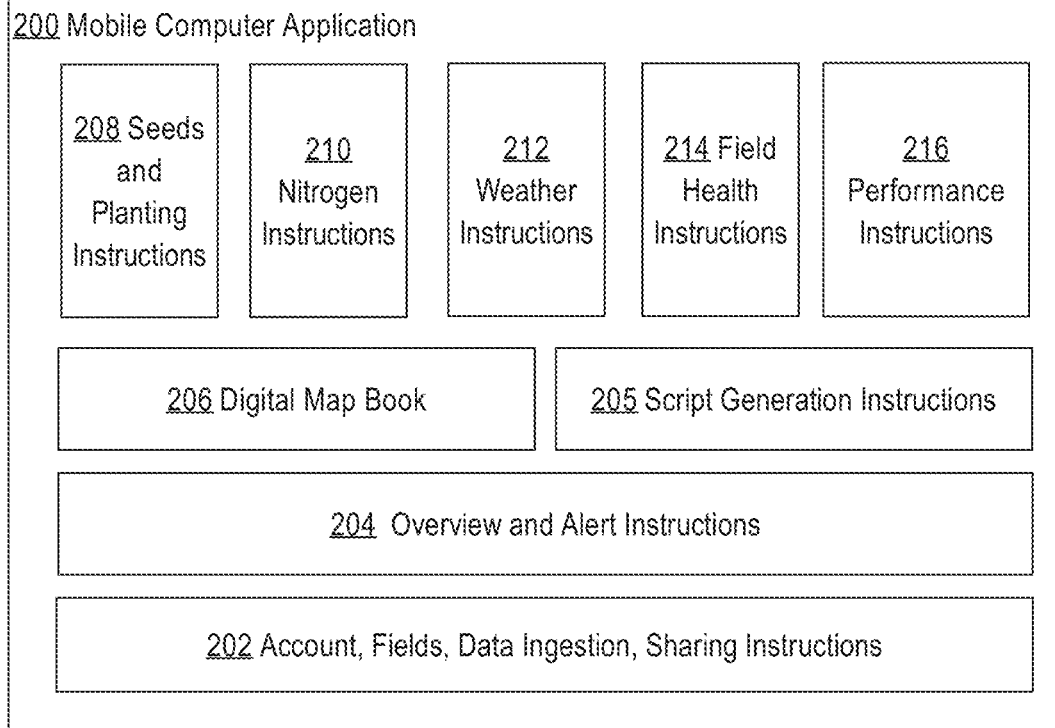
FIG. 2 illustrates two views of an example logical organization of sets of instructions in main memory when an example mobile application is loaded for execution.
Figure 2:
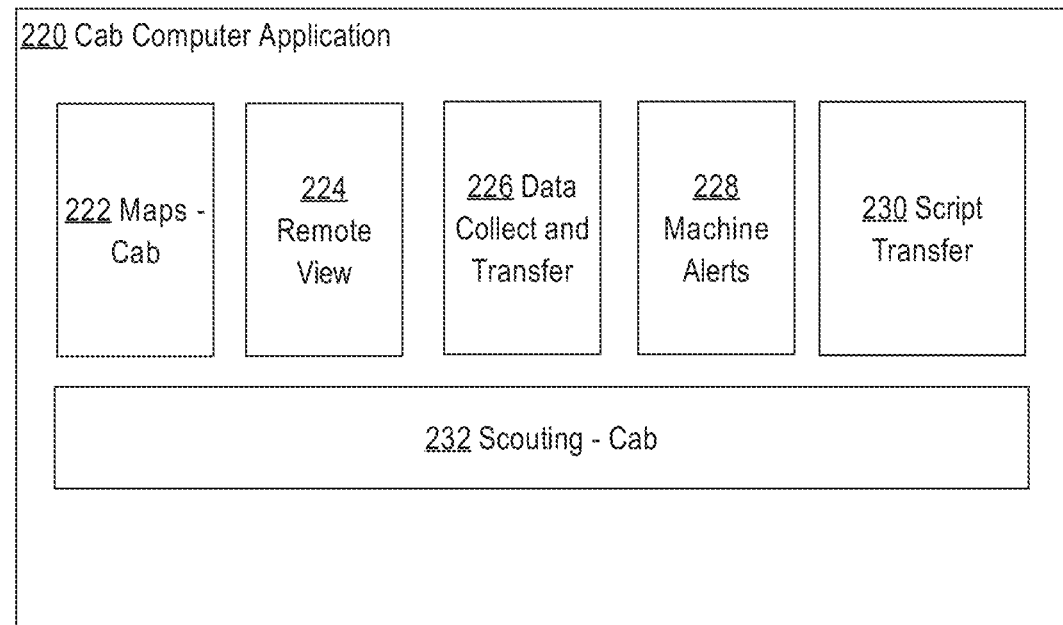

FIG. 2 illustrates two views of an example logical organization of sets of instructions in main memory when an example mobile application is loaded for execution. In FIG. 2, each named element represents a region of one or more pages of RAM or other main memory, or one or more blocks of disk storage or other non-volatile storage, and the programmed instructions within those regions. In one embodiment, in view (a), a mobile computer application 200 comprises account-fields-data ingestion-sharing instructions 202, overview and alert instructions 204, digital map book instructions 206, seeds and planting instructions 208, nitrogen instructions 210, weather instructions 212, field health instructions 214, and performance instructions 216.

In one embodiment, a mobile computer application 200 comprises account-fields-data ingestion-sharing instructions 202 which are programmed to receive, translate, and ingest field data from third party systems via manual upload or APIs. Data types may include field boundaries, yield maps, as-planted maps, soil test results, as-applied maps, and/or management zones, among others. Data formats may include shape files, native data formats of third parties, and/or farm management information system (FMIS) exports, among others. Receiving data may occur via manual upload, e-mail with attachment, external APIs that push data to the mobile application, or instructions that call APIs of external systems to pull data into the mobile application. In one embodiment, mobile computer application 200 comprises a data inbox. In response to receiving a selection of the data inbox, the mobile computer application 200 may display a graphical user interface for manually uploading data files and importing uploaded files to a data manager.

In one embodiment, digital map book instructions 206 comprise field map data layers stored in device memory and are programmed with data visualization tools and geospatial field notes. This provides growers with convenient information close at hand for reference, logging and visual insights into field performance. In one embodiment, overview and alert instructions 204 are programmed to provide an operation-wide view of what is important to the grower, and timely recommendations to take action or focus on particular issues. This permits the grower to focus time on what needs attention, to save time and preserve yield throughout the season. In one embodiment, seeds and planting instructions 208 are programmed to provide tools for seed selection, hybrid placement, and script creation, including variable rate (VR) script creation, based upon scientific models and empirical data. This enables growers to maximize yield or return on investment through optimized seed purchase, placement and population.

In one embodiment, script generation instructions 205 are programmed to provide an interface for generating scripts, including variable rate (VR) fertility scripts. The interface enables growers to create scripts for field implements, such as nutrient applications, planting, and irrigation. For example, a planting script interface may comprise tools for identifying a type of seed for planting. Upon receiving a selection of the seed type, mobile computer application 200 may display one or more fields broken into management zones, such as the field map data layers created as part of digital map book instructions 206. In one embodiment, the management zones comprise soil zones along with a panel identifying each soil zone and a soil name, texture, drainage for each zone, or other field data. Mobile computer application 200 may also display tools for editing or creating such, such as graphical tools for drawing management zones, such as soil zones, over a map of one or more fields. Planting procedures may be applied to all management zones or different planting procedures may be applied to different subsets of management zones. When a script is created, mobile computer application 200 may make the script available for download in a format readable by an application controller, such as an archived or compressed format. Additionally and/or alternatively, a script may be sent directly to cab computer 115 from mobile computer application 200 and/or uploaded to one or more data servers and stored for further use. In one embodiment, nitrogen instructions 210 are programmed to provide tools to inform nitrogen decisions by visualizing the availability of nitrogen to crops. This enables growers to maximize yield or return on investment through optimized nitrogen application during the season. Example programmed functions include displaying images such as SSURGO images to enable drawing of application zones and/or images generated from subfield soil data, such as data obtained from sensors, at a high spatial resolution (as fine as 10 meters or smaller because of their proximity to the soil); upload of existing grower-defined zones; providing an application graph and/or a map to enable tuning application(s) of nitrogen across multiple zones; output of scripts to drive machinery; tools for mass data entry and adjustment; and/or maps for data visualization, among others. "Mass data entry," in this context, may mean entering data once and then applying the same data to multiple fields that have been defined in the system; example data may include nitrogen application data that is the same for many fields of the same grower, but such mass data entry applies to the entry of any type of field data into the mobile computer application 200. For example, nitrogen instructions 210 may be programmed to accept definitions of nitrogen planting and practices programs and to accept user input specifying to apply those programs across multiple fields. "Nitrogen planting programs," in this context, refers to a stored, named set of data that associates: a name, color code or other identifier, one or more dates of application, types of material or product for each of the dates and amounts, method of application or incorporation such as injected or knifed in, and/or amounts or rates of application for each of the dates, crop or hybrid that is the subject of the application, among others. "Nitrogen practices programs," in this context, refers to a stored, named set of data that associates: a practices name; a previous crop; a tillage system; a date of primarily tillage; one or more previous tillage systems that were used; one or more indicators of application type, such as manure, that were used. Nitrogen instructions 210 also may be programmed to generate and cause displaying a nitrogen graph, which indicates projections of plant use of the specified nitrogen and whether a surplus or shortfall is predicted; in some embodiments, different color indicators may signal a magnitude of surplus or magnitude of shortfall. In one embodiment, a nitrogen graph comprises a graphical display in a computer display device comprising a plurality of rows, each row associated with and identifying a field; data specifying what crop is planted in the field, the field size, the field location, and a graphic representation of the field perimeter; in each row, a timeline by month with graphic indicators specifying each nitrogen application and amount at points correlated to month names; and numeric and/or colored indicators of surplus or shortfall, in which color indicates magnitude.

In one embodiment, the nitrogen graph may include one or more user input features, such as dials or slider bars, to dynamically change the nitrogen planting and practices programs so that a user may optimize his nitrogen graph. The user may then use his optimized nitrogen graph and the related nitrogen planting and practices programs to implement one or more scripts, including variable rate (VR) fertility scripts. Nitrogen instructions 210 also may be programmed to generate and cause displaying a nitrogen map, which indicates projections of plant use of the specified nitrogen and whether a surplus or shortfall is predicted; in some embodiments, different color indicators may signal a magnitude of surplus or magnitude of shortfall. The nitrogen map may display projections of plant use of the specified nitrogen and whether a surplus or shortfall is predicted for different times in the past and the future (such as daily, weekly, monthly or yearly) using numeric and/or colored indicators of surplus or shortfall, in which color indicates magnitude. In one embodiment, the nitrogen map may include one or more user input features, such as dials or slider bars, to dynamically change the nitrogen planting and practices programs so that a user may optimize his nitrogen map, such as to obtain a preferred amount of surplus to shortfall. The user may then use his optimized nitrogen map and the related nitrogen planting and practices programs to implement one or more scripts, including variable rate (VR) fertility scripts. In other embodiments, similar instructions to the nitrogen instructions 210 could be used for application of other nutrients (such as phosphorus and potassium) application of pesticide, and irrigation programs.

In one embodiment, weather instructions 212 are programmed to provide field-specific recent weather data and forecasted weather information. This enables growers to save time and have an efficient integrated display with respect to daily operational decisions.

In one embodiment, field health instructions 214 are programmed to provide timely remote sensing images highlighting in-season crop variation and potential concerns. Example programmed functions include cloud checking, to identify possible clouds or cloud shadows; determining nitrogen indices based on field images; graphical visualization of scouting layers, including, for example, those related to field health, and viewing and/or sharing of scouting notes; and/or downloading satellite images from multiple sources and prioritizing the images for the grower, among others.

In one embodiment, performance instructions 216 are programmed to provide reports, analysis, and insight tools using on-farm data for evaluation, insights and decisions. This enables the grower to seek improved outcomes for the next year through fact-based conclusions about why return on investment was at prior levels, and insight into yield-limiting factors. The performance instructions 216 may be programmed to communicate via the network(s) 109 to back-end analytics programs executed at agricultural intelligence computer system 130 and/or external data server computer 108 and configured to analyze metrics such as yield, hybrid, population, SSURGO, soil tests, or elevation, among others. Programmed reports and analysis may include yield variability analysis, benchmarking of yield and other metrics against other growers based on anonymized data collected from many growers, or data for seeds and planting, among others.

Applications having instructions configured in this way may be implemented for different computing device platforms while retaining the same general user interface appearance. For example, the mobile application may be programmed for execution on tablets, smartphones, or server computers that are accessed using browsers at client computers. Further, the mobile application as configured for tablet computers or smartphones may provide a full app experience or a cab app experience that is suitable for the display and processing capabilities of cab computer 115. For example, referring now to view (b) of FIG. 2, in one embodiment a cab computer application 220 may comprise maps-cab instructions 222, remote view instructions 224, data collect and transfer instructions 226, machine alerts instructions 228, script transfer instructions 230, and scouting-cab instructions 232. The code base for the instructions of view (b) may be the same as for view (a) and executables implementing the code may be programmed to detect the type of platform on which they are executing and to expose, through a graphical user interface, only those functions that are appropriate to a cab platform or full platform. This approach enables the system to recognize the distinctly different user experience that is appropriate for an in-cab environment and the different technology environment of the cab. The maps-cab instructions 222 may be programmed to provide map views of fields, farms or regions that are useful in directing machine operation. The remote view instructions 224 may be programmed to turn on, manage, and provide views of machine activity in real-time or near real-time to other computing devices connected to the system 130 via wireless networks, wired connectors or adapters, and the like. The data collect and transfer instructions 226 may be programmed to turn on, manage, and provide transfer of data collected at machine sensors and controllers to the system 130 via wireless networks, wired connectors or adapters, and the like. The machine alerts instructions 228 may be programmed to detect issues with operations of the machine or tools that are associated with the cab and generate operator alerts. The script transfer instructions 230 may be configured to transfer in scripts of instructions that are configured to direct machine operations or the collection of data. The scouting-cab instructions 230 may be programmed to display location-based alerts and information received from the system 130 based on the location of the agricultural apparatus 111 or sensors 112 in the field and ingest, manage, and provide transfer of location-based scouting observations to the system 130 based on the location of the agricultural apparatus 111 or sensors 112 in the field.

2.3. Data Ingest to the Computer System

In an embodiment, external data server computer 108 stores external data 110, including soil data representing soil composition for the one or more fields and weather data representing temperature and precipitation on the one or more fields. The weather data may include past and present weather data as well as forecasts for future weather data. In an embodiment, external data server computer 108 comprises a plurality of servers hosted by different entities. For example, a first server may contain soil composition data while a second server may include weather data. Additionally, soil composition data may be stored in multiple servers. For example, one server may store data representing percentage of sand, silt, and clay in the soil while a second server may store data representing percentage of organic matter (OM) in the soil.

In an embodiment, remote sensor 112 comprises one or more sensors that are programmed or configured to produce one or more observations. Remote sensor 112 may be aerial sensors, such as satellites, vehicle sensors, planting equipment sensors, tillage sensors, fertilizer or insecticide application sensors, harvester sensors, and any other implement capable of receiving data from the one or more fields. In an embodiment, application controller 114 is programmed or configured to receive instructions from agricultural intelligence computer system 130. Application controller 114 may also be programmed or configured to control an operating parameter of an agricultural vehicle or implement. For example, an application controller may be programmed or configured to control an operating parameter of a vehicle, such as a tractor, planting equipment, tillage equipment, fertilizer or insecticide equipment, harvester equipment, or other farm implements such as a water valve. Other embodiments may use any combination of sensors and controllers, of which the following are merely selected examples.

The system 130 may obtain or ingest data under user 102 control, on a mass basis from a large number of growers who have contributed data to a shared database system. This form of obtaining data may be termed "manual data ingest" as one or more user-controlled computer operations are requested or triggered to obtain data for use by the system 130. As an example, the CLIMATE FIELDVIEW application, commercially available from The Climate Corporation, San Francisco, Calif., may be operated to export data to system 130 for storing in the repository 160.

For example, seed monitor systems can both control planter apparatus components and obtain planting data, including signals from seed sensors via a signal harness that comprises a CAN backbone and point-to-point connections for registration and/or diagnostics. Seed monitor systems can be programmed or configured to display seed spacing, population and other information to the user via the cab computer 115 or other devices within the system 130. Examples are disclosed in U.S. Pat. No. 8,738,243 and US Pat. Pub. 20150094916, and the present disclosure assumes knowledge of those other patent disclosures.

Likewise, yield monitor systems may contain yield sensors for harvester apparatus that send yield measurement data to the cab computer 115 or other devices within the system 130. Yield monitor systems may utilize one or more remote sensors 112 to obtain grain moisture measurements in a combine or other harvester and transmit these measurements to the user via the cab computer 115 or other devices within the system 130.

In an embodiment, examples of sensors 112 that may be used with any moving vehicle or apparatus of the type described elsewhere herein include kinematic sensors and position sensors. Kinematic sensors may comprise any of speed sensors such as radar or wheel speed sensors, accelerometers, or gyros. Position sensors may comprise GPS receivers or transceivers, or WiFi-based position or mapping apps that are programmed to determine location based upon nearby WiFi hotspots, among others.

In an embodiment, examples of sensors 112 that may be used with tractors or other moving vehicles include engine speed sensors, fuel consumption sensors, area counters or distance counters that interact with GPS or radar signals, PTO (power take-off) speed sensors, tractor hydraulics sensors configured to detect hydraulics parameters such as pressure or flow, and/or and hydraulic pump speed, wheel speed sensors or wheel slippage sensors. In an embodiment, examples of controllers 114 that may be used with tractors include hydraulic directional controllers, pressure controllers, and/or flow controllers; hydraulic pump speed controllers; speed controllers or governors; hitch position controllers; or wheel position controllers provide automatic steering.

In an embodiment, examples of sensors 112 that may be used with seed planting equipment such as planters, drills, or air seeders include seed sensors, which may be optical, electromagnetic, or impact sensors; downforce sensors such as load pins, load cells, pressure sensors; soil property sensors such as reflectivity sensors, moisture sensors, electrical conductivity sensors, optical residue sensors, or temperature sensors; component operating criteria sensors such as planting depth sensors, downforce cylinder pressure sensors, seed disc speed sensors, seed drive motor encoders, seed conveyor system speed sensors, or vacuum level sensors; or pesticide application sensors such as optical or other electromagnetic sensors, or impact sensors. In an embodiment, examples of controllers 114 that may be used with such seed planting equipment include: toolbar fold controllers, such as controllers for valves associated with hydraulic cylinders; downforce controllers, such as controllers for valves associated with pneumatic cylinders, airbags, or hydraulic cylinders, and programmed for applying downforce to individual row units or an entire planter frame; planting depth controllers, such as linear actuators; metering controllers, such as electric seed meter drive motors, hydraulic seed meter drive motors, or swath control clutches; hybrid selection controllers, such as seed meter drive motors, or other actuators programmed for selectively allowing or preventing seed or an air-seed mixture from delivering seed to or from seed meters or central bulk hoppers; metering controllers, such as electric seed meter drive motors, or hydraulic seed meter drive motors; seed conveyor system controllers, such as controllers for a belt seed delivery conveyor motor; marker controllers, such as a controller for a pneumatic or hydraulic actuator; or pesticide application rate controllers, such as metering drive controllers, orifice size or position controllers.

In an embodiment, examples of sensors 112 that may be used with tillage equipment include position sensors for tools such as shanks or discs; tool position sensors for such tools that are configured to detect depth, gang angle, or lateral spacing; downforce sensors; or draft force sensors. In an embodiment, examples of controllers 114 that may be used with tillage equipment include downforce controllers or tool position controllers, such as controllers configured to control tool depth, gang angle, or lateral spacing.

In an embodiment, examples of sensors 112 that may be used in relation to apparatus for applying fertilizer, insecticide, fungicide and the like, such as on-planter starter fertilizer systems, subsoil fertilizer applicators, or fertilizer sprayers, include: fluid system criteria sensors, such as flow sensors or pressure sensors; sensors indicating which spray head valves or fluid line valves are open; sensors associated with tanks, such as fill level sensors; sectional or system-wide supply line sensors, or row-specific supply line sensors; or kinematic sensors such as accelerometers disposed on sprayer booms. In an embodiment, examples of controllers 114 that may be used with such apparatus include pump speed controllers; valve controllers that are programmed to control pressure, flow, direction, PWM and the like; or position actuators, such as for boom height, subsoiler depth, or boom position.

In an embodiment, examples of sensors 112 that may be used with harvesters include yield monitors, such as impact plate strain gauges or position sensors, capacitive flow sensors, load sensors, weight sensors, or torque sensors associated with elevators or augers, or optical or other electromagnetic grain height sensors; grain moisture sensors, such as capacitive sensors; grain loss sensors, including impact, optical, or capacitive sensors; header operating criteria sensors such as header height, header type, deck plate gap, feeder speed, and reel speed sensors; separator operating criteria sensors, such as concave clearance, rotor speed, shoe clearance, or chaffer clearance sensors; auger sensors for position, operation, or speed; or engine speed sensors. In an embodiment, examples of controllers 114 that may be used with harvesters include header operating criteria controllers for elements such as header height, header type, deck plate gap, feeder speed, or reel speed; separator operating criteria controllers for features such as concave clearance, rotor speed, shoe clearance, or chaffer clearance; or controllers for auger position, operation, or speed.

In an embodiment, examples of sensors 112 that may be used with grain carts include weight sensors, or sensors for auger position, operation, or speed. In an embodiment, examples of controllers 114 that may be used with grain carts include controllers for auger position, operation, or speed.

In an embodiment, examples of sensors 112 and controllers 114 may be installed in unmanned aerial vehicle (UAV) apparatus or "drones." Such sensors may include cameras with detectors effective for any range of the electromagnetic spectrum including visible light, infrared, ultraviolet, near-infrared (NIR), and the like; accelerometers; altimeters; temperature sensors; humidity sensors; pitot tube sensors or other airspeed or wind velocity sensors; battery life sensors; or radar emitters and reflected radar energy detection apparatus. Such controllers may include guidance or motor control apparatus, control surface controllers, camera controllers, or controllers programmed to turn on, operate, obtain data from, manage and configure any of the foregoing sensors. Examples are disclosed in U.S. patent application Ser. No. 14/831,165 and the present disclosure assumes knowledge of that other patent disclosure.

In an embodiment, sensors 112 and controllers 114 may be affixed to soil sampling and measurement apparatus that is configured or programmed to sample soil and perform soil chemistry tests, soil moisture tests, and other tests pertaining to soil. For example, the apparatus disclosed in U.S. Pat. Nos. 8,767,194 and 8,712,148 may be used, and the present disclosure assumes knowledge of those patent disclosures.

In another embodiment, sensors 112 and controllers 114 may comprise weather devices for monitoring weather conditions of fields. For example, the apparatus disclosed in International Pat. Application No. PCT/US2016/029609 may be used, and the present disclosure assumes knowledge of those patent disclosures.

2.4. Process Overview-Agronomic Model Training

In an embodiment, the agricultural intelligence computer system 130 is programmed or configured to create an agronomic model. In this context, an agronomic model is a data structure in memory of the agricultural intelligence computer system 130 that comprises field data 106, such as identification data and harvest data for one or more fields. The agronomic model may also comprise calculated agronomic properties which describe either conditions which may affect the growth of one or more crops on a field, or properties of the one or more crops, or both. Additionally, an agronomic model may comprise recommendations based on agronomic factors such as crop recommendations, irrigation recommendations, planting recommendations, and harvesting recommendations. The agronomic factors may also be used to estimate one or more crop related results, such as agronomic yield. The agronomic yield of a crop is an estimate of quantity of the crop that is produced, or in some examples the revenue or profit obtained from the produced crop.

In an embodiment, the agricultural intelligence computer system 130 may use a preconfigured agronomic model to calculate agronomic properties related to currently received location and crop information for one or more fields. The preconfigured agronomic model is based upon previously processed field data, including but not limited to, identification data, harvest data, fertilizer data, and weather data. The preconfigured agronomic model may have been cross validated to ensure accuracy of the model. Cross validation may include comparison to ground truthing that compares predicted results with actual results on a field, such as a comparison of precipitation estimate with a rain gauge or sensor providing weather data at the same or nearby location or an estimate of nitrogen content with a soil sample measurement.

Figure 3:
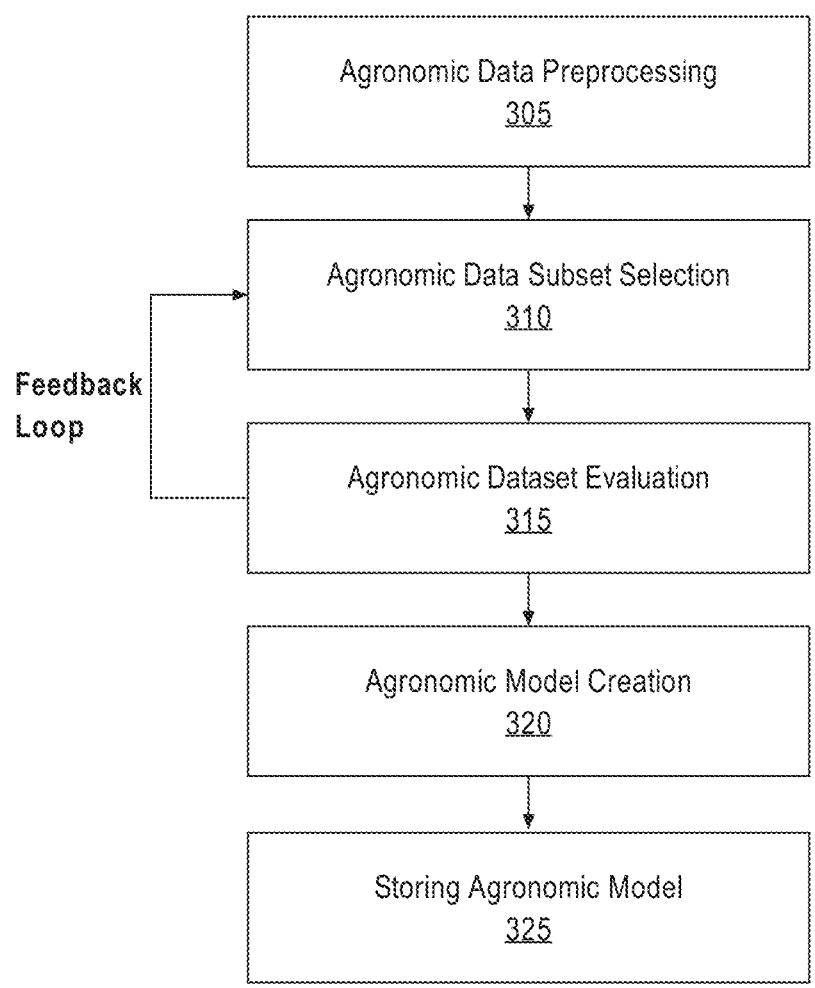
FIG. 3 illustrates a programmed process by which the agricultural intelligence computer system generates one or more preconfigured agronomic models using agronomic data provided by one or more data sources.

FIG. 3 illustrates a programmed process by which the agricultural intelligence computer system generates one or more preconfigured agronomic models using field data provided by one or more data sources. FIG. 3 may serve as an algorithm or instructions for programming the functional elements of the agricultural intelligence computer system 130 to perform the operations that are now described.

At block 305, the agricultural intelligence computer system 130 is configured or programmed to implement agronomic data preprocessing of field data received from one or more data sources. The field data received from one or more data sources may be preprocessed for the purpose of removing noise and distorting effects within the agronomic data including measured outliers that would bias received field data values. Embodiments of agronomic data preprocessing may include, but are not limited to, removing data values commonly associated with outlier data values, specific measured data points that are known to unnecessarily skew other data values, data smoothing techniques used to remove or reduce additive or multiplicative effects from noise, and other filtering or data derivation techniques used to provide clear distinctions between positive and negative data inputs.

At block 310, the agricultural intelligence computer system 130 is configured or programmed to perform data subset selection using the preprocessed field data in order to identify datasets useful for initial agronomic model generation. The agricultural intelligence computer system 130 may implement data subset selection techniques including, but not limited to, a genetic algorithm method, an all subset models method, a sequential search method, a stepwise regression method, a particle swarm optimization method, and an ant colony optimization method. For example, a genetic algorithm selection technique uses an adaptive heuristic search algorithm, based on evolutionary principles of natural selection and genetics, to determine and evaluate datasets within the preprocessed agronomic data.

At block 315, the agricultural intelligence computer system 130 is configured or programmed to implement field dataset evaluation. In an embodiment, a specific field dataset is evaluated by creating an agronomic model and using specific quality thresholds for the created agronomic model. Agronomic models may be compared using cross validation techniques including, but not limited to, root mean square error of leave-one-out cross validation (RMSECV), mean absolute error, and mean percentage error. For example, RMSECV can cross validate agronomic models by comparing predicted agronomic property values created by the agronomic model against historical agronomic property values collected and analyzed. In an embodiment, the agronomic dataset evaluation logic is used as a feedback loop where agronomic datasets that do not meet configured quality thresholds are used during future data subset selection steps (block 310).

At block 320, the agricultural intelligence computer system 130 is configured or programmed to implement agronomic model creation based upon the cross validated agronomic datasets. In an embodiment, agronomic model creation may implement multivariate regression techniques to create preconfigured agronomic data models.

At block 325, the agricultural intelligence computer system 130 is configured or programmed to store the preconfigured agronomic data models for future field data evaluation.

2.5. Implementation Example—Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

For example, FIG. 4 is a block diagram that illustrates a computer system 400 upon which an embodiment of the invention may be implemented. Computer system 400 includes a bus 402 or other communication mechanism for communicating information, and a hardware processor 404 coupled with bus 402 for processing information. Hardware processor 404 may be, for example, a general purpose microprocessor.

Computer system 400 also includes a main memory 406, such as a random access memory (RAM) or other dynamic storage device, coupled to bus 402 for storing information and instructions to be executed by processor 404. Main memory 406 also may be used for storing temporary variables or other intermediate information during execution of instructions to be executed by processor 404. Such instructions, when stored in non-transitory storage media accessible to processor 404, render computer system 400 into a special-purpose machine that is customized to perform the operations specified in the instructions.

Computer system 400 further includes a read only memory (ROM) 408 or other static storage device coupled to bus 402 for storing static information and instructions for processor 404. A storage device 410, such as a magnetic disk, optical disk, or solid-state drive is provided and coupled to bus 402 for storing information and instructions.

Computer system 400 may be coupled via bus 402 to a display 412, such as a cathode ray tube (CRT), for displaying information to a computer user. An input device 414, including alphanumeric and other keys, is coupled to bus 402 for communicating information and command selections to processor 404. Another type of user input device is cursor control 416, such as a mouse, a trackball, or cursor direction keys for communicating direction information and command selections to processor 404 and for controlling cursor movement on display 412. This input device typically has two degrees of freedom in two axes, a first axis (e.g., x) and a second axis (e.g., y), that allows the device to specify positions in a plane.

Computer system 400 may implement the techniques described herein using customized hard-wired logic, one or more ASICs or FPGAs, firmware and/or program logic which in combination with the computer system causes or programs computer system 400 to be a special-purpose machine. According to one embodiment, the techniques herein are performed by computer system 400 in response to processor 404 executing one or more sequences of one or more instructions contained in main memory 406. Such instructions may be read into main memory 406 from another storage medium, such as storage device 410. Execution of the sequences of instructions contained in main memory 406 causes processor 404 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical disks, magnetic disks, or solid-state drives, such as storage device 410. Volatile media includes dynamic memory, such as main memory 406. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 402. Transmission media can also take the form of acoustic or light waves, such as those generated during radio-wave and infra-red data communications.

Various forms of media may be involved in carrying one or more sequences of one or more instructions to processor 404 for execution. For example, the instructions may initially be carried on a magnetic disk or solid-state drive of a remote computer. The remote computer can load the instructions into its dynamic memory and send the instructions over a telephone line using a modem. A modem local to computer system 400 can receive the data on the telephone line and use an infra-red transmitter to convert the data to an infra-red signal. An infra-red detector can receive the data carried in the infra-red signal and appropriate circuitry can place the data on bus 402. Bus 402 carries the data to main memory 406, from which processor 404 retrieves and executes the instructions. The instructions received by main memory 406 may optionally be stored on storage device 410 either before or after execution by processor 404.

Computer system 400 also includes a communication interface 418 coupled to bus 402. Communication interface 418 provides a two-way data communication coupling to a network link 420 that is connected to a local network 422. For example, communication interface 418 may be an integrated services digital network (ISDN) card, cable modem, satellite modem, or a modem to provide a data communication connection to a corresponding type of telephone line. As another example, communication interface 418 may be a local area network (LAN) card to provide a data communication connection to a compatible LAN. Wireless links may also be implemented. In any such implementation, communication interface 418 sends and receives electrical, electromagnetic or optical signals that carry digital data streams representing various types of information.

Network link 420 typically provides data communication through one or more networks to other data devices. For example, network link 420 may provide a connection through local network 422 to a host computer 424 or to data equipment operated by an Internet Service Provider (ISP) 426. ISP 426 in turn provides data communication services through the world wide packet data communication network now commonly referred to as the "Internet" 428. Local network 422 and Internet 428 both use electrical, electromagnetic or optical signals that carry digital data streams. The signals through the various networks and the signals on network link 420 and through communication interface 418, which carry the digital data to and from computer system 400, are example forms of transmission media.

Computer system 400 can send messages and receive data, including program code, through the network(s), network link 420 and communication interface 418. In the Internet example, a server 430 might transmit a requested code for an application program through Internet 428, ISP 426, local network 422 and communication interface 418.

The received code may be executed by processor 404 as it is received, and/or stored in storage device 410, or other non-volatile storage for later execution.

3. Identifying Management Zones Based on Yield Maps, Soil Maps, Topography Maps and Satellite Data 3.1. Management Zones In the context of precision agriculture, management zones are contiguous sub regions within an agricultural field that have similar constraints or limiting factors that influence harvested yields of crops. The field regions that belong to the same management zone can usually be managed uniformly in terms of seeding schedules or management practices. Identifying management zones within a field may help growers to make customized management decisions, such as choosing seed hybrids and seeding population that are best for each individual zone.

One objective for creating zones is to divide the entire agricultural field into regions having distinctive spatial and/or temporal yield behaviors. Creating, or identifying, such zones may help guiding growers to improve agricultural practices. This may include providing growers with recommendations for a seeding rate selection, a seeding timing, a fertilizer selection, and a fertilizing timing for individual zones.

Recommendations that are customized to the needs of individual zones to improve yield and profitability of the field may include prescriptions for seeding. The prescription, also referred to as recommendations, may specify certain seed hybrids, seed population and nitrogen fertilizer for different sub regions in a field. The recommendations may be determined based on characteristics of regions within a zone.

One criterion that may be used to determine the quality of management zones is compactness. Zones that are generated using a good management zone delineation approach are usually compact. Generating compact zones involves maximizing homogeneity within zones. There should also be a well-defined separation between different zones to ensure that the created zones actually require different management practices. The compactness and separation of the management zones that have been created may be evaluated by a visual assessment by either directly overlapping the delineated zones with yield maps, or by plotting a distribution of yield values in each zone and year, using appropriately programmed computers. The compactness and separation may also be evaluated by a quantitative assessment which defines numeric measures to accurately quantify the compactness and separation of yield observations in the delineated zones.

Management zones may be created automatically using computer programs, and based on transient and permanent characteristics of an agricultural field. Transient characteristics may include yield data collected for sub regions and using historical yield maps. Permanent characteristics may include soil measurements and topographical properties of the field. The permanent characteristics data may be obtained from SSURGO maps and satellite images of the field. Permanent characteristics may be particularly useful when historical yield maps are unavailable for the field. Using the permanent characteristics of the field in determining management zones allows to incorporate to the zone creation process the data layers, such as soil and elevation data, in addition to yield data, and thus to refine the zone creation process.

Management zones that are created based on yield maps may group the regions with similar yield patterns and permanent properties. Such management zones aim to explain the productivity characteristics using the underlying properties of the soil. For example, zones with low organic matter or high pH may both have the low yield.

In an embodiment, a process of creating management zones comprises obtaining and processing transient characteristics data and permanent characteristics data for a field. The process may include determining desired sizes of the zones, and an optimal count of zones to achieve the desired productivity and yield from the field. The process may include creating one or more management zone delineation options, and separate planting plans for the individual options.

In an embodiment, a process of creating management zones comprises an interactive computer tool that is programmed for visualizing graphical representations of management zone delineation options and corresponding planting plans. The interactive tool may also be configured to manipulate layouts of the zones in the zone delineated options.

Graphical representations of management zones and planting plans may be generated using a GUI, and may graphically represent layouts of the zones, information about the zones, and planting plans for the zones.

3.2. Transient Feature Data—Yield Data

Transient feature data represents land or field characteristics that vary from time to time. In the context of agricultural management zones, examples of transient feature data may include yield data because the yields from a field vary from one harvesting season to another.

Yield data may include historical yield maps that represent spatial and temporal yield patterns for the sub-fields. Yield data may include information about yields of crops harvested from an agricultural field within one year or within several years. Yield data may also include additional information such as a field boundary, a field size, and a location of each sub-field within the field. Yield data may be provided from different sources. Examples of the sources may include research partners, agricultural agencies, agricultural organizations, growers, governmental agencies, and others.

3.3. Permanent Feature Data

Permanent feature data represents characteristics that remain unchanged from one season to another. In the context of agricultural management zones, examples of permanent feature data for a field may include characteristics of soil, topology and terrain of the field because such data usually does not change from one harvesting season to another.

Permanent feature data may include soil characteristics and topology characteristics. They may be obtained from soil survey maps, satellite maps, and baresoil maps. Permanent feature data may be provided as datasets. Examples of datasets include 2013 and 2014 Research Partner soil sampling datasets, Rapid-Eye images, SSURGO polygon boundaries and National Elevation Dataset (NED).

3.3.1. Soil Characteristics

Data for soil characteristics of a field may be obtained based on soil samples collected from the field. Soil sampling for a field may be performed using various sampling techniques. For example, collecting soil samples may be performed at an approximate resolution of one sample per two acres. The samples may be collected at grid points within a field and the grid may roughly form a rectangle. The original measurement data may be stored in files on computer servers.

When soil samples are provided from different sources, there might be some differences in soil sampling methods. The differences may be caused by different accuracy measures with which the samples were collected, and/or different sampling depths at which the soil was sampled. To eliminate the impact of such differences, the datasets may be preprocessed. The preprocessing may include removing duplicated samples, samples with no associated values, samples with no geographical coordinate information, and samples with incorrect coordinates and geographical information.

3.3.2. Topology Characteristics

Topology characteristics of a field may include geographical and elevation characteristics of the field. Topology characteristics may include elevation data for an agricultural field, and other topographical properties that may be derived from the elevation data. The properties may include a wetness index, also referred to as a Composite Topographic Index CTI, a Topographic Position Index (TPI) indicator, an aspect, a flow direction, and a slope.

Elevation data may be obtained from different sources, including the National Elevation Dataset (NED). The NED dataset usually provides a resolution of about a third of an arc-second.

3.3.3. Soil Survey Maps

Soil survey characteristics may be provided in form of soil survey maps. One source of the soil survey maps is available from the SSURGO database that contains soil survey data of most areas in the United States.

A typical soil survey dataset is organized as a set of individual map units, each of which covers a polygon area. The data associated with each polygon may include soil properties and soil texture data, and the data may be provided at different spatial resolutions. The data may or may not be associated with specific geographical point locations.

Soil survey data may represent qualitative assessment and lab-analyzed sample data. Since the SSURGO maps provide a high resolution of soil measurement data, the soil texture data available in the SSURGO maps may be sufficient for the purpose of a zone creation. In a particular implementation, the applicable soil texture data is at mukey (a map unit key) level 2. That means that the value of soil texture properties is uniform over the entire spatial polygon.

In an embodiment, the SSURGO data for a set of fields of interest is provided as a set of spatial polygons. The set of polygons may be processed by for example, determining whether the soil texture data was missing for an entire polygon, and if so, a k-Nearest Neighbor (kNN) data points may be used to interpolate the missing data point. Furthermore, the sand, silt and clay percentages may be normalized to add up to a 100%. Examples of attributes used in a zone creation process include sand and silt attributes.

3.3.4. Satellite Maps

Satellite characteristics for an agricultural field are typically determined based on satellite maps. Satellite image data may be provided at different spatial, spectral and temporal resolutions. The satellite maps may provide information about agricultural crop assessment, crop health, change detection, environmental analysis, irrigated landscape mapping, yield determination and soils analysis. The images may be acquired at different times of the year and multiple times within a year.

Satellite images may depict variations in organic matter and drainage patterns. Soils higher in organic matter can be differentiated from lighter sandier soil that has a lower organic matter content. This information may be used in conjunction with other types of maps to define management zones for a field.

3.3.5. Baresoil Maps as Examples of Satellite Maps

Examples of satellite maps include baresoil maps. Baresoil maps may include baresoil characteristics determined based on baresoil maps. Examples of such maps may include RapidEye satellite images. In a typical RapidEye image for a field, data may contain per-pixel (5 meter by 5 meter) percentage reflectance values for five different bands: red, red edge, blue, green, and near-infra-red (NIR). Using the RapidEye images may provide soil characteristics that may not be available when other types of images are used. For example, the RapidEye data usually represents topsoil better and deeper than other types of images.

In an embodiment, a set of baresoil images is preprocessed. For example, for each field, the images that contain cloud contaminations may be discarded. Furthermore, the images that were generated based on data from the most recent year may be selected.

3.4. Pipeline for Creating Management Zones

An objective for creating management zones is to divide an entire agricultural field into different productivity regions with distinctive spatial-temporal yielding behaviors. Creating, or identifying, such zones may help and guide the crops growers by providing the growers with recommendations for agricultural practices tailored for individual zones.

In an embodiment, management zones are delineated within an agricultural field using a management zone creating pipeline.

Figure 7:
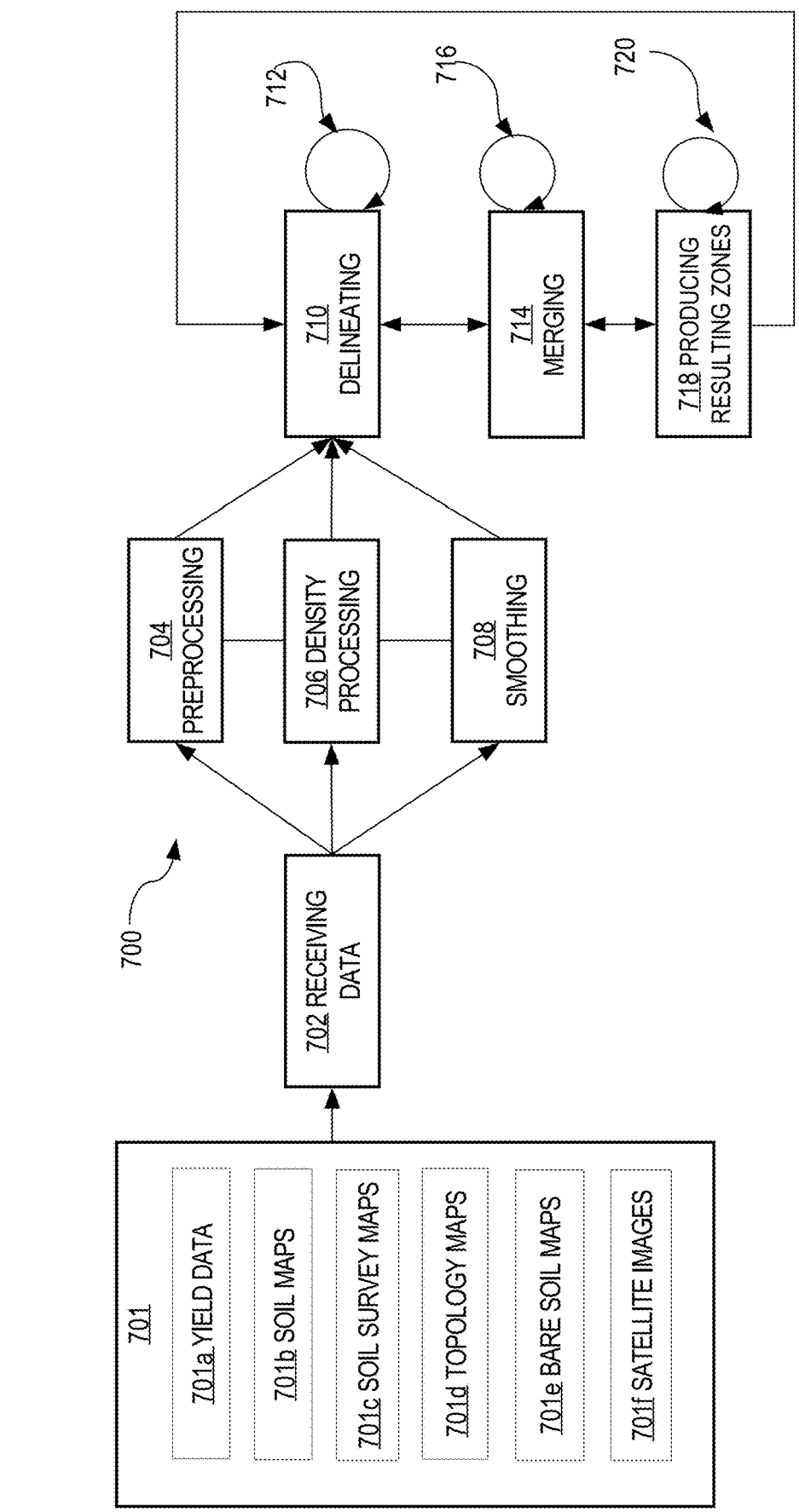
FIG. 7 depicts an example embodiment of a management zone creation pipeline.

FIG. 7 depicts an example embodiment of a management zone creation pipeline. The example depicts programmed processing steps and an algorithm for use in programming the instructions previously discussed in connection with FIG. 1. Management zone creating pipeline 700 includes processing blocks for actions performed sequentially, in parallel or that are optional as further described in this section.

Block 701 represents program instructions for storing data representing transient and permanent characteristics of an agricultural field. The data may be stored at various data repositories, including server computers, databases, cloud storage systems, service providers, external data storage devices, and the like. Transient characteristics data may include yield data 701*a*. Permanent characteristics data may be provided as soil maps 701*b*, soil survey maps 701*c*, topology maps 701*d*, baresoil maps 701*e*, and satellite images 701*f*. Other information pertaining to the persistent characteristics of the soil and field may also be used.

Block 702 represents program instructions for receiving data. In block 702, data is received; for example, system 130 (FIG. 1) receives yield data and permanent characteristics data as part of the field data 106. The data may include historical yield maps at the field level or sub field level, and maps representing persistent characteristics of the soil. The maps represent spatial-temporal patterns for the sub-fields and are used to classify a field into regions with distinctive or different productivity potentials.

Data may be received from different sources such as research partners (RP), agencies, organizations, growers and others. Received data may include information about yield of crops harvested from an agricultural field within one year or multiple years. In an embodiment, yield data may also include metadata such as a field boundary, a field size, and a location of each sub-field within the field.

3.4.1. Preprocessing

Blocks 704, 706 and 708 represent program instructions for preprocessing, density processing and smoothing of yield data. Instructions for blocks 704, 706 and 708 may be executed selectively, optionally, sequentially, or in parallel. The manner in which the tasks are performed may vary based on the implementation and the quality of received yield data. For example, some of the received data may need preprocessing, but not smoothing. Other data may need only density processing. Selecting one or more of blocks 704, 706, 708 may be based on a manual inspection or a machine-based inspection of the received data, and may be performed in block 702.

Yield data may include sub-field yield observations and may include contaminated observations. Contaminations may be caused by the way the crops are harvested, or by the way the yield data is collected or recorded. The contaminated observations may include outliers, invalid data, redundant data, and the like.

Preprocessing may comprise identifying data items that are outliers, invalid, redundant, or collected outside of a field boundary. Such data may be removed. Preprocessing may also include identifying, and removing, the yield observations collected from a field on which multiple crops were planted in the same season.

Block 704 represents program instructions for preprocessing received data. Preprocessing at block 704 may be performed because for example, some of the data observations for a field were collected outside of corresponding field boundaries. The preprocessing may also be recommended when the data is redundant, or provided from a field on which multiple crops were planted in the same season.

Preprocessing of yield data may be performed to reduce or eliminate invalid data, which is also referred to as noise observations. Preprocessing may include identifying the noise observations, and replacing the noise observations with for example approximated yield values. Preprocessing of the yield data may also include removing outliers from the yield data.

In an embodiment, received yield data is analyzed to determine whether less than two years of yield maps for a field are provided. If less than two years of yield maps for a field are provided, then the yield maps are not included in the zone delineation process. This is because processing the yield maps collected during only one year may be insufficient for delineating the zones.

Additional preprocessing and filtering of the data may include adjusting the data values to account for grain moisture. Adjusting the grain moisture allows correcting the yield data records collected from the fields and/or during the years in which the moisture level was other than the standard moisture level such as 15.5% moisture.

Additional processing may include correcting yield productivity data to account for data inaccuracies when experimental yield data is provided. This may include correcting the yield data if the data was pre-smoothed by a data provider using undesired algorithms or parameters. This type of additional processing is recommended to reduce the effect of improperly smoothed yield data on the results of the management zones creation.

Additional preprocessing of the data may include transforming the data from latitude-longitude coordinates to the Universal Transverse Mercator (UTM) coordinates, and mapping the resulting coordinates onto a grid that has been defined for the field. For example, a 10 m×10 m grid may be used. The mapping allows standardization of locations of the yield records within the field.

If the received data was sampled in the system other than the UTM, then preprocessing of permanent characteristics data may include adjusting the soil samples to the UTM resolution of samples per acre. This may also include programmatically projecting the soil samples data onto the UTM coordinates. Missing sample values may be interpolated at the UTM coordinates from the available data using a Gaussian model with a constant trend and parameters that are obtained using a maximum likelihood estimator.

Elevation, CTI and slope data of the yield data may be obtained directly from maps or from property raster data. This may include extracting cell values of the elevation raster where a yield spatial point falls in. If no cell raster is found, then an indication of no values may be returned.

After a projection of the coordinates of a spatial polygon onto UTM coordinates is performed, the SSURGO polygons may be overlapped onto the spatial locations of the yield data.

In projecting the image data onto the UTM coordinate system, values of the image data at the location points of the yield data may be obtained by rasterizing the yield data. The results may be transferred to the yield raster cells. If one cell of yield data is covered by multiple imagery bands of data points, then an arithmetic mean of the values may be used to associate the data points with the raster cells.

Block 706 represents program instructions for density processing of received data. Data density processing may be performed to normalize the yield data across different crops and fields. In an embodiment, data density processing comprises using an empirical cumulative distribution function (ECDF) transformation. The ECDF transformation may be performed on the yield records for each field and year so that the transformed yield data is within a certain range across different crops and fields. For example, the ECDF may be applied to the received yield data to transform the data into transformed yield data in the range of [0, 1]. Once the yield data is transformed, the transformed yield data may be compared across different years and across different crops, such as corn, soy, or wheat.

3.4.2. Spatial Smoothing

Spatial smoothing is a process of removing inaccurate observations from the collected yield observations and defragmenting the obtained delineated zones. The spatial smoothing may be performed using a kernel-smoother or a stationary Gaussian process. Depending on the quality of the received raw data, data smoothing may be performed on either raw data or processed data.

A kernel smoother is a statistical technique for estimating a function of observations when no parametric model for the function is known. The resulting estimated function is usually smooth and may be used to remove the noise observations from a set of yield data. Kernel smoothers are reliable and useful nonparametric estimators, and may be selected to perform the spatial smoothing of the yield data. Examples of kernel smoothers that can be used to smooth the yield data include: Gaussian kernel, inverse distance weighting kernel, rectangular kernel, triangular kernel, bi-square kernel, tri-cube kernel, and tri-weight kernel. Besides their standard parameterization, all of them have a scale parameter h and a span parameter H such that the distance between yield data observations may be scaled and the observations that are more than H away from the destination point may be omitted in the smoothing process.

Block 708 represents program instructions for smoothing received data. Data smoothing may include testing whether any yield data records are missing, whether the yield data records need to be further smoothed, or whether certain yield data records need to be removed or interpolated.

3.4.3. Normalization

In an embodiment, received data is normalized by transforming the data to a particular data range. The transformed yield data may be comparable across different years and types of crops. Transforming the yield data may comprise for example, applying the ECDF to the yield data to normalize the data to a range of [0, 1]. The ECDF may allow transforming, or normalizing, yield records for each field and year to a range of [0, 1] regardless of the crop type and the collection time.

The ECDF transformation may be used to transform the yield data into the transformed yield data. Application of the ECDF to the yield data may cause transforming the yield data records to transformed yield data records, each of which falls within a particular range. Applying the ECDF to the yield data causes normalizing the yield data so that the normalized yield data is comparable across different years and crops, such as corn, soy, and wheat.

3.4.4. Clustering

Clustering is a process of grouping data, or zones, into clusters and determining cluster labels for the clusters. Clustering the zones may be performed by merging small zones with larger zones. For example, zones with sizes smaller than a particular size may be merged with their most similar large neighboring zones. The particular size may be set by manually or automatically using configuration data.

In block 710, preprocessed data representing transient and permanent characteristic of an agricultural field is used to delineate a set of management zones for an agricultural field. The set of delineated management zones may be represented using stored digital zone data, and created by applying centroid-based approaches, such as the K-means approach, or a fuzzy C-means approach. Details of these approaches are described further herein in connection with FIG. 8.

The process executed in block 710 may be repeated, as depicted by arrow 712, one or more times until the quality of the created management zones is satisfactory. The process may be repeated using different criteria, different parameters, or different parameter values.

In an embodiment, a set of delineated management zones is analyzed to determine whether some of the zones may be merged. For example, a set of delineated management zones may be analyzed to identify small zones and to determine whether the small zones may be merged with neighboring larger zones. Small zones may be identified automatically by a computer system, or manually by a user of the computer system. For example, the computer system may display information about the set of first management zones to a crop grower in a graphical user interface that is programmed with widgets or controls to allow the grower to remove undesirable fragmented small zones, or to merge the fragmented small zones with larger zones. Merging of zones results in obtaining a set of merged management zones. If small zones cannot be identified in a set of delineated management zones, then the set of delineated management zones is provided to block 718.

The process executed in block 714 may be repeated one or more times until no small zones are identified in the set of management zones. The process may be repeated using different criteria, different parameters, or different parameter values.

In block 718, a set of management zones is post-processed. Post-processing of the management zones may include eliminating the zones that are fragmented or unusable.

The process executed in block 718 may be repeated one or more times until the quality of created management zones is satisfactory. The process may be repeated using different criteria, different parameters, or different parameter values.

In an embodiment, metadata about the created management zones is generated and stored. Furthermore, a test may be performed to determine whether the process of delineating management zones needs to be repeated. If the delineation process is to be repeated, then the delineating of the management zones is repeated in block 710.

3.4.4.1. Identifying Management Zones

In an embodiment, the management zone delineation process is performed for different values of a management class count. A management class refers to one or more areas in a field that have relatively homogeneous yield limiting factors. The areas are not restricted to a spatial continuity. For example, several management zones which are spatially separated from each other could belong to the same management class and could be operated in the same manner.

Figure 8:
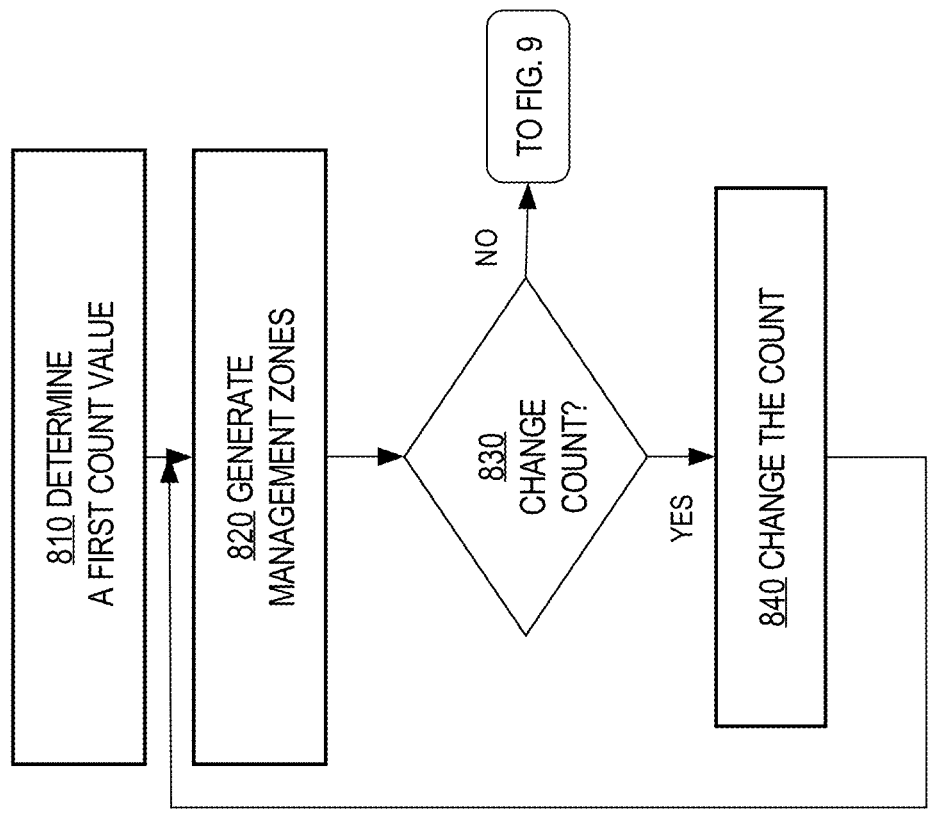
FIG. 8 depicts an example method for creating management zones for an agricultural field.

FIG. 8 depicts an example method for creating management zones for an agricultural field. In step 810, a first count value for a management class count of a plurality of management classes is determined. Selecting a first count value for the management classes may include selecting a number of management classes that has been shown in the past to be an optimal number of classes for creating the zones. A count of management classes is also referred to as a tuning parameter.

An optimal number of management classes may be found using a variety of approaches. According to one approach, an optimal number of management classes is selected by using all training yield maps at once. In this approach, a clustering algorithm is applied to the smoothed training yield maps using different number of classes and for each class. Then a training zone-quality measure for each class numbers is determined and used to identify an optimal number of classes.

According to another approach, an optimal number of management classes is selected by carrying out a leave-one-year-out cross-validation approach for training yield maps.

Once a first count value is determined for a count of a plurality of classes, a first set of management zones is generated in step 820. The first set of management zones may be generated, for example, using a management zone delineation process that is performed using either clustering approaches or region merging approaches. Examples of clustering approaches may include centroid-based multivariate clustering approaches, such as a K-means approach and a fuzzy C-means approach. Examples of region merging approaches may include agglomerative region merging approaches, such as a hierarchical region-based segmentation approach.

3.4.4.2. K-Means Approach

In an embodiment, the management zone delineation process is implemented using the K-means approach. The K-means approach aims to partition a set of yield data observations into k clusters so that each observation belongs to the cluster with the nearest mean. A benefit of using the K-means approach in the management zone delineation process is its simplicity.

In an embodiment, the K-means approach does not consider spatial locations of the yield data observations within the field. As a result, a direct output from the K-means clustering is a set of management class labels of each pixel i. Some additional steps may be needed to identify spatially contiguous zones. Moreover, it is recommended to use well preprocessed yield maps before using the K-means approach. If the yield maps are insufficiently preprocessed, then the results produced by the K-means approach may include many fragmented small zones.

3.4.4.3. Region Merging Approach

In an embodiment, the management zone delineation process is programmed to use a hierarchical region-based segmentation. In this approach, two zones are neighboring to each other if, and only if, at least one pair of pixels between the two zones are neighboring pixels based on the nearest 4-neighbor rule.

A benefit of the region merging approach is that it utilizes a spatial location of the yield observations when creating the management zones. The approach is expected to generate spatially contiguous zones naturally unless the dissimilarity threshold is set too strictly or the yield maps are too rough. In addition, as the dissimilarity threshold e is a continuous tuning parameter, as opposed to k which takes only positive integers in K-means or fuzzy C-means, the hierarchical region merging algorithm may have more flexibility to fine tune the resulting zone delineation. This may help to satisfy the diverse needs from different growers.

Another benefit of the region merging approach is that the region merging algorithm generates zone labels directly and without class labels. Although the region merging approach may not include an additional processing to present management zones, some post processing of the zone properties may be recommended.

Figure 9:
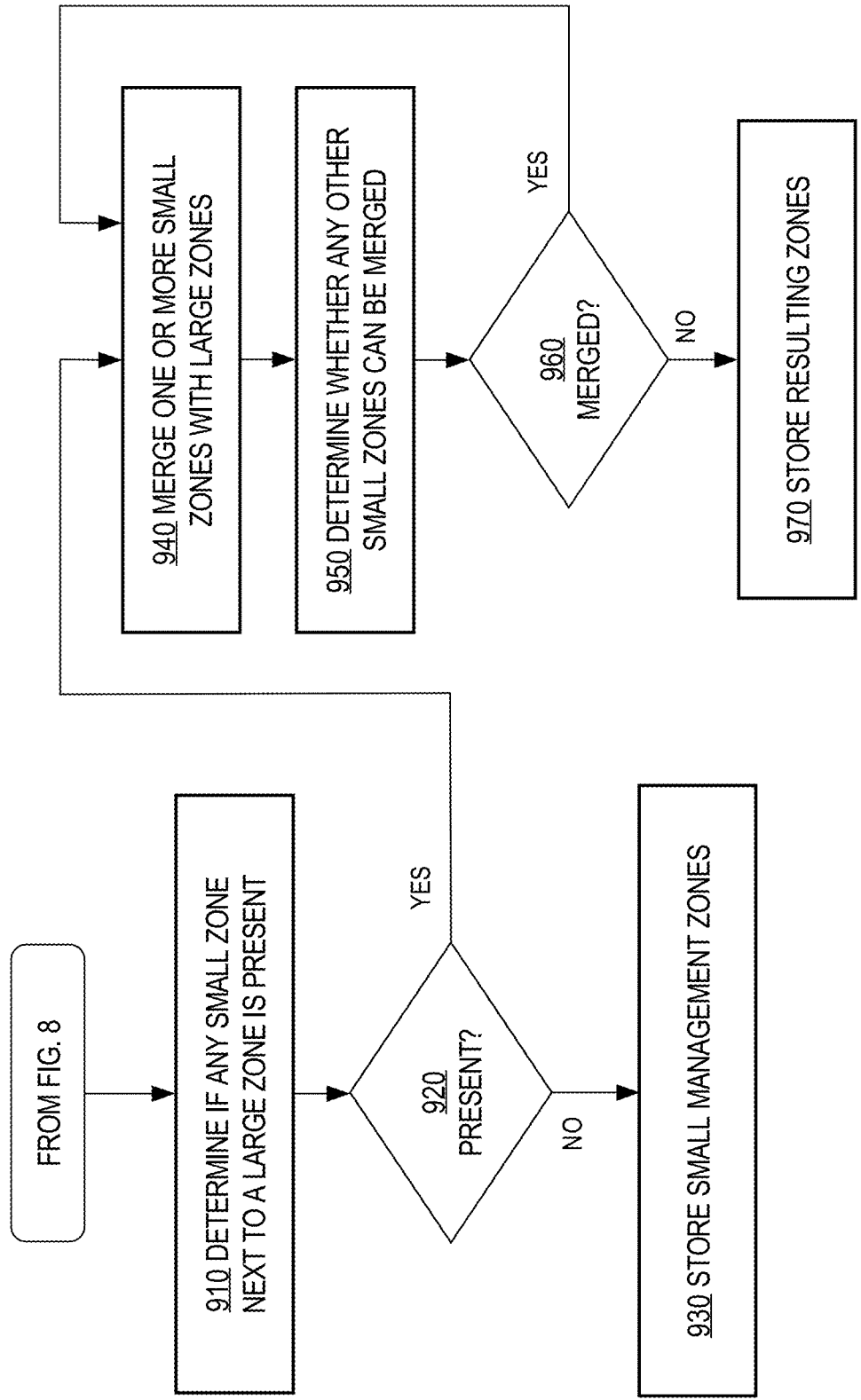
FIG. 9 depicts a method for post-processing of management zones.

In step 830, a test is performed to determine whether a count of management classes is to be changed. If the count is to be changed, then step 840 is performed. Otherwise, steps described in FIG. 9 are performed.

In step 890, a second count value for a count of management classes from among a plurality of management classes is determined, and steps 870-880 are repeated for the second count value.

3.4.5. Post-Processing

In an embodiment, a set of management zones is post-processed. For example, small isolated zones may be merged with other zones to make sure all zones are spatially contiguous and have reasonable sizes. Post-processing may also be performed to remove small fragmented zones. Even with spatial smoothing of the yield maps during the yield data preprocessing phase, the set of management zones may include small fragmented zones that may be difficult to manage individually.

In an embodiment, a test is performed to determine whether a size of a zone is smaller than a user-defined threshold. If the size of the zone is smaller than the threshold, then the zone is merged with its most similar neighboring large zone that is larger than the small zone. The zone/class label of the large zone may be assigned to the merged zone.

If the class labels are obtained from the K-means approach or the fuzzy C-means approach, then two additional steps may be performed. For example, a set of zones may be constructed based on the class labels and the spatial location of pixels so that the size and neighboring zones of each management zone may be identified. Then, the class labels may be recovered from the constructed set, and the additional zone merges may be performed.

FIG. 9 depicts a method for management zones post-processing. In step 910, a test is performed to determine if any small zone is present next to a large zone in a set of management zones.

If in step 920 it is determined that no small zone next to a large zone is present in a set of management zones, then in step 930, the set of management zones is stored. The set of management zones may be stored in a storage device, a memory unit, a cloud storage service, or any other storage device. The set of management zones may be used to determine seeding recommendations for growers, for research purposes, and for providing information to other agencies.

However, if in step 920 it is determined that at least one small zone is present next to a large zone in a set of management zones, then the small zones are merged with their respective large zones.

Merging of the zones may be performed for each identified small zone, as indicated in steps 950-960. Once all identified small zones are merged with their respective large zones, the resulting set of merged management zones is stored in step 970. The set of merged management zones may be stored in a storage device, a memory unit, a cloud storage service, or any other storage device. The set of management zones may be used to determine seeding recommendations for growers, for research purposes, and for providing information to other agencies.

3.5. Performance Considerations

Accuracy of delineating management zones in an agricultural field can be increased with additional data. For example, assuming that the quality of the yield maps is comparable from year to year, the quality and accuracy of the approach increases proportionally to the number of yield maps from different years provided to the system. Hence, for a given field, the more years of yield maps are provided, the higher the quality and accuracy of management zone delineation may be.

4. Usefulness of Management Zone Delineation

Using the techniques described herein, a computer can determine a plurality of management zones based on digital data representing historical yields harvested from an agricultural field. The techniques can enable computers to determine the contiguous regions that have similar limiting factors influencing the harvested yields of crops. The presented techniques can also enable the agricultural intelligence computing system to automatically generate recommendations for crop growers with respect to seeding, irrigation, applying fertilizers, and/or harvesting.

Presented techniques can enable the agricultural intelligence computing system to save computational resources, such as data storage, computing power, and computer memory of the system, by implementing a programmable pipeline configured to automatically determine management zones for a field based on digital data. The programmable pipeline can automatically generate recommendations and alerts for farmers, insurance companies, and researchers, thereby allowing for a more effective agricultural management in the seeding schedules, operations of agricultural equipment, and application of chemicals to fields, protection of crops and other tangible steps in the management of agricultural field. Management zones created based on historical yield data may be particularly useful in certain agricultural practices, such as selecting a seeding rate. For example, information about the created management zones may be used to generate recommendations for crop growers. The recommendations may pertain to seed and seeding selections. Selecting a recommended seeding rate based on the identified management zones may be very helpful in increasing harvested yields.

5. Example Application for Delineating Management Zones and Generating Recommendations The management zone delineation approach described herein may be widely implemented in a variety of agricultural applications. For example, the approach may be integrated with computer-based tools that a grower may use to optimize his agronomic practices. The approach may be implemented in an application that generates a graphical user interface for a user, and displays recommendations and strategy options to the grower.

In an embodiment, a process of delineating management zones for an agricultural field is implemented in an interactive computer-based tool. The tool may provide a user with the interactivity in terms of providing functionalities for selecting an agricultural field, requesting and receiving graphical representations of management zones delineated for the field, requesting and receiving recommendations for agronomic practices for the management zones, and modifying the obtained recommendations.

A management zone delineation tool may be implemented as a graphical user interface that is configured to receive from a user a selection of an agricultural field and execute a management zone delineation algorithm based on the received input. The graphical user interface may be configured to generate graphical representations of the delineated zones, display the generated graphical representations of the zones, and generate recommendation options.

In an embodiment, a management zone delineation application is configured to allow growers to create manual scripts that contain settings and parameters to specify details for delineating management zones. The application may also provide a set of predefined script scenarios and made the set available to the grower. The scenarios may include a scenario that provides information about for example, predicted yield that may be obtained if the grower does not change their current agronomic practice. Another scenario may provide recommendations for achieving the best economic results. Other scenario may provide recommendations for achieving maximum yield from the field. These example scenarios may allow a grower to compare different agronomic practices in reference to the field, compare yield results if different practices are applied, and ultimately choose the recommendations or scenario that matches the grower's goals the best. An example of an application implementing the management zone delineation and recommendation generator is the Script Creator from The Climate Corporation.

5.1. Example Uses and Operations

In an embodiment, an application is configured to allow a grower to quickly and easily generate scripts for obtaining recommendations for the zones that have been delineated for the grower's field. A script, or a prescription, is a set of recommendations generated by the application for a grower. A script may be generated based on input provided by a user and including a set of settings that the application may use to delineate management zones and generate the recommendations. The settings may include values for a count of management zones to be delineated, a seed identifier of the seeds to be sown, expected yield, a seeding range, and the like.

In an embodiment, a zone management delineation and recommendations application is configured to generate one or more personalized scripts for a particular agricultural field. The scripts may reflect goals and risk tolerance specified by a grower.

Figure 10:
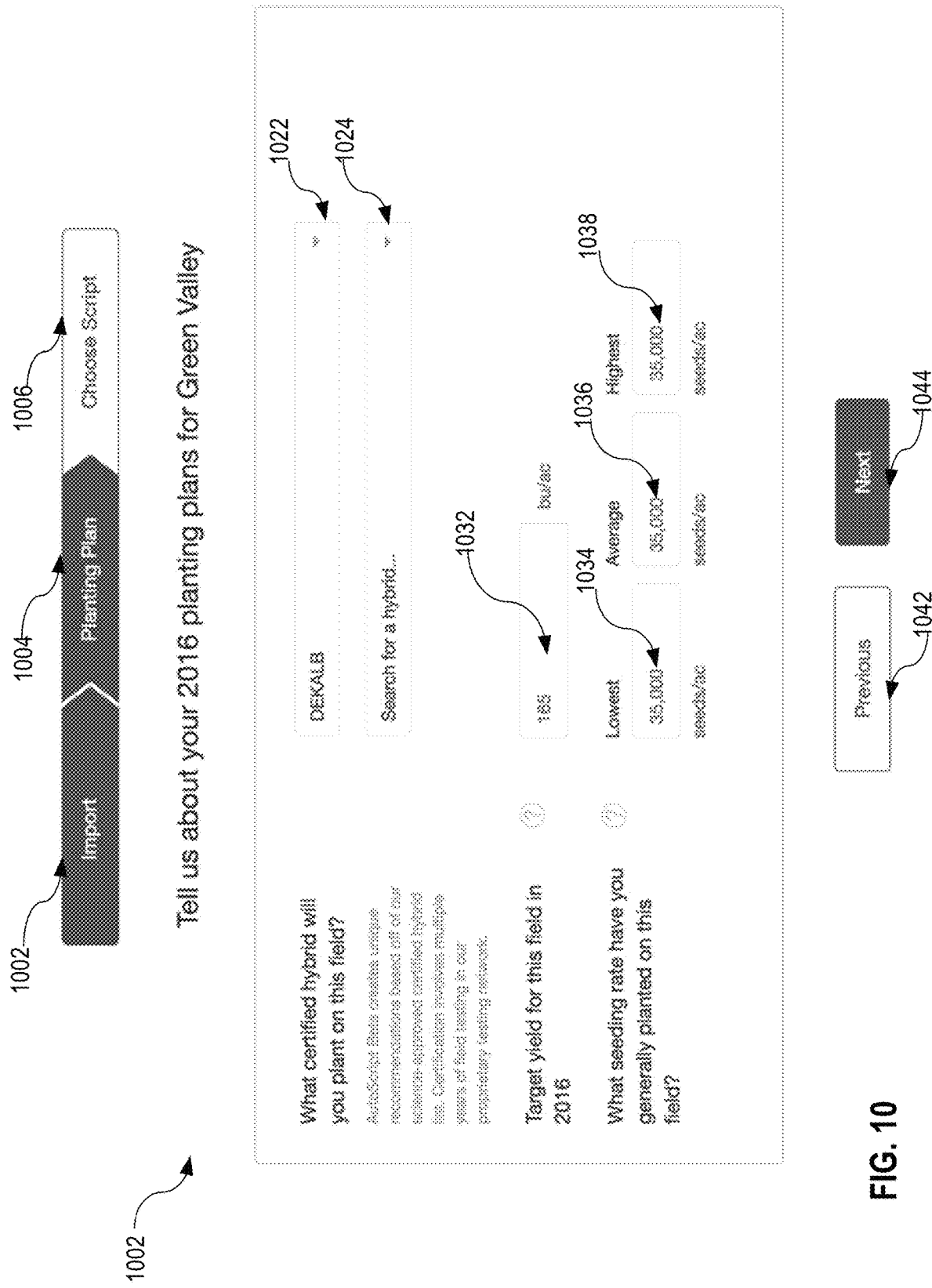
FIG. 10 is a screen snapshot of an example graphical user interface configured to delineate management zones and generate agronomic practice recommendations.

FIG. 10 is a screen snapshot of an example graphical user interface configured to delineate management zones and generate agronomic practice recommendations. The example screen snapshot 1000 may be generated by executing instructions that provide interactivity between a user and the application. A typical user of the application is a grower who cultivates an agricultural field. Executing the instructions may allow a grower to import 1002 certain information about an agricultural field to the application. Executing the instructions may also allow a grower to request 1004 an interactive tool that would allow the grower to define and display one or more planting plans for an agricultural field of the grower. Executing the instruction may also cause generating and displaying one or more scripts for an agricultural field, allowing a grower to select one or more scripts from the displayed scripts, and displaying the selected recommendations for the grower.

In an embodiment, the application may be configured to allow a grower to import the soil information to the application and link the imported information with the delineated zones. The application may further be configured to retrieve and use management zones information from for example, the SSURGO maps, zones delineation generated by a grower in the past, old prescription, and any type of information that the grower used in the past to delineate management zones. For example, a grower may be prompted to provide information about the type of seeds he plans to sow on his field. To facilitate entering the information, a pull-up menu 1022 may be provided to allow the grower to make the selection.

A grower may also be presented with a pull-up menu 1024 that allows the grower to view various types of seeds, including hybrids and the like. Furthermore, a grower may be presented with a text field for entering for example, a target yield amount 1032 expected from in a given year, a lowest seeding rate 1034 usually planted in the field, an average seeding rate 1036 usually planted in the field, and a highest seeding rate usually planted in the field.

The application may also allow a grower to navigate through a data entering screens. For example, the application may be configured to allow a grower to go back 1042 to a screen with the previously entered information, or to go forward 1044 and enter additional information. The application may also be configured to allow a grower to reset the previously provided settings and information.

5.2. Example Workflow

Figure 11:
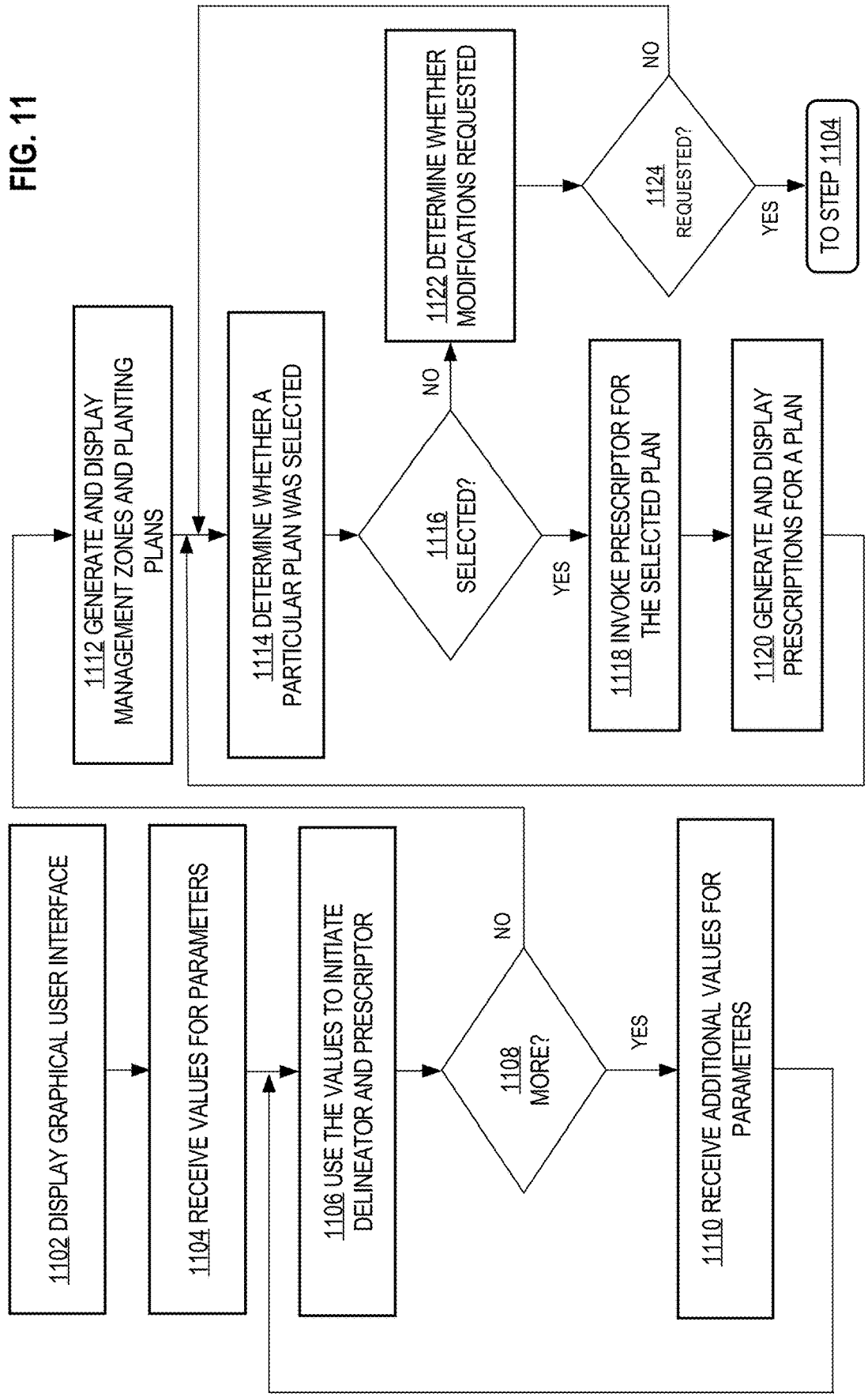
FIG. 11 depicts an example method for delineating management zones and generating prescriptions.

FIG. 11 depicts an example method for delineating management zones and generating prescriptions. The example method may be implemented in an application executed on any type of computer device, such as a laptop, a smartphone, a tablet, a PDA, or others.

In an embodiment, an application includes instructions for a graphical user interface generator, a delineator, and a prescriptor. The graphical user interface generator may be configured to generate a graphical user interface (GUI) and display the GUI on a display of a computer device. The GUI generator may also be configured to receive input from a user, and display results generated by the delineator and the prescriptor.

A delineator may be configured to generate management zones for an agricultural field and based on data provided by a user.

A prescriptor may be configured to generate prescriptions for agricultural practices and recommendations designed to achieve goals set forth by a user for the user's agricultural field.

In step 1102, a GUI is generated and displayed on a display of a computer device of a grower. An example GUI is depicted in FIG. 10. The GUI may be implemented as a webpage of a website which the grower may access via the Internet. The webpage may include various interactive buttons, icons and pull-up menus for providing data to the application configured to execute the method for delineating management zones and generating prescriptions. The grower may use the interactive buttons, icons and menus to provide values of parameters to be used by the delineator and the prescriptor.

In step 1104, values for one or more parameters for a delineator and a prescriptor are received via a GUI from a grower. The provided values may specify an agricultural field for which delineation of management zones is requested. The values may also specify the grower's objectives in terms of expected profits, amounts and types of seeds for the field, the seeding rates, and the like. Examples of the parameters are described in FIG. 10.

In step 1106, values received via a GUI are used to initiate a delineator that is configured to generate a plurality of management zones based on, at least in part, the values provided by a grower.

In step 1108, a test is performed to determine whether a grower tries to provide any additional values for one or more parameters for a delineator and/or a prescriptor. For example, the grower might provide some additional values for additional parameters, or modify the already provided values. Furthermore, the grower may request resetting the values to default values provided by the application, or may import the values from the grower's files, publicly available databases, the grower's previous configurations, and the like.

If it is determined that a grower is trying to provide additional values for parameters for a delineator and/or a prescriptor, then in step 1110, the additional values for the parameters are received via a GUI, and step 1106 is performed.

However, if it is determined that no additional values are provided, then in step 1112, a plurality of delineated management zones is generated and a plurality of planting plans is generated. A delineator may determine the management zones based on, at least in part, values provided for example, by a grower via a GUI. The planting plans may be generated by a prescriptor based on, at least in part, the values provided by the grower. The planting plans may be customized for the individual management zones and based on the goals and objectives specified by a grower. Examples of delineated management zones and planting plans are described in FIG. 12.

Figure 12:
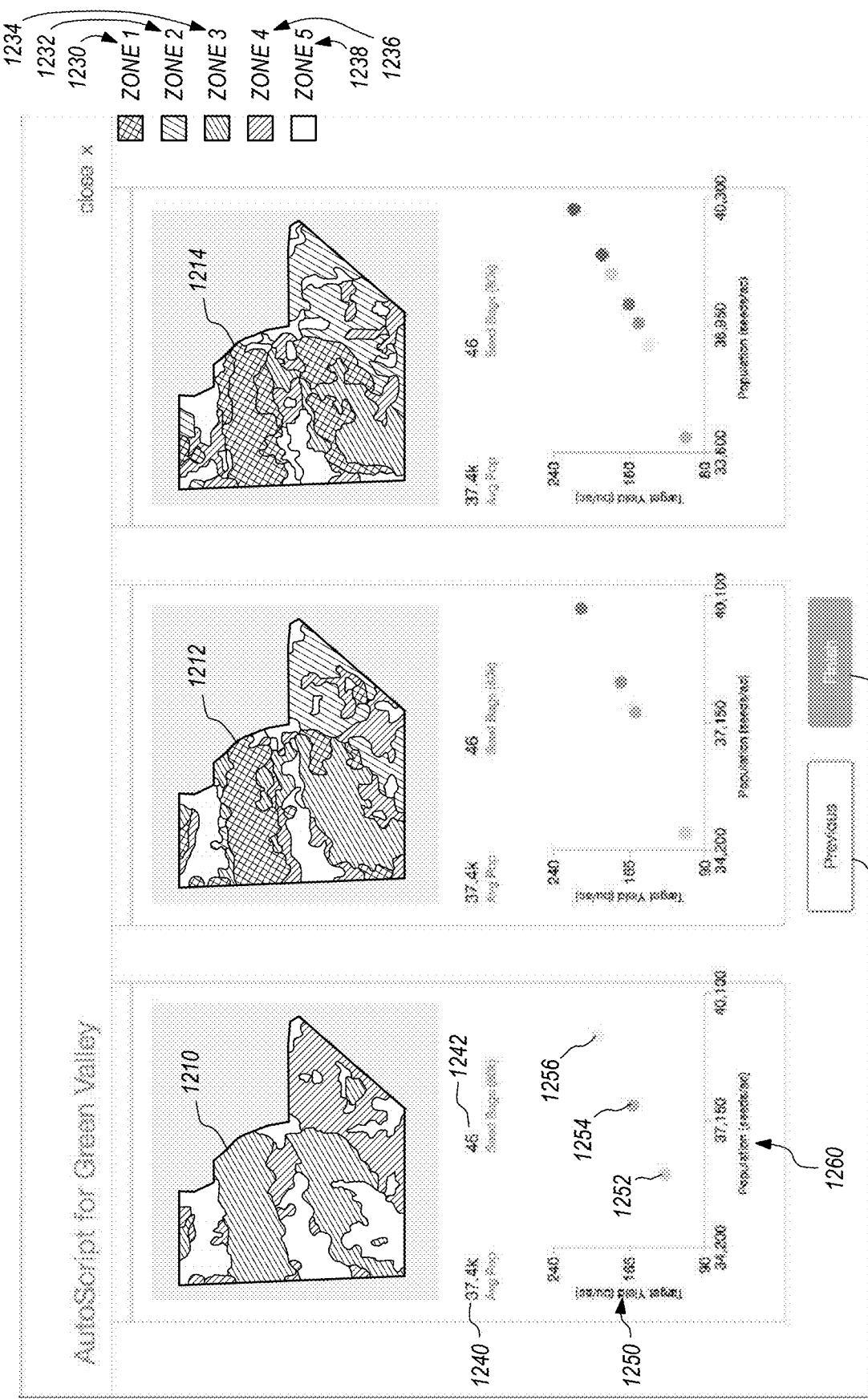
FIG. 12 is a screen snapshot of an example graphical user interface configured to display examples of management zones and examples of planting plans.

FIG. 12 is a screen snapshot of an example GUI configured to display examples of management zones and examples of planting plans. The example interface shows three examples of management zones delineated for a particular agricultural field; however, the approach is not limited to displaying three examples. The approach may allow specifying one or more ways for dividing a particular field into management zones. For example, a user may specify that he would like to see the best two ways of dividing the particular field into zones. The user may also specify that he would like to see the best three ways, or the best four ways, of dividing the field into zones, and so forth.

The examples depicted in FIG. 12 include a first set of management zones 1210, a second set of management zones 1212, and a third set of management zones 1214. First set of management zones 1210 includes zone 2 (element 1232), zone 3 (element 1234), zone 4 (element 1236), and zone 5 (element 1238). Second set of management zones 1212 includes zone 1 (element 1230) zone 2 (element 1232), zone 3 (element 1234), zone 4 (element 1236), and zone 5 (element 1238). Third set of management zones 1214 includes zone 1 (element 1230) zone 2 (element 1232), zone 3 (element 1234), zone 4 (element 1236), and zone 5 (element 1238). The zones are graphically represented using different shadings or colors. Distribution and count of the zones for other fields may be different than that depicted in FIG. 12.

In addition to a graphical representations of delineated management zones, planting plans and/or expected yields for each management zones arrangement may be provided. The additional information may indicate a relationship between a particular planting approach and expected yield. For example, for first set of management zones 1210, additional information may include an average seed population 1240, a count of bags of seeds 1242, and a relationship between the seed population and the expected yield. The relationship may be represented using a two-dimensional graph; although other ways of representing the relationship may also be employed. The graph depicted in FIG. 12 includes a horizontal axis 1260 labelled as a seed population, and a vertical axis 1250 labelled as a target yield. The data points obtained for various values of the seed populations are depicted as a first data point 1252, a second data point 1254, and a third data point 1256. Other ways of depicting the data points for the relation between the seed populations and yields may also be implemented.

A grower may analyze data displayed in FIG. 12 to compare the three different ways of delineating management zones, and compare the expected yields generated for the different management zones. Furthermore, the grower may for example, decide to adjust some of the initial values. To do so, the grower may select an icon 1270 that is labelled as "Previous," provide additional values for parameters, and modify some of the already provided values.

A grower may also select a set from the three sets 1210, 1212, 1214, and request an agricultural prescription that would allow achieving the goals indicated by the selected set.

A selection of a particular delineated management set, from a plurality of available delineated management sets, may be performed in many ways. One way is depicted in FIG. 13.

Figure 13:
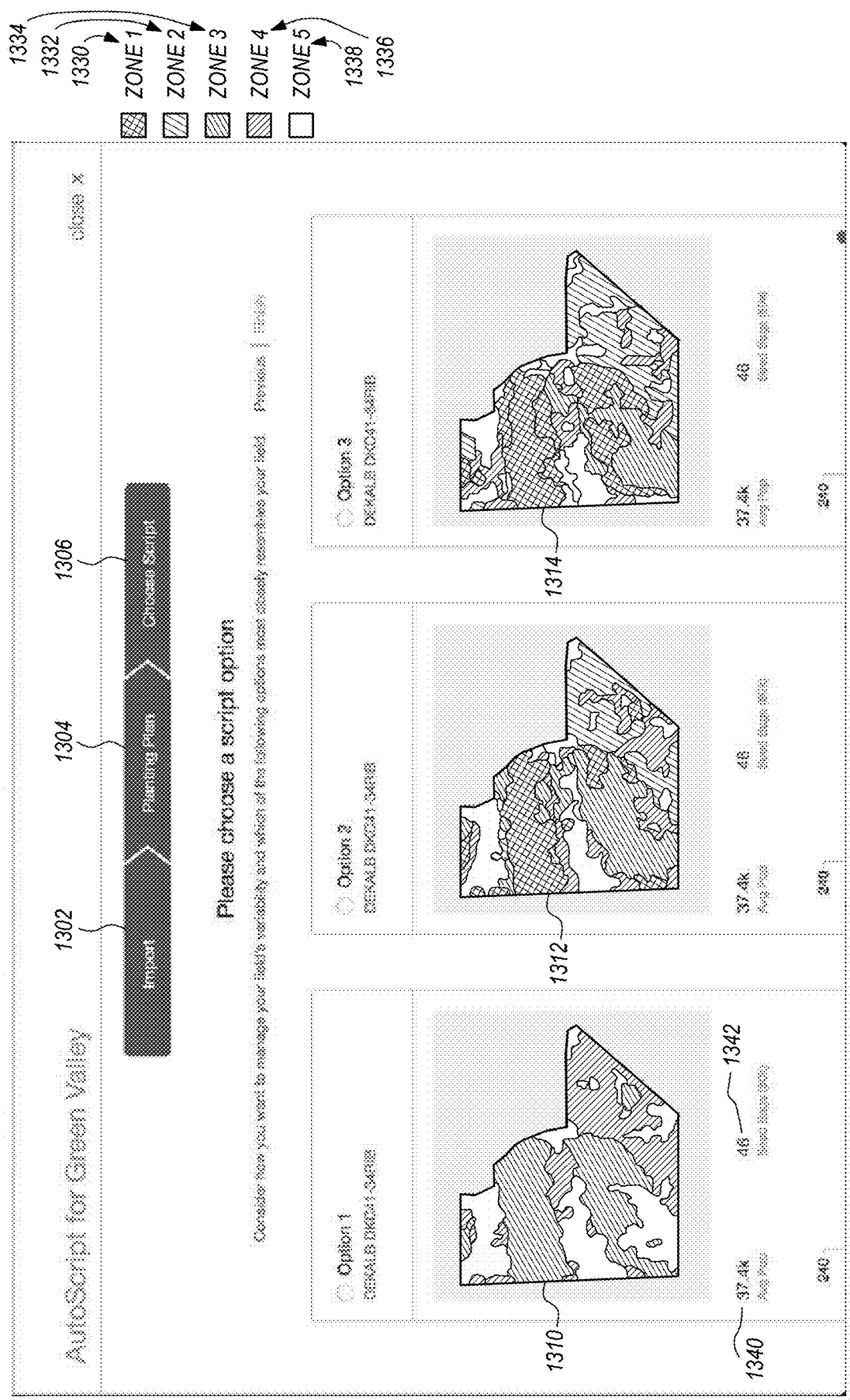
FIG. 13 is a screen snapshot of an example graphical user interface configured to enable requesting a prescription for a selected planting plan.

FIG. 13 is a screen snapshot of an example GUI configured to request a prescription for a selected planting plan. The example interface shows three examples of management zones delineated for a particular agricultural field. However, the approach is not limited to displaying three examples. The displayed sets correspond to three different ways, or options, of delineating management zones for the same field. For each option, some additional information may be provided.

Three examples depicted in FIG. 13 include a first set of management zones 1310, a second set of management zones 1312, and a third set of management zones 1314. First set of management zones 1310 includes zone 2 (element 1332), zone 3 (element 1334), zone 4 (element 1336), and zone 5 (element 1338). Second set of management zones 1312 includes zone 1 (element 1330) zone 2 (element 1332), zone 3 (element 1334), zone 4 (element 1336), and zone 5 (element 1338). Third set of management zones 1314 includes zone 1 (element 1330) zone 2 (element 1332), zone 3 (element 1334), zone 4 (element 1336), and zone 5 (element 1338). The zones are graphically represented using different shadings or colors. Each set of delineated management zones may include additional information. For example, the additional information for first set of management zones 1210 may include an average seed population 1340, and a count of bags of seeds 1342.

In an embodiment, a GUI may include buttons, radio buttons, icons or other types of selectors for selecting an option from the options displayed on the interface. In the example depicted in FIG. 13, the GUI includes buttons labelled as "option 1," "option 2," and "option 3." A grower may select any of the option buttons to select the option, and therefore indicate a particular set of delineated management zones for which the grower is requested an agronomic prescription.

Referring again to FIG. 11, in step 1114, a test is performed to determine whether any of a plurality of management zones options has been selected by a grower. If in step 1116 it is determined that a particular set of delineated management zones is selected, then step 1118 is performed. Otherwise, step 1122 is performed.

In step 1118, a prescriptor is invoked to generate a prescription for a selected management zone option. In an embodiment, a prescription corresponds to a planting plan and indicates recommendations for achieving certain goals. In this step, the prescriptor may generate one or more prescriptions for the grower. The prescriptions may provide recommendations for achieving different goals.

In an embodiment, the zone management delineation and recommendations application is configured to generate one or more personalized scripts for a particular agricultural field. The scripts may reflect goals and risk tolerance specified by a grower. The application may also generate recommendations based on two or more scripts, and thus allow a grower to compare the impact of different goals on the grower's script, and select the recommendations that suit the grower the best.

In an embodiment, the zone management delineation and recommendations application is configured to allow a grower to generate a script that maximizes the Return on Investment (ROI) that the grower might receive based on profits generated from his field. The application may also allow a grower to determine recommendations for a seeding population for maximizing the profits. The recommendations may also take into account the costs and risks related to potential yield increases. The application may also allow a grower to enter an expected seed price in terms of dollars per thousand count of seeds, or in terms of dollars per a bag of seeds.

Furthermore, a grower may specify his expected market price in terms of dollars per bushel. He may also request generating a script that maximizes yield that may be obtained if a given hybrid of seeds is planted on the grower's field. The grower may also request creating a script that represents his existing business practices.

Referring again to FIG. 11, in step 1120, one or more prescriptions are generated and displayed for a grower. The prescriptions may be displayed using a GUI. The prescriptions may be displayed in such a way that the grower may compare across the displayed prescription, and clearly see the differences between the scripts. The comparison may include information about a seed population range, a target yield range, a total count of bags of seed, and a population map with legend information. Examples of different prescriptions are depicted in FIG. 14.

Figure 14:
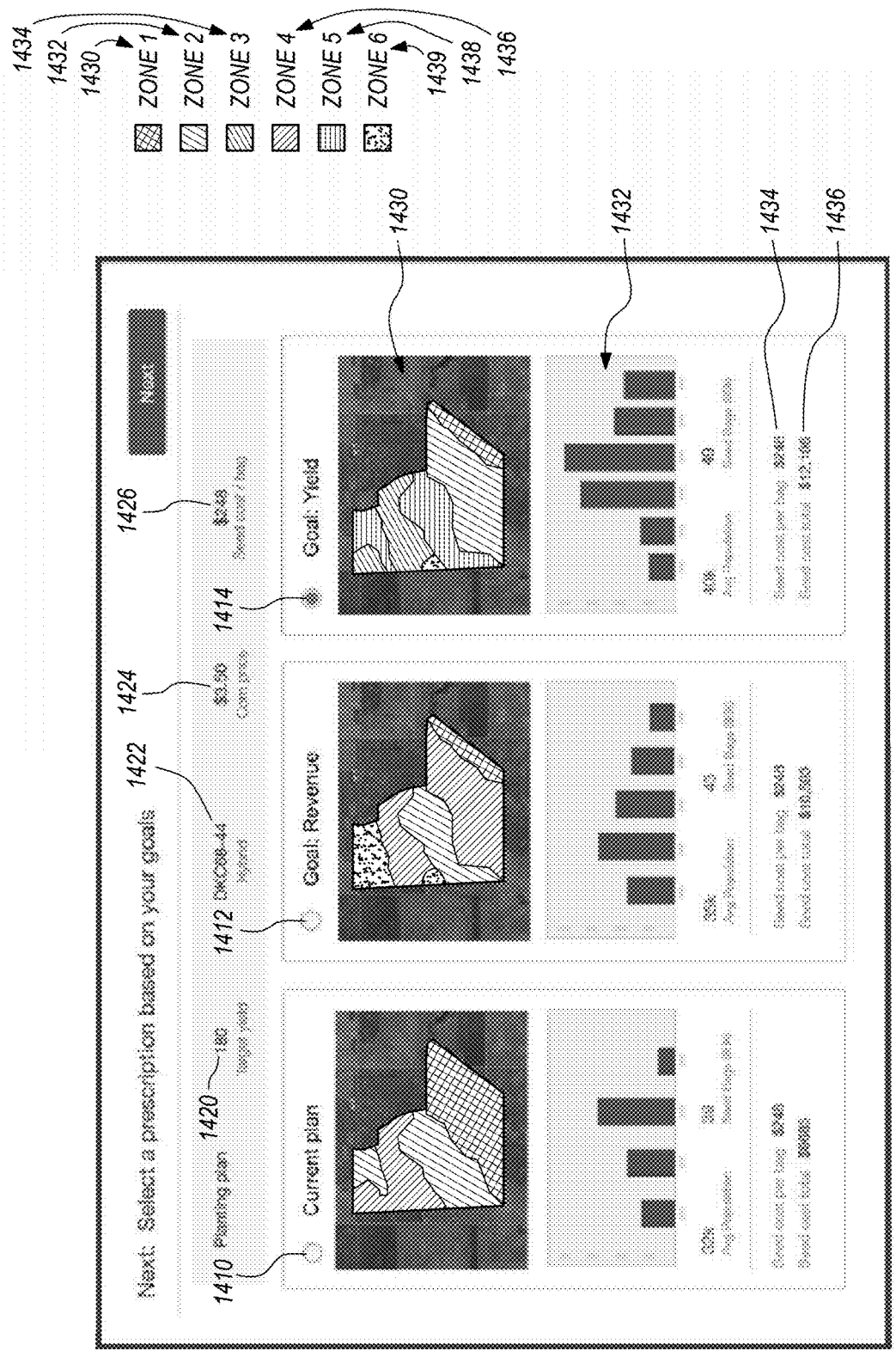
FIG. 14 is a screen snapshot of an example graphical user interface configured to display examples of management zones and examples of planting plans.

FIG. 14 is a screen snapshot of an example GUI configured to display examples of management zones and examples of planting plans. The example interface shows three examples of management zone sets delineated for a particular agricultural field. However, the approach is not limited to displaying just three examples. The displayed sets correspond to three different ways, or options, of delineating management zones for the same field. For each option, some additional information may be provided. The additional information may include planting plans or recommendations for achieving certain agricultural goals.

Three examples depicted in FIG. 14 include three options for delineating a particular agricultural field. Any of the options may be selected using for example a selection or radio button. For example, a first set of management zones may be selected by pointing to a button 1410, a second set of management zones may be selected by pointing to a button 1412, and a third set of management zones may be selected by pointing to a button 1414. The first set of management zones includes zone 2 (element 1432), zone 3 (element 1434), zone 4 (element 1436), and zone 5 (element 1438). The second set of management zones includes zone 1 (element 1430) zone 2 (element 1432), zone 3 (element 1434), zone 4 (element 1436), and zone 5 (element 1438). The third set of management zones includes zone 1 (element 1430) zone 2 (element 1432), zone 3 (element 1434), zone 4 (element 1436), and zone 5 (element 1438). The zones may be graphically represented using different shadings or colors.

Each of the management zone sets may be selected for a user based on certain criteria. For example, the first set may be selected for the user based on the information corresponding to the current agricultural practice. Therefore, this plan may be referred to as a current plan. The second set may be selected to provide the user with a planting plan to maximize the revenue and recommendations to allow the user to reach a revenue maximizing goal. The third set may be selected to provide the user with a planting plan to maximize the yield and to provide the planting plan to allow the user to reach a yield maximizing goal.

In an embodiment, a user may select one of management zones sets displayed in a GUI. In the example depicted in FIG. 14, a user selected a third set by pointing to a radio-type button 1414 displayed next to the third set. In response to receiving the particular selection, the GUI may display additional information, including recommendations for the user to help the user to achieve a certain goal. Additional information may also include data representing expected yield, cost and revenue. Furthermore, the additional information for the third set of management zones 1414 may include information about a target yield 1420, a type of hybrid seed selection 1422, an expected process of corn 1424, a seed cost per bag 1426, a seed cost per bag 1434 and a seed cost total 1436.

Referring again to FIG. 11, in step 1122, a test is performed to determine whether a grower requested any modification of values used by a delineator and/or prescriptor. If in step 1124, it is determined that no modification to the values of one or more parameters have been requested, then step 1114 is performed. However, if it is determined that some modifications are requested, then step 1104 is performed.

5.3. Example of Auto Scripting

A zone management delineation and recommendations application may be configured to provide an autoscript option. An autoscript option is a functionality of the application that allows the user to request a prescription for the agricultural practice. For example, the application may be configured to allow the user to modify the parameters used by the application and request that the application generate a management zone delineation map and recommendations. The application may also be configured to allow the user to fine tune prescriptions generated by the application.

In an embodiment, the zone management delineation and recommendations application is configured to allow a grower to use an autoscript option. An autoscript option allows the grower to request that at least the best three prescriptions be generated for the grower automatically. Furthermore, the grower may request that the autoscript option be selected for the grower each time the grower is using the application.

Furthermore, a grower may select a particular source of data to be used by the application. For example, a grower may trust the SSURGO soil map more than his yield data. Therefore, the grower may be able to indicate that the data from the SSURGO soil map be used to fill in each field when an autoscript option is invoked.

In an embodiment, the zone management delineation and recommendations application is configured to allow a grower to exclude certain years of yield data from the calculation, provided that a sufficient amount of data from other years is available to perform the calculations.

Furthermore, the application may be configured to allow a grower to include customized population recommendations for a specific type of seeds or crops. For example, the application may be configured to include customized population recommendations for a set of certified Monsanto hybrids. Monsanto hybrids refer to all hybrids which have been subjected to GENV testing and for which data models exist for generating the recommendations. Examples of Monsanto hybrids include the brands such as Dekalb, Channel, Regional Brands, and products from Agreliant and Croplan.

5.4. Example of Manual Scripting

A zone management delineation and recommendations application may be configured to provide a manual scripting option. A manual scripting option is a functionality of the application that allows customizing the parameters used by the application. Customization may include a manual fine tuning of a count class, management zone delineation options, and prescriptions. For example, the application may be configured to allow the user to modify the parameters used by the application and fine tune the delineation options and recommendations.

Figure 15:
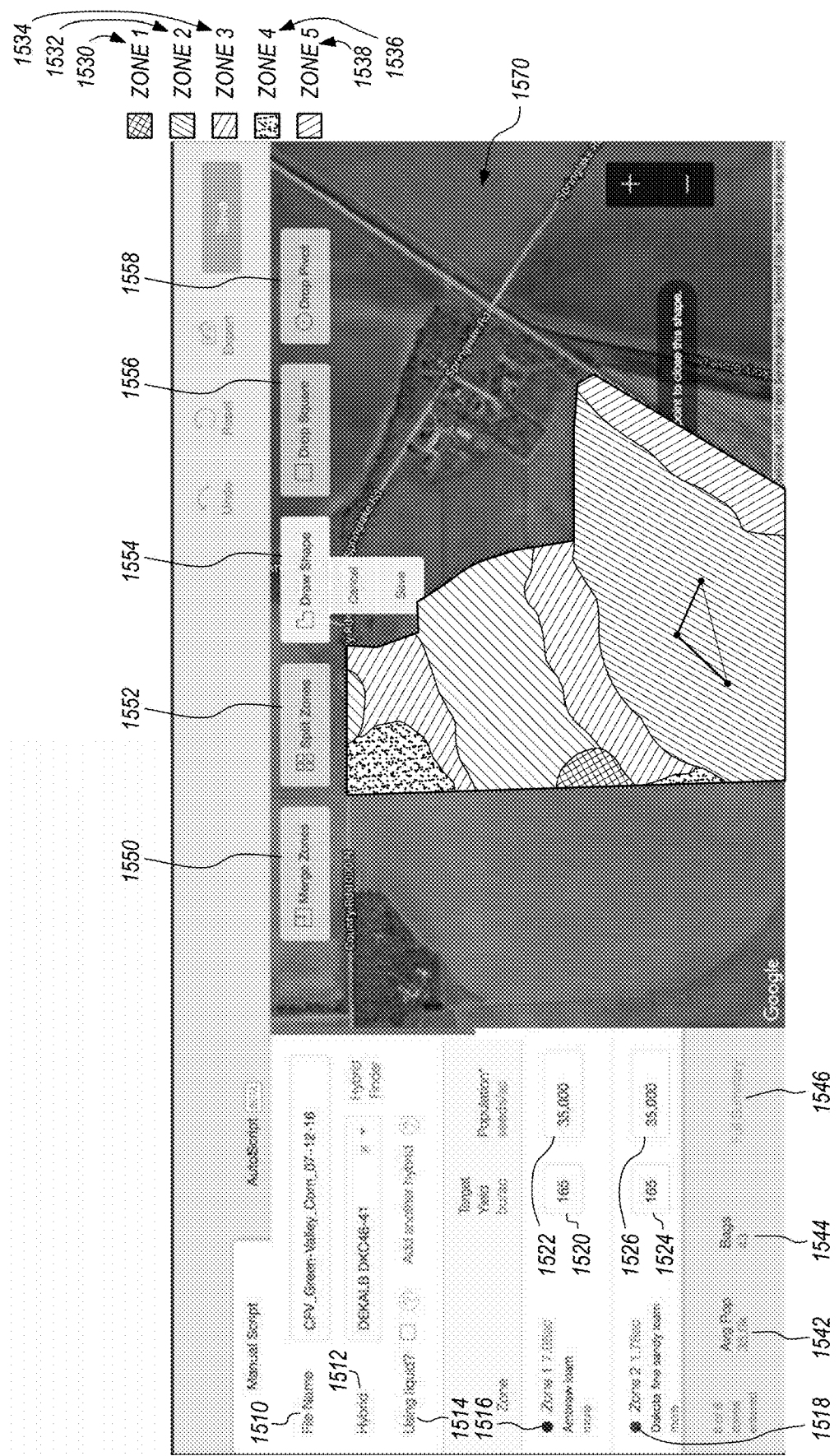
FIG. 15 is a screen snapshot of an example graphical user interface configured to allow a user to customize planting plan.

FIG. 15 is a screen snapshot of an example graphical user interface configured to allow a user to customize planting plans. It is assumed here that a user has already selected a particular management zone delineation option 1570. The delineation option 1570 depicts a particular agricultural field divided into a set of management zones. The set includes a zone 1 labelled as 1530, a zone 2 labelled as 1532, a zone 3 labelled as 1532, a zone 4 labelled as 1536 and a zone 5 labelled as 1538.

In an embodiment, a zone management delineation and recommendations application is configured to provide functionalities that allow a user to merge zones. To merge the zones, a user may select a "merge zones" button 1550. To split the zones, a user may select a 'split zones" button 1552. To draw/save/cancel a shape within a management zones set, a user may select a "draw shape" button 1554. To drop a square, a user may select a "drop square" option 1556. To drop a pivot, a user may select an option "drop pivot" 1558. Other options may also be implemented by the zone management delineation and recommendations application.

In an embodiment, a zone management delineation and recommendations application is configured to allow a user to manually generate a script. An example of the process for a manual generation of a script is depicted in FIG. 15. The process may be facilitated using a GUI.

Using the functionalities of a GUI, a user may indicate the name of the data file that the user wants to import to the application. For example, the user may provide a name 1510 of the data file containing the yield data. Furthermore, the user may indicate the type 1512 of seeds to be used. Moreover, the user may indicate whether any liquid 1514 is to be used, and which zones 1516, 1518 are to be used. The user may also type in the expected target yield 1520 and the expected seed population 1522 for one of the zones, and the expected target yield 1524 and the expected seed population 1524 for another zone, and so forth. In response to receiving the user's input, the application may be generate a prescription for the user. The information may be displayed if a user selects for example, a summary icon 1546. Additional information, such as an average seed population 1542 and a count of bags with seeds 1544 may also be displayed in a GUI for a user.

6. Interpolating Between Recommendations

Recommendations for agricultural practices, including variable-rate seeding recommendations, may be generated using different data models. Example data models include yield-based models and economics-based models. Due to differences between the data models, the objectives as well as the recommendations generated using the different models may vary.

In an embodiment, a yield-based model is programmed to optimize yield values and uses digitally stored values for at least a seed hybrid, target yield, and data from which historical yield can be inferred. The recommendations generated based on the yield-based model include the recommended seeding rate for the given target yield, and are referred to herein as yield-based recommendations.

In an embodiment, an economics-based model is programmed to optimize economic benefit and assumes that digitally stored values for at least a seed price, a commodity price, a seed hybrid, target yield, and data from which historical yield can be inferred. The recommendations generated based on the economics-based model include the recommended seeding rate, the estimated yield, and the estimated economic benefit ("profit"), and are referred to as economic-based recommendations.

Seeding-rate decisions depend on a variety of factors, not all of which are captured in the models. Moreover, the models are designed to optimize different things. Accordingly, sometimes the recommendations of each of the models individually are different from what a grower would like to use based on external factors. The embodiments herein enable a grower to blend the model recommendations to better achieve the grower's goals.

In an embodiment, a computer-implemented process is provided for generating new recommendations by interpolating between the recommendations generated for at least two data models. The term "interpolating" is used herein to indicate that new recommendations are determined by applying one or more mathematical formulas to the recommendations generated for at least two data models. However, the term is not limited to an application of any particular type of mathematical or interpolation formula. Therefore, the process disclosed herein is not limited to linear interpolation, bi-cubic interpolation, spline interpolation, and so forth.

Embodiments may be implemented using programmed computers that generate a GUI, such as the GUI described further herein in connection with FIG. 12, FIG. 13, FIG. 14, FIG. 15, or as an extension to the GUI of FIG. 12-15. The process may be implemented as a standalone tool or as a part of another computer-based tool. The process may include interactive features that allow a user to interactively adjust the data models, the recommendations, values of the interpolation parameters, and the manner in which the new recommendations are generated.

6.1. Interpolating Between Two Sets of Recommendations

Figure 16:
FIG. 16 is a screen snapshot of an example graphical user interface configured to enable requesting a prescription for an agricultural field.

In an embodiment, a computer-implemented process is provided for generating new recommendations by interpolating between the recommendations generated based on at least two data models In an embodiment, a programmed process may be initiated in response to computer input requesting a planting prescription. FIG. 16 is an example screen display showing an example GUI that is configured to enable requesting a prescription for an agricultural field. In the example, a GUI 1608 is displayed on a display device under program control and may include a map 1610 of an agricultural field, and one or more controls to visually zoom into map 1610 and to zoom out from map 1610. GUI 1608 may also include field identification information 1602 for map 1610 that indicates for example, the field's name, which is "Green Valley" in this example.

GUI 1608 may also include status information 1604 that indicates whether input specified creating a planting prescription for the agricultural field. In the depicted example, status information 1604 indicates that no input has been received to create prescriptions for the field.

GUI 1608 may also include an interactive text box 1606 that provides interactive functionalities for creating new planting prescriptions. In the depicted example, interactive text box 1606 includes a "+" sign that may be selected to create a new prescription. Once interactive text box 1606 or any portion of the text box is selected via computer input, the process may start generating one or more planting prescription.

In an embodiment, the programmed process generates at least two planting prescriptions, and displays the recommendations associated with the prescriptions on a computer display device.

Figure 17:
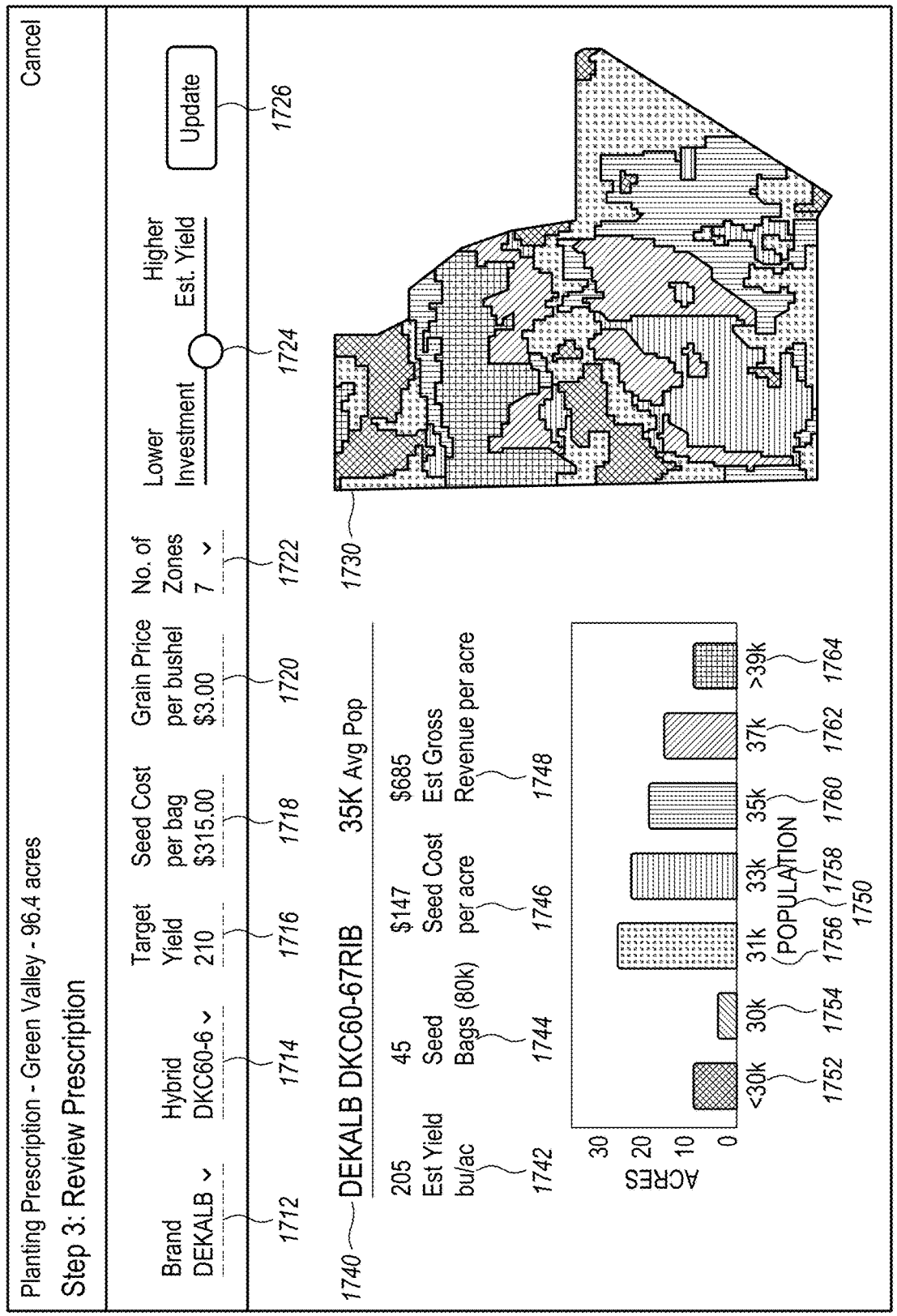
FIG. 17 is a screen snapshot of an example graphical user interface configured to enable interpolating between two types of recommendations.

The recommendations may be displayed in a form of a webpage, a GUI, or other type of graphical representation. An example of the GUI is depicted in FIG. 17, described below. The GUI may also generate and display interactive objects that are programmed to allow computer input to manipulate the recommendations and generate new recommendations based on already generated planting prescriptions.

In an embodiment, an interactive object is a graphical element programmed for example, to receive user inputs, update its own location within a GUI based on the received user input, and be displayed at the new location within the GUI. The interactive functionality of the interactive object may allow the user to select the interactive object and reposition the object along a predetermined path displayed within the GUI. Examples of interactive objects may include sliders, knobs, radial buttons, and any other graphical objects that are programmed to receive user inputs and adjust its location or appearance according to the received inputs.

In an embodiment, an interactive object is implemented as a slider, and is graphically represented as a two dimensional object such as a circle, a triangle, a rectangle or a square. The slider may also be represented as a three dimensional object such as a sphere, a prism, a pyramid, a cone or a cylinder. The slider may be instantiated as having various interactive functionalities. Examples of the functionalities are described in detail below.

FIG. 17 is a screen snapshot of an example GUI configured to enable interpolating between two types of recommendations. The depicted example illustrates one of many possible graphical representations of seeding rate recommendations for an agricultural field. In FIG. 17, the recommendations are generated for the field called Green Valley. The field is graphically represented in FIG. 17 using a graph 1730.

Graph 1730 shows the manner in which an agricultural field was divided into management zones. It shows that the field has been divided into seven zones, and each zones is marked using a unique marking. The count of the zones may be manually selected, or modified, using an interactive button 1722, or automatically selected using a default or recommended value.

The GUI of FIG. 17 may also include an interactive button 1712 for selecting a seed brand, such as the DEKALB brand. The GUI may also include an interactive button 1714 for selecting a seed hybrid, such as the DKC60-6 hybrid.

The GUI may also include an interactive text box 1716 that is programmed to receive a target yield value. There may also be an interactive text box 1718 that is programmed to receive a seed cost per bag, an interactive box 1720 that is programmed to receive a grain price per bushel, and an interactive button 1722 that is programmed to select a count of managing zones to be determined for the field. Interactive buttons 1712, 1714 and 1722, and text boxes 1716, 1718 and 1720 may be operated to enter information and make selections. Alternatively, entering the information and making the selection may be automated using default or recommended data values.

If input selects the DEKALB brand and the DKC60-6 hybrid for seeds, then the GUI may also display detailed information for the selected seed hybrid and brand in an information window 1740 under program control. The depicted example illustrates that for the DEKALB brand and the DKC60-6 seed hybrid, an estimated yield in bushels per acre is 205 (as shown in a text box 1742), a count of seed bags is 45 (as shown in a text box 1744), a seed cost per acre is $147 (as shown in a text box 1746), and an estimated gross revenue per acre is $685 (as shown in a text box 1748). Other types of information may also be provided, and other types of graphical representations of the planting prescription may also be displayed in the GUI.

If a input selects the DEKALB brand and the DKC60-6 hybrid for seeds, then the GUI may also display detailed information in a graph 1750, including the recommended seed population for each zone, under program control. For example, the seed population recommendations for a first zone may be less than 30 k (as shown in a text box 1752), for a second zone may be 30 k (as shown in a text box 1754), for a third zone may be 31 k (as shown in a text box 1756), for a fourth zone may be 33 k (as shown in a text box 1758), for a fifth zone may be 35 k (as shown in a text box 1760), for a sixth zone may be 37 k (as shown in a text box 1762), and for a seventh zone may be less than 39 k (as shown in a text box 1764). The GUI may also provide additional information about the zones. For example, the GUI may provide a size of each zone.

The GUI may also include a slider 1724 and an interactive button 1726. Slider 1724 may be used to manually adjust a relative importance ratio between two already generated planting prescriptions for the purpose of generating new recommendations. The relative importance ratio may be used to indicate the importance of a first set of recommendations and the importance of a second set of recommendations in generating the new recommendation.

Interactive button 1726 may be programmed to provide a request to generate the new recommendations based on the two already generated recommendations and according to the relative importance ratio indicated using slider 1724. Interactive button 1726 may be labelled using for example, a label "Update," as depicted in FIG. 17.

In an embodiment, the GUI may be programmed to accept input to request instructions pertaining to making adjustments to the already generated and displayed recommendations.

It should be understood that the GUI details depicted in FIG. 17 are provided merely to illustrate one of many examples of an applicable GUI, and are not limiting for the presented approach.

Figure 18:
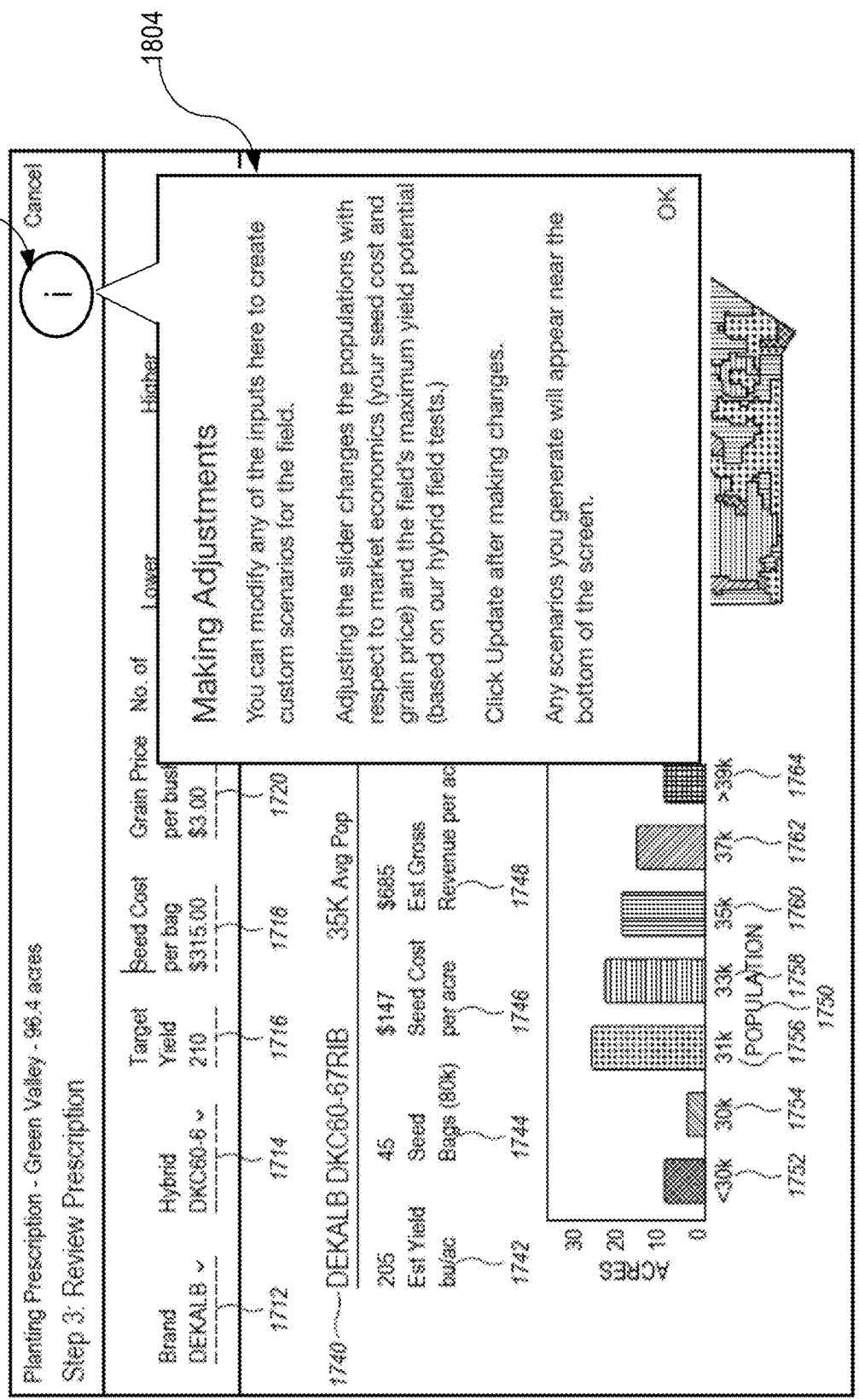
FIG. 18 is a screen snapshot of an example graphical user interface configured to enable interpolating between two types of recommendations.

FIG. 18 is a screen snapshot of an example GUI configured to enable interpolating between two types of recommendations. The GUI of FIG. 18 includes all elements described in FIG. 17, and in addition, includes an interactive information button 1802 which is programmed to request instructions pertaining to making adjustments to the already generated and displayed recommendations.

If a user selects information button 1802, a GUI may display an overlay information window 1804. Information window 1804 may provide helpful hints for making adjustments to the already generated and displayed recommendations, adjustment recommendations, and so forth. The description may also be presented as a webpage or in a separate document.

The description may explain how to modify data models using any of interactive buttons 1712, 1714 and 1722, and/or text boxes 1716, 1718 and 1720. By modifying the data models, input may specify custom scenarios for an agricultural field. For example, input may adjust the seed populations with respect to the market economics, or adjust the maximum yield potential for the field based on different hybrid seed tests.

The description may also include information indicating that upon selecting interactive "Update" button 1726, the system will generate new recommendations based on the current values entered using the GUI and the current position of slider 1724. The description may also include information about a data file in which the newly generated recommendations are stored, and the format in which the newly generated recommendations have been stored.

6.1.1. Interactive Slider

In an embodiment, a process for generating new recommendations includes interpolating between the recommendations already generated based on at least two data models. The interpolation process may be implemented in a GUI, such as the GUI depicted in FIG. 17, or any other interactive computer-based tool. The process may be implemented to provide interactive features that allow interactively adjusting values of the interpolation parameters and interactively modify the way the interpolated recommendations are generated.

Interactive features of the process for generating interpolated recommendations may be implemented in a variety of ways. If the process is implemented in a GUI, then one way to provide the interactive functionalities is to provide interactive GUI elements, such as an interactive programmable graphical slider such as slider 1724 in FIG. 17.

In FIG. 17, slider 1724 is displayed in a GUI as a circle; however, slider 1724 may also be depicted using other graphical shapes, such as a triangle, a rectangle, a bar, and so forth. A user may reposition slider 1724 along a predetermined path, such as a line segment, a continuous set of line segments, or a curve.

A predetermined path along which slider 1724 may be repositioned may have two ends. Each of the ends may graphically represent one of the two already generated planting plans, including a planting plan generated using a yield-based data model and a planting plan generated using an economics-based data model.

In an embodiment, one end of the predetermined path, such as a line segment, may correspond to the recommendations that seem to be low for a given field. In FIG. 17, these recommendations are called lower investment recommendations, and usually correspond to a planting plan generated using an economics-based data model. Another end may correspond to the recommendations that seem to be high for the field. In FIG. 17, these recommendations are called higher estimated yield recommendations, and usually correspond to a planting plan generated using a yield-based data model. The lower investment recommendations and the higher estimated yield recommendations are merely examples of various types of recommendations that may be used here.

A GUI implementing the recommendation interpolation process may be configured to receive input such as selecting slider 1724, repositioning slider 1724, accepting a new location of slider 1724, selecting interactive update button 1726 to request new recommendations, and the like.

Slider 1724 may be selected for example by input that points to slider 1724 using a computer pointer, a computer mouse, or any other selection device. If a touch screen is used, then slider 1724 may be selected in response to touch input on the depiction of slider 1724 on the screen.

In response to selecting slider 1724 the GUI is programmed to modify depiction of slider 1724. Once slider 1724 is selected, the color, the shape or other graphical features of slider 1724 may be changed or modified. For example, once slider 1724 is selected, the color of slider 1724 may be changed for example, from green to red, or the size of slider 1724 may be increased.

In response to selecting slider 1724, the GUI may be programmed to activate interactive functionalities of slider 1724. For example, the GUI may be programmed to allow the user to reposition slider 1724 along a predetermined path displayed in the GUI. Specifically, input pointing to or selecting slider 1724 may cause the GUI to allow the user to reposition slider 1724 by dragging slider 1724 along the predefined path. The predefined path may be a line segment having one end labelled as the lower investment recommendations, and another end labelled as the higher estimated yield recommendations. By repositioning slider 1724 along the line segment, input may adjust the interpolation parameters for generating new recommendations based on the lower investment recommendations and the higher estimated yield recommendations.

A location of slider 1724 with respect to both ends of the line segment may be used to determine a relative importance ratio between two already-generated planting plans for determining a new planting plan, also referred to as new recommendations. For example, if one end corresponds to the lower investment recommendations and another end corresponds to the higher estimated yield recommendations, and slider 1724 is located close to the end labelled as the lower investment recommendations, then in computing the new recommendations, the lower investment recommendations will be weighted more heavily than the higher estimated yield recommendations. On the other hand, if slider 1724 is located close to the end corresponding to the higher estimated yield recommendations, then in computing the new recommendations, the higher estimated yield recommendations will be weighted more heavily then the lower investment recommendations.

In an embodiment, repositioning slider 1724 along a line segment between the lower investment recommendations and the higher estimated yield recommendations may instruct the process to mix the two different types of recommendations to obtain new recommendations. For example, if input indicates repositioning the slider 1724 to a location that is a halfway between the lower investment recommendations and the higher estimated yield recommendations, then the process is programmed to generate new recommendations that are a halfway between the lower investment recommendations and the higher estimated yield recommendations. If the recommendations pertain to for example, a seeding rate recommendations for a field, then repositioning slider 1724 to the middle position between the lower investment recommendations and the higher estimated yield recommendations is programmed to cause determining an average seeding rate computed as an average value of the seeding rate provided by the lower investment recommendations and the seeding rate provided by the higher estimated yield recommendations.

6.1.2. Weighted Interpolation

Slider 1724 may be repositioned to any location along a line segment between the lower investment recommendations and the higher estimated yield recommendations. The location to which slider 1724 is repositioned may be used to determine two weights that are used in computing new recommendations. A first weight may indicate the contribution of the lower investment recommendations in computing values for the new recommendations. A second weight may indicate the contribution of the higher estimated yield recommendations in computing the values for the new recommendations.

The first weight and the second weight usually add up to 100%. For example, if slider 1724 is repositioned to a location that is a halfway between the lower investment recommendations and the higher estimated yield recommendations, then both weights are the same: the first weight is 50% and the second weight is 50%. Thus, if the recommendations pertain to a seeding rate for a field, and slider 1724 is repositioned to a location that is a halfway between the lower investment recommendations and the higher estimated yield recommendations, then the new seeding rate will be computed by adding the 50% of the seeding rate suggested by the lower investment recommendations to the 50% of the seeding rate suggested by the higher estimated yield recommendations.

Repositioning a slider to the right end of a line segment between the lower investment recommendations and the higher estimated yield recommendations may cause assigning 0% to the first weight and 100% to the second weight. On the other hand, repositioning slider 1724 to the left end of the line segment may cause assigning 100% to the first weight and 0% to the second weight.

If a line segment between the lower investment recommendations and the higher estimated yield recommendations is divided equally into four segments by five notches equally spread along the line segment, then repositioning slider 1724 to the first notch (the left end of the line segment) would correspond to assigning 100% to the first weight and 0% to the second weight, repositioning slider 1724 to the second notch would correspond to assigning 75% to the first weight and 25% to the second weight, repositioning slider 1724 to the third notch would correspond to assigning 50% to the first weight and 50% to the second weight, repositioning slider 1724 to the fourth notch would correspond to assigning the 25% to the first weight and 75% to the second weight, and repositioning slider 1724 to the fifth notch (the right end of the line segment) would correspond to assigning 0% to the first weigh and 100% to the second weight.

In an embodiment, the weighted interpolation processes are programmed to determine new recommendations for a seeding rate using the following formula:

$$r_\alpha = \alpha \times r_y + (1.0 - \alpha) \times r_e \quad (1)$$

where $r_\alpha$ corresponds to the weighted recommended seeding rate, $\alpha$ corresponds to the weight selected from the range [0.0, 1.0] and based on the location of slider 1724 with respect to the lower investment recommendations and the higher estimated yield recommendations, $r_y$ is the yield-optimizing seeding rate suggested based on the lower investment recommendations, and $r_e$ is the economic seeding rate suggested based on the higher estimated yield recommendations. In an embodiment, $\alpha$ corresponds to the first weight described above, and $(1.0-\alpha)$ corresponds to the second weight described above.

Formula (1) provides one way of using the weights to compute the weighted recommended seeding rate $r_\alpha$. Other methods, such as inverse distance weighting, may also be used to determine the new seeding rate.

In an embodiment, the process for determining new recommendations based on two already generated different types of recommendations is programmed to determine a yield estimate from the seeding rate using the calculation:

$$y_\alpha = r_\alpha \times \exp(\beta_0 + \beta_1 \times r_\alpha) \quad (2)$$

where $y_\alpha$ corresponds to the recommended yield estimate and $r_\alpha$ corresponds to the weighted recommended seeding rate. In expression (2), $\beta_0$ and $\beta_1$ are parameters computed for the specific field, and based on the seed hybrid and target yield.

As an example, assume that a line segment, along which slider 1724 may be repositioned, has one end labelled as lower investment recommendations and another end labelled as higher estimated yield recommendations, and is divided into five notches or mixes. Input indicates to reposition slider 1724 to any of the mixes. In an embodiment, the process is programmed to compute the average recommendations across the field for each of the mixes using equations (1) and (2).

In an embodiment, the combinations of recommendations across a field are linear. Therefore, the computed mixed recommendations for all management zones are programmed to provide a proportional mix for the entire field.

The following equations demonstrate the how, in an embodiment, seeding-rate recommendations for different zones can be combined in a linear fashion to result in seeding-rate recommendations for the field taken as a whole that are useful to the grower. Let Y be the yield-optimizing seeding rate that is computed across an entire field, and $y_i$ be the corresponding yield-optimizing seeding rate for a management zone i identified within the field. Let E be the economic seeding rate that is computed across the entire field and $e_i$ be the economic seeding rate for the management zone i. Let a be the mix parameter and $\hat{A}_i$ be the normalized area of zone i. The overall mixed seeding rate s for the entire field can be expressed using the following formula:

$$\begin{aligned} s &= \alpha E + (1-\alpha) Y \\ &= \alpha \sum_i \hat{A}_i e_i + (1-\alpha) \sum_i \hat{A}_i y_i \\ &= \sum_i \hat{A}_i (\alpha e_i + (1-\alpha) y_i) \\ &= \sum_i \hat{A}_i m_i \end{aligned} \quad (3)$$

where $m_i$ is the mixed rate for zone i.

In an embodiment, a programmed process computes the overall mixed seeding rate s, as well as the seeding rates for each zone $m_i$, using formula (3), and returns the resulting recommendations for display using a computer display device.

Below is an example of a computer representation of seeding-rate recommendations for the yield-based model and the economics-based model separately:

```
"pop-recommendation": {
  "model-yield": {
    "rate": {
      "u": "seed/hectare",
      "q": 65400
    },
    "product": {
      "id": 142535,
      "name": "DKC53-68RIB",
      "brand": "DEKALB"
    },
```

(4)

```
"model-economic": {
"rate": {
"u": "seed/hectare",
"q": 55200
},
"product": {
"id": 142535,
"name": "DKC53-68RIB",
"brand": "DEKALB"
}
}
}
```

Below is an example of the computer representation for various mixtures of the two models:

(5)
```
"pop-recommendation": {
"model-yield-economic-mixed": {
"product": {
"id": "productid",
"name": "DKC44-92",
"brand": "DEKALB"
},
"0-100": {
"rate": {
"u": "seed/hectare",
"q": 73066
},
"estimated-profit": {
"u": "usd/hectare",
"q": 1279.9467176320468
},
"estimated-yield": {
"u": "kg/hectare",
"q": 10257.33571754698
}
},
"25-75": {
"rate": {
"u": "seed/hectare",
"q": 76757
},
"estimated-profit": {
"u": "usd/hectare",
"q": 1278.0878023059372
},
"estimated-yield": {
"u": "kg/hectare",
"q": 10332.050548706247
}
},
"50-50": {
"rate": {
"u": "seed/hectare",
"q": 80449
},
"estimated-profit": {
"u": "usd/hectare",
"q": 1272.698818967568
},
"estimated-yield": {
"u": "kg/hectare",
"q": 10383.25519311712
}
},
"75-25": {
"rate": {
"u": "seed/hectare",
"q": 84140
},
"estimated-profit": {
"u": "usd/hectare",
"q": 1264.0541543463733
},
"estimated-yield": {
"u": "kg/hectare",
"q": 10412.73169564249
}
},
"100-0": {
"rate": {
"u": "seed/hectare",
"q": 87831
},
"estimated-profit": {
"u": "usd/hectare",
"q": 1252.4078548389527
},
"estimated-yield": {
"u": "kg/hectare",
"q": 10422.197298926352
}
}
}
}
```

6.1.3. Example Implementation

In an embodiment, a process for generating new recommendations by interpolating two sets of already-generated recommendations is navigated using slider 1724 of FIG. 17.

In an embodiment, in response to placement of slider 1724 at the position that corresponds to a yield-based data model, the process is programmed to compute data points for the new recommendations based on the yield response curve determined using the yield-based model. The yield response curve represents the relationships according to which the cost of increases in population no longer outweighs the modeled increase in yield given as the target yield, also referred to as yield environment, set based on the input.

Assuming that a seed cost, a grain price, and the target yield remain unchanged, if slider 1724 is placed at the position that corresponds to recommendations generated based an economics-based data model, then the new recommendations provide for the lowest average population, the lowest seed cost (total and per acre), the lowest estimated yield given the user's choice of target yield (yield environment), and the highest estimated gross profit. When slider 1724 is repositioned to such a location along the line segment and requesting the new recommendations for such settings, the process is programmed to calculate the new recommendations based on economics goals.

In an embodiment, if slider 1724 is placed at the position that corresponds to recommendations generated using an economics-based data model, then data points for the new recommendations are computed based on the economics-based model, and the data points are taken from the yield response curve with the maximum yield, where the estimated yield corresponds to the target yield.

Assuming that a seed cost, a grain price, and the target yield remain unchanged, if slider 1724 is placed at the right most location along a line segment, then the new recommendations provide for the highest average population, the highest seed cost (total and per acre), the highest estimated yield, where the estimated yield should be equivalent to the grower's target yield, and the lowest estimated gross profit.

If slider 1724 is placed a halfway along a line segment, then data points for the new recommendations are computed by averaging the left and right most points. For example, if for the left most position of slider 1724, the seed rate recommendations indicated an average population of 30.6 k, and for the right most position of slider 1724, the seed rate recommendations indicated an average population of 36.8 k, then for the for the halfway position of slider 1724, the new recommendations will be 33.7 k. This is computed as an average of 30.6 k and 36.8 k. The points to the left and to the right of the midpoint are each respectively the average of the midpoint and the respective endpoint. Hence if the line segment has five notches, as described above, the new recommendations computed for each of the respective notch with be 30.6 k, 32.15 k, 33.7 k, 35.25 k, and 36.8 k.

Figure 19:
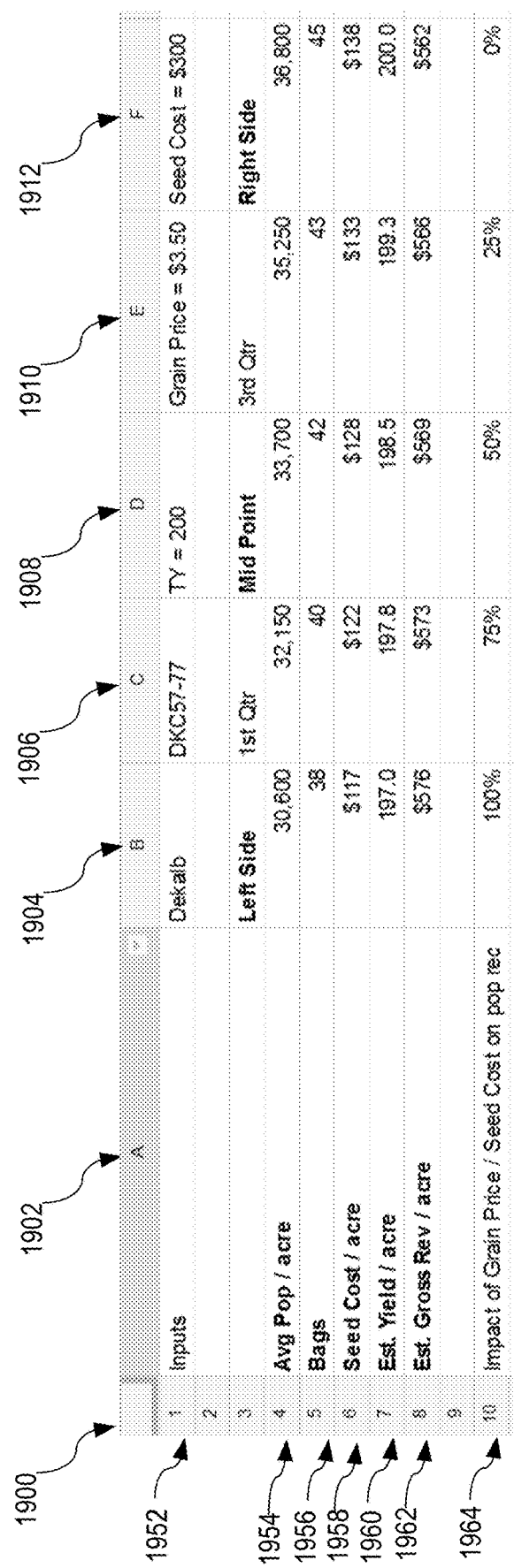
FIG. 19 is an example table that summarized new recommendations generated by interpolating between two types of recommendations.

FIG. 19 is an example table that summarized new recommendations generated by interpolating between two types of recommendations. A table 1900 includes columns 1902-1912 and rows 1952-1964. The data fields, indexed using the columns and the rows, are labelled with corresponding labels and are used to store corresponding data values. For example, a row 1952 is labelled as "Inputs," and includes a seed brand selection in a column 1904, a seed hybrid selection in a column 1906, a target yield selection in column 1908, a grain price selection in a column 1910, and a seed cost selection in a column 1912.

A column 1902 includes names of parameters for which values are part of the new recommendations. In column 1902, an element 1954 is labelled as an average population per acre, an element 1956 is labelled as a count of bags of seeds, an element 1958 is labelled as a seed cost per acre, an element 1960 is labelled as the estimated yield per acre, an element 1962 is labelled as an estimated gross revenue per acre, and an element 1964 is labelled as the impact of grain price per the seed cost on populations.

The information included in table 1900 was computed for five different notch positions of slider 1724 along a line segment, as in FIG. 17. For example, data included in column 1904 and rows 1954-1962 correspond to the left most position of slider 1724 along the line segment, data included in column 1906 and rows 1954-1962 correspond to the first quarter position of slider 1724 along the line segment, data included in column 1908 and rows 1954-1962 correspond to the midpoint position of slider 1724 along the line segment, and so forth. Hence, the average seed populations per acre computed for different locations of slider 1724 along the line segment, are 30.6 k, 32.15 k, 33.7 k, 35.25 k, and 36.8 k, respectively.

It should be understood that the data included in table 1900 are provided merely to illustrate the examples computed for a particular field and using particular settings.

6.1.4. Example Workflow

Figure 20:
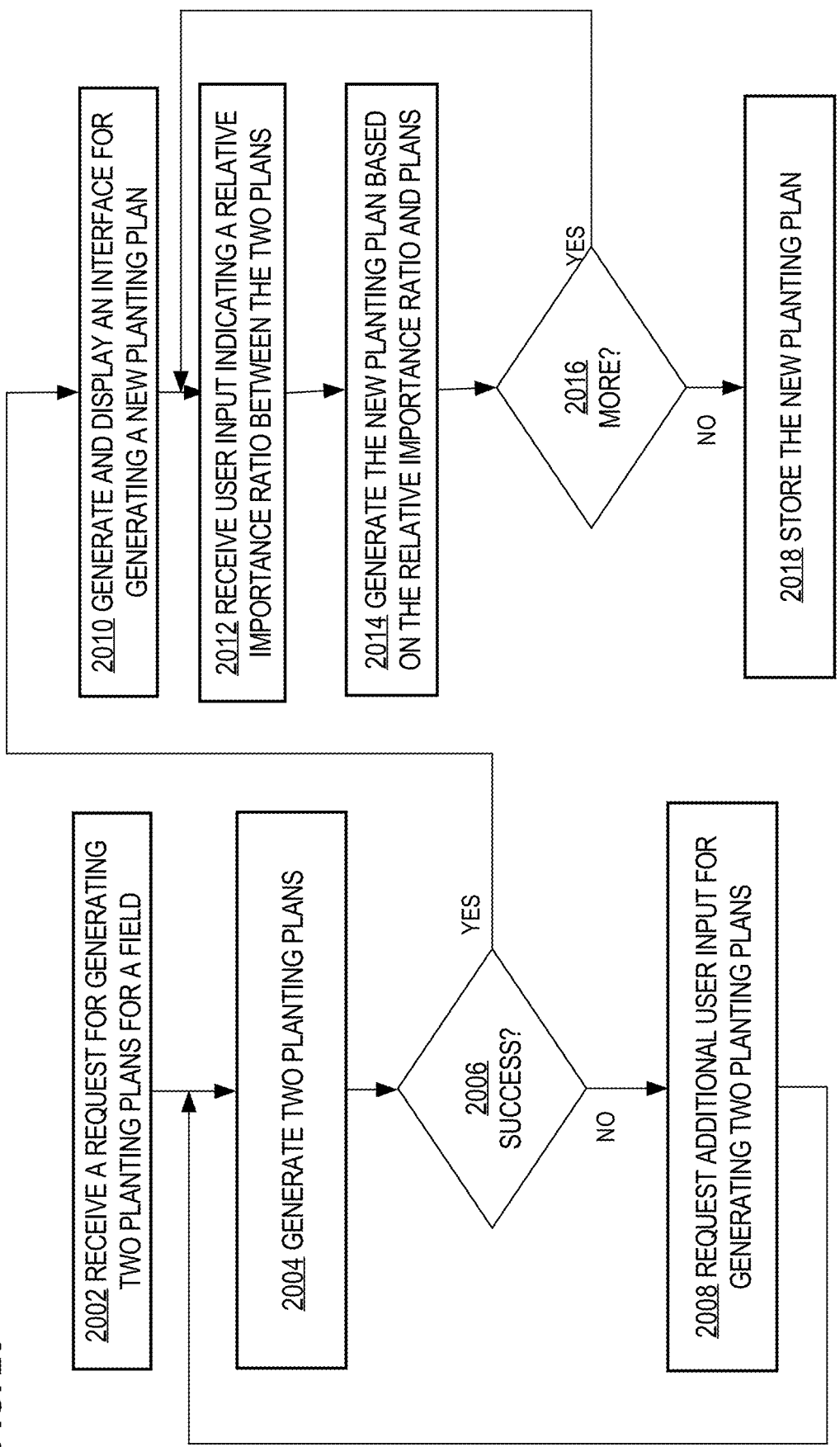
FIG. 20 depicts an example method for generating a new planting plan by interpolating between two different planting plans.

FIG. 20 depicts an example method for generating a new planting plan by interpolating between two different planting plans. In step 2002, a request is received for generating two planting plans for an agricultural field. A planting plan may include or comprise planting recommendations or prescriptions.

User input may be received via a GUI generated and displayed on a computer display device. The user input may include a request for creating planting plans, as described in FIG. 16, providing user selections of the seed brand, the seed hybrid, the target yield value, and/or user inputs for the seed cost, the grain price, and the like.

In step 2004, two different planting plans are generated based on the information provided by a user and/or the default data and settings. The planting plans may be generated as described in FIG. 11, FIG. 12, FIG. 13, FIG. 14, FIG. 15.

In step 2006, a test is performed whether the two planting plans are complete and meaningful. For example, each planting plans may be checked whether the recommended amounts for average seed populations for the management zones for a field are non-negative, or whether the estimated yield and the estimated gross revenue are non-negative. If the test is passed, then step 2010 is performed. Otherwise, additional input for the recommendation generator may be requested in step 2008, and additional two planting plans may be generated in step 2004.

In step 2010, an interface is generated and displayed for presenting the two planting plans, for modifying the two planting plans, and for generating a new planting plan. The interface may be implemented in a variety of ways, including a GUI or a webpage. Examples of the interface are described in FIGS. 17-18 and 21.

In an embodiment, the interface includes a slider that is configured to receive input specifying a relative importance ratio between two planting plans for determining a new planting plan for the agricultural field. A slider may be graphically represented as a two dimensional object such as a circle, a triangle, a rectangle or a square, or as a three dimensional object such as a sphere, a prism, a pyramid, a cone or a cylinder. The slider may be repositioned along a predetermined path that has two ends corresponding to two different planting plans, respectively. A particular position of the slider with respect to the path may correspond to a particular relative importance ratio between the two planting plans. The particular relative importance ratio may be used to determine how to "mix" the two planting plans to derive a new planting plan. The slider may be implemented as slider 1724, described in FIG. 17.

In step 2012 input is received via the slider, such as slider 1724. The input may include selecting slider 1724, as described in FIG. 17, or repositioning slider 1724. Additional inputs may be received via other interactive objects, such as knobs, buttons, and the like. The additional inputs may include requesting a new planting plan, modifying the seed brand, modifying the seed hybrid, modifying the target yield value, modifying the seed cost, modifying the grain price, and the like.

In step 2014, a new planting plan is generated based on the two planting plans and the relative importance ratio received via the interactive element, such as slider 1724. In an embodiment, the new planting plan comprises new planting recommendations for cultivating the agricultural field. The new planting recommendations are derived by interpolating planting recommendations of a first planting plan and planting recommendations of a second planting plan, of the two planting plans, according to the relative importance ratio.

In embodiment, the relative importance ratio is used to determine a first weight and a second weight. The first weight specifies a first contribution of a first planting plan of the two planting plans to the new planting plan. The second weight specifies a second contribution of a second planting plan of the two planting plans to the new planting plan. New values for the new planting recommendations are computed by averaging first values of planting recommendations of the first planting plan and second values of planting recommendations of the second planting plan according to the first weight and the second weight, respectively. Then the new values of the new planting recommendations are associated with the new planting plan.

In embodiment, the new recommendations are displayed in a GUI or in a webpage.

In step 2016, a test is performed to determine whether input specifies to further modify the recommendations. If input indicates to continue with the modifications, then step 2012 is repeated and new input for the modification is received from the user. However, if the input indicates not to continue with the modifications, then in step 2018, the most recently generated new planting plan is stored in a file, a database, or a server. The new planting plan may be transmitted by email or text message.

6.1.5. Second Example Implementation

Figure 21:
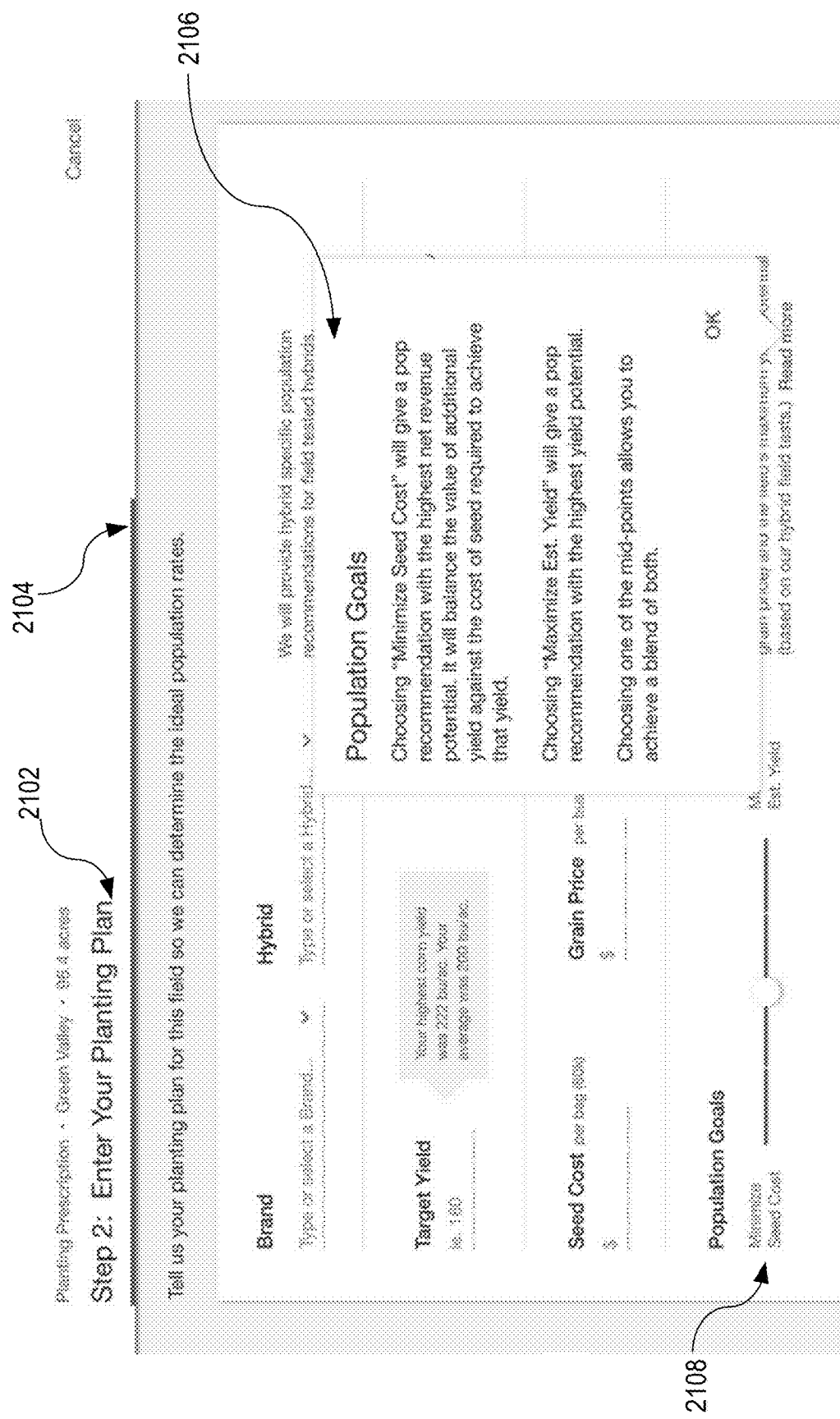
FIG. 21 is a screen snapshot of an example graphical user interface configured to enable fine tuning of agricultural recommendations.

FIG. 21 is example screen display showing a GUI that is configured to accept input for tuning of agricultural recommendations. The depicted example shows one of many programmed approaches for tuning the agricultural recommendations. GUI 2104 illustrates programmed controls to provide and modify settings for a planting plan 2102. For example, GUI 2104 may include an interactive slider 2108 that is programmed to accept input to adjust the seeding population goals. By repositioning slider 2108, input may define the objectives for the desired recommendations in terms of minimizing the seed cost, maximizing the estimated yield, and so forth. By focusing on minimizing the seed cost, new recommendations may provide suggestions for achieving the highest possible net revenue and may balance the value of additional yield against the cost of seed required to achieve that yield. On the other hand, by focusing on maximizing the estimated yield, the new recommendations may provide suggestions for achieving the highest yield potential. By operating slider 2108, input may specify how to balance the above objectives. Instructions for use of slider 2108 may be displayed in a prompt window 2106.

6.2. Interpolating Between Three or More Sets of Recommendations

In an embodiment, various models are combined or mixed to derive a new model. Some mixtures of models may be mathematical combinations (linear or otherwise) of model recommendations. Other mixtures may be created based on model recommendations that are examined and some criteria are used to filter the recommendations.

When mixing multiple models it might be overcomplicated to have sliders. The UI might have other ways of representing the mixtures. The mixtures of models themselves might become virtual models so that a grower may select for example, from a menu of model mixtures that include such things as high risk tolerance for weather, but low risk tolerance for economics, and so forth.

Also, when mixing multiple models it might be overcomplicated to have sliders. The UI might have other ways of representing the mixtures. The mixtures of models themselves might become virtual "models" so that the grower could select, for example, between a menu of model mixtures that include such things as high risk tolerance for weather, but low risk tolerance for economics.

The approach described in FIG. 17, FIG. 18, FIG. 19, FIG. 20, FIG. 21 may be programmed in other embodiments for generating variable-rate seeding recommendations based on three or more previously generated different planting plans. In an embodiment, the process may include generating a new planting plan by interpolating between the recommendation values generated for three or more planting plans, including those generated using a yield-based model and an economics-based model.

The term "interpolating," in this context, indicates that a new planting plan is determined by applying one or more mathematical formulas to three of more sets of recommendations.

In an embodiment, a new planting plan is generated based on information provided by three sets of recommendations and three weights that are used to determine the contributions of each of the sets to the new planting plan. The process may be implemented in part using a GUI, such as the GUI described in connection with FIG. 16, FIG. 17, FIG. 18, FIG. 19, FIG. 20, and may include a slider that may be repositioned within an area of a triangle having the corners corresponding to the respective three set of already-generated planting plans.

In an embodiment, the slider may be implemented as a graphical element such as a circle or a triangle, and may be programmed to for example, receive user inputs, update its own location within a GUI based on the received user input, and be displayed at the new location within the GUI.

A GUI implementing the recommendation interpolation process may be configured to receive input such as selecting a slider, repositioning the slider, and accepting a new location of the slider. Additional inputs may include requesting new recommendations to be computed based on the new location of the slider, and the like. In response to input that requests the new recommendations to be computed based on the new location of the slider, the process is programmed to generate the new recommendations by interpolating between the three sets of recommendations according to the weights determined based on the location of the slider.

In an embodiment, a new planting plan is generated based on information provided by four sets of recommendations and four weights that are used to determine the contributions of each of the sets to the new planting plan. The process may be implemented in a GUI, such as the GUI described in FIG. 16, FIG. 17, FIG. 18, FIG. 19, FIG. 20, and may include a slider that may be repositioned within an area of a square having the corners corresponding to the respective four set of already-generated planting plans.

The approach may be extended to generating a new planting plan based on information provided by five, and more sets of recommendations.

7. Extensions and Alternatives

In an embodiment, a process for delineating management zones for an agricultural field is enhanced by taking into consideration not only the historical yield maps, but also weather forecast information. In this approach, the weather information may be used to provide explanations for inconsistencies in yield observations recoded in the historical yield maps.

A process for delineating management zones for a field may be enhanced by providing information about soil properties and topographical properties of individual zones delineated in a field. Usually, permanent soil and topographical properties play an important role in determining sub-field yield variability, and sometimes may be more important than transient factors such as weather.

Accuracy of results generated by a process for delineating management zones may be improved by providing sufficient historical yield data or sub-field yield maps to the system. The accuracy of the generated results may also be improved when the historical yield data is provided in a particular data format or is particularly preprocessed.

What is claimed is:

1. A method comprising:
    causing display, in a graphical user interface displayed on a display device, of digital planting plan data and a graphical element;
    wherein the digital planting plan data comprises seeding rate data for an agricultural field;
    wherein the graphical element comprises a feature that is adjustable by an input interaction with the graphical user interface;
    in response to an adjustment of the feature of the graphical element, adjusting a relative importance ratio of two different data models that generate different types of planting plan recommendations, and causing display, in the graphical user interface, of adjusted seeding rate data;

wherein the adjusted seeding rate data is computed by applying a weight to the seeding rate data;

wherein the weight used to compute the adjusted seeding rate data is modified in correlation with the adjustment of the feature;

wherein the method is performed by one or more computing devices.

2. The method of claim 1, wherein the seeding rate data is computed as a weighted sum of seeding rates computed using different models or as a weighted average of seeding rates computed using different models.

3. The method of claim 2, wherein the adjusted seeding rate data is computed by adjusting weights used to compute the weighted sum or by adjusting weights used to compute the weighted average.

4. The method of claim 3, wherein the adjusted seeding rate data is computed using any one or more of the following: a weighted interpolation process, an inverse distance weighting process.

5. The method of claim 2, wherein the different models used to compute the seeding rate data comprise any one or more of the following: a profit-based model, a revenue-based model, a yield-based model.

6. The method of claim 1, wherein the seeding rate data is computed using any one or more of the following: seed data associated with the agricultural field, yield data associated with the agricultural field, cost data associated with particular seed data, market price data associated with particular product data.

7. The method of claim 1, wherein the graphical element comprises a slider element; wherein a position of the slider element is adjustable relative to at least one reference position displayed in the graphical user interface.

8. The method of claim 1, wherein the graphical element comprises a slider element; wherein a position of the slider element is adjustable along a path that extends between first and second reference positions displayed in the graphical user interface.

9. The method of claim 8, wherein the first and second reference positions are associated with different models used to compute the seeding rate data.

10. The method of claim 1, wherein the seeding rate data is computed for a particular zone of the agricultural field.

11. One or more non-transitory storage media storing instructions which, when executed by one or more computing devices, cause performance of operations comprising:

causing display, in a graphical user interface displayed on a display device, of digital planting plan data and a graphical element;

wherein the digital planting plan data comprises seeding rate data for an agricultural field;

wherein the graphical element comprises a feature that is adjustable by an input interaction with the graphical user interface;

in response to an adjustment of the feature of the graphical element, adjusting a relative importance ratio of two different data models that generate different types of recommendations, and causing display, in the graphical user interface, of adjusted seeding rate data;

wherein the adjusted seeding rate data is computed by applying a weight to the seeding rate data;

wherein the weight used to compute the adjusted seeding rate data is modified in correlation with the adjustment of the feature;

wherein the method is performed by one or more computing devices.

12. The one or more non-transitory storage media of claim 11, wherein the seeding rate data is computed as a weighted sum of seeding rates computed using different models or as a weighted average of seeding rates computed using different models.

13. The one or more non-transitory storage media of claim 12, wherein the adjusted seeding rate data is computed by adjusting weights used to compute the weighted sum or by adjusting weights used to compute the weighted average.

14. The one or more non-transitory storage media of claim 13, wherein the adjusted seeding rate data is computed using any one or more of the following: a weighted interpolation process, an inverse distance weighting process.

15. The one or more non-transitory storage media of claim 12, wherein the different models used to compute the seeding rate data comprise any one or more of the following: a profit-based model, a revenue-based model, a yield-based model.

16. The one or more non-transitory storage media of claim 11, wherein the seeding rate data is computed using any one or more of the following: seed data associated with the agricultural field, yield data associated with the agricultural field, cost data associated with particular seed data, market price data associated with particular product data.

17. The one or more non-transitory storage media of claim 11, wherein the graphical element comprises a slider element; wherein a position of the slider element is adjustable relative to at least one reference position displayed in the graphical user interface.

18. The one or more non-transitory storage media of claim 11, wherein the graphical element comprises a slider element; wherein a position of the slider element is adjustable along a path that extends between first and second reference positions displayed in the graphical user interface.

19. The one or more non-transitory storage media of claim 18, wherein the first and second reference positions are associated with different models used to compute the seeding rate data.

20. The one or more non-transitory storage media of claim 11, wherein the seeding rate data is computed for a particular zone of the agricultural field.

* * * * *